(12) United States Patent
Okamura et al.

(10) Patent No.: US 8,458,577 B2
(45) Date of Patent: Jun. 4, 2013

(54) ENCODER, DECODER, ENCODING METHOD, AND DECODING METHOD

(75) Inventors: Shutai Okamura, Kadoma (JP); Yutaka Murakami, Kadoma (JP); Masayuki Orihashi, Kadoma (JP)

(73) Assignee: Panasonic Corporation, Osaka (JP)

( * ) Notice: Subject to any disclaimer, the term of this patent is extended or adjusted under 35 U.S.C. 154(b) by 436 days.

(21) Appl. No.: 12/745,216

(22) PCT Filed: Dec. 18, 2008

(86) PCT No.: PCT/JP2008/003849
§ 371 (c)(1),
(2), (4) Date: May 27, 2010

(87) PCT Pub. No.: WO2009/078180
PCT Pub. Date: Jun. 25, 2009

(65) Prior Publication Data
US 2010/0269009 A1    Oct. 21, 2010

(30) Foreign Application Priority Data

Dec. 19, 2007  (JP) .................... 2007-327642
Jan. 7, 2008   (JP) .................... 2008-000843

(51) Int. Cl.
*G06F 11/00*    (2006.01)
(52) U.S. Cl.
USPC ...................................................... 714/786
(58) Field of Classification Search
USPC ...................................................... 714/786
See application file for complete search history.

(56) References Cited

U.S. PATENT DOCUMENTS

| | | | |
|---|---|---|---|
| 6,961,889 B2 * | 11/2005 | Shin | 714/755 |
| 2003/0026346 A1 * | 2/2003 | Matsumoto et al. | 375/262 |
| 2005/0233710 A1 * | 10/2005 | Lakkis et al. | 455/102 |

(Continued)

FOREIGN PATENT DOCUMENTS

| | | |
|---|---|---|
| CN | 1777082 A | 5/2006 |
| EP | 1 455 458 A2 | 9/2004 |

OTHER PUBLICATIONS

Bates et al., "Decoders for Low-Density Parity-Check Convolutional Codes with Large Memory," 2006 IEEE International Symposium on Circuits and Systems, Island of Kos, Greece, May 21-24, 2006, pp. 5103-5106.

(Continued)

*Primary Examiner* — Bryce Bonzo
(74) *Attorney, Agent, or Firm* — Seed IP Law Group PLLC

(57) ABSTRACT

There is provided an encoder that provides a termination sequence with a simple structure for LDPC-CC encoding and reduces an amount of the termination sequence transmitted to a transmission line. The LDPC-CC encoder (200) connects a first encoder (230) to a second encoder (240) to perform encoding and thereby carry out LDPC-CC encoding, the first encoder (230) performing encoding based on an partial parity check matrix for information bits (110) obtained by extracting a sequence corresponding to the information bits in a parity check matrix (100) and the second encoder (240) performing encoding based on a partial parity check matrix for parity bits (120) obtained by extracting a sequence corresponding to the parity bits in the parity check matrix (100). A termination sequence generator (210) generates a termination sequence including the same number of bits as the memory length of the first encoder (230) and provides the generated termination sequence as an input sequence.

15 Claims, 60 Drawing Sheets

$$\mathbf{H}^T_{[0,n]} = \begin{bmatrix} h_1^{(0)}(0) & h_1^{(1)}(1) & \cdots & h_1^{(M)}(M) & 0 & \cdots & 0 \\ h_2^{(0)}(0) & h_2^{(1)}(1) & \cdots & h_2^{(M)}(M) & 0 & & \\ 0 & h_1^{(0)}(1) & \cdots & & h_1^{(M)}(M+1) & & \\ \vdots & h_2^{(0)}(1) & \cdots & & h_2^{(M)}(M+1) & & \\ & 0 & \ddots & & \vdots & & \vdots \\ & & \ddots & & & & 0 \\ & & & & & & h_1^{(M)}(n) \\ & & & & & & h_2^{(M)}(n) \\ & & & & & & \vdots \\ & & & & 0 & & h_2^{(0)}(n) \end{bmatrix}$$

U.S. PATENT DOCUMENTS

| | | | |
|---|---|---|---|
| 2010/0031125 A1* | 2/2010 | Shen et al. | 714/781 |
| 2011/0161788 A1* | 6/2011 | Sugitani et al. | 714/801 |
| 2011/0176405 A1* | 7/2011 | Nimbalker et al. | 370/206 |
| 2012/0110408 A1* | 5/2012 | Xin | 714/752 |

OTHER PUBLICATIONS

Bates et al., "Parallel Encoders for Low-Density Parity-Check Convolutional Codes," 2006 IEEE International Symposium on Circuits and Systems, Island of Kos, Greece, May 21-24, 2006, pp. 4827-4830.

Extended European Search Report, for corresponding European Application No. 08863180.9, dated Nov. 4, 2011, 11 pages.

Sridharan, "Design and Analysis of LDPC Convolutional Codes," Dissertation, submitted to the Graduate School of the University of Notre Dame, Feb. 2005, 170 pages.

Bates, S., et al., "Decoder for Low-Density Parity-Check Convolutional Codes," U.S. Appl. No. 60/682,178, filed May 18, 2005.

Bates, S., et al., "Termination Sequence Generation Circuits for Low-Density Parity-Check Convolutional Codes," IEEE Transactions on Circuits and Systems 53(9): 1909-1917, Sep. 2006.

Chen, J., et al., "Reduced-Complexity Decoding of LDPC Codes," IEEE Transactions on Communications 53(8): 1288-1299, Aug. 2005.

Chen, Z., et al., "Efficient Encoding and Termination of Low-Density Parity-Check Convolutional Codes," IEEE Global Telecommunications Conference, San Francisco, Nov. 27-Dec. 1, 2006, pp. 1-5.

Chen, Z., et al., "Low-Density Parity-Check Convolutional Codes Applied to Packet Based Communication Systems," IEEE Global Telecommunications Conference, St. Louis, Nov. 28-Dec. 2, 2005, pp. 1250-1254.

Felström, A.J., and K.S. Zigangirov, "Time-Varying Periodic Convolutional Codes with Low-Density Parity-Check Matrix," IEEE Transactions on Information Theory 45(6): 2181-2191, Sep. 1999.

Fossorier, M.P.C, et al., "Reduced Complexity Iterative Decoding of Low-Density Parity Check Codes Based on Belief Propagation," IEEE Transactions on Communications 47(5): 673-680, May 1999.

Gallager, R.G., "Low-Density Parity-Check Codes," IRE Transactions on Information Theory, M.I.T. Press, Cambridge, Massachusetts, Jan. 1963, pp. 1-90.

International Search Report, mailed Feb. 10, 2009, issued in corresponding International Application No. PCT/JP2008/003849, filed Dec. 18, 2008.

Lin, S. and D.J. Costello, "Error Control Coding," Second Edition, Prentice Hall, Upper Saddle River, N.J., Jun. 2004, pp. 538-545.

Richter, G., et al., "Irregular Low-Density Parity-Check Convolutional Codes Based on Protographs," Proceedings of IEEE International Symposium on Information Theory, Seattle, Jul. 9-14, 2006, pp. 1633-1637.

Shohon, T., et al., "Sum-Product Decoding of Convolutional Codes," Fourth International Workshop on Signal Design and Applications in Communications (IWSDA 2009), Oct. 19-23, 2009, Fukuoka, Japan, pp. 64-67.

Tanner, R.M. et al., "LDPC Block and Convolutional Codes Based on Circulant Matrices," IEEE Transactions on Information Theory 50(12): 2966-2984, Dec. 2004.

Chen et al., "A New Encoder Implementation for Low-Density Parity-Check Convolutional Codes," IEEE Northeast Workshop on Circuits and Systems, IEEE, Piscataway, NJ, USA, Aug. 5, 2007, pp. 883-886.

Communication pursuant to Article 94(3) EPC, dated Sep. 3, 2012, for European Application No. 08 863 180.9, 10 pages.

* cited by examiner $$\mathbf{H}_{[0,n]}^{T} = \begin{bmatrix} h_1^{(0)}(0) & h_1^{(1)}(1) & \cdots & h_1^{(M)}(M) & 0 & \cdots & 0 & \cdots & 0 \\ h_2^{(0)}(0) & h_2^{(1)}(1) & \cdots & h_2^{(M)}(M) & 0 & \cdots & 0 & \cdots & 0 \\ 0 & h_1^{(0)}(1) & \cdots & h_1^{(M)}(M+1) & \cdots & & & & \vdots \\ \cdots & h_2^{(0)}(1) & \cdots & h_2^{(M)}(M+1) & \cdots & & & & 0 \\ & 0 & \cdots & \cdots & \ddots & & & & h_1^{(M)}(n) \\ & & & & \ddots & & & & h_2^{(M)}(n) \\ & & & & & & & & \vdots \\ & & & & & & & & h_2^{(0)}(n) \end{bmatrix}$$

$$
\begin{array}{c|cccccccccccc}
 & u1 & u2 & u3 & u4 & u5 & u6 & u7 & u8 & u9 & \cdots \\
\hline
c1 & 1 \\
c2 & 1 & 1 \\
c3 & 0 & 1 & 1 \\
c4 & 1 & 1 & 0 & 1 \\
c5 & 0 & 0 & 1 & 1 & 1 \\
c6 & 0 & 0 & 0 & 0 & 1 & 1 \\
c7 &   & 0 & 1 & 0 & 0 & 1 & 1 \\
c8 &   & 0 & 1 & 1 & 1 & 0 & 1 \\
c9 &   &   & 0 & 0 & 0 & 1 & 1 & 1 \\
c10 &  &   &   & 0 & 0 & 0 & 0 & 1 & 1 \\
c11 &  &   &   &   & 0 & 1 & 0 & 0 & 1 & 1 \\
c12 &  &   &   &   & 0 & 1 & 1 & 1 & 0 & 1 \\
c13 &  &   &   &   &   & 0 & 0 & 0 & 1 & 1 & 1 \\
\vdots
\end{array}
$$

(Matrix continues with blocks: 0 0 0 0 1 1; 0 1 0 0 1 1; 0 1 1 1 0 1; 0 0 0 1 1; 0 0 0 0; 0 1 0; 0 1; 0. Upper-right and lower-left regions are 0.)

|      | p1 | p2 | p3 | p4 | p5 | p6 | p7 | p8 | p9 | · | · | · |   |   |   |   |   |   |
|------|----|----|----|----|----|----|----|----|----|---|---|---|---|---|---|---|---|---|
| c1   | 1  |    |    |    |    |    |    |    |    |   |   |   |   |   |   |   |   |   |
| c2   | 0  | 1  |    |    |    |    |    |    |    |   |   |   |   |   |   |   |   |   |
| c3   | 0  | 0  | 1  |    |    |    |    |    |    |   |   | 0 |   |   |   |   |   |   |
| c4   | 0  | 0  | 0  | 1  |    |    |    |    |    |   |   |   |   |   |   |   |   |   |
| c5   | 0  | 0  | 0  | 0  | 1  |    |    |    |    |   |   |   |   |   |   |   |   |   |
| c6   | 1  | 0  | 0  | 0  | 0  | 1  |    |    |    |   |   |   |   |   |   |   |   |   |
| c7   |    | 1  | 0  | 0  | 0  | 0  | 1  |    |    |   |   |   |   |   |   |   |   |   |
| c8   |    |    | 1  | 0  | 0  | 0  | 0  | 1  |    |   |   |   |   |   |   |   |   |   |
| c9   |    |    |    | 1  | 0  | 0  | 0  | 0  | 1  |   |   |   |   |   |   |   |   |   |
| c10  |    |    |    |    | 1  | 0  | 0  | 0  | 0  | 1 |   |   |   |   |   |   |   |   |
| c11  |    |    |    |    |    | 1  | 0  | 0  | 0  | 0 | 1 |   |   |   |   |   |   |   |
| c12  |    |    |    |    |    |    | 1  | 0  | 0  | 0 | 0 | 1 |   |   |   |   |   |   |
| c13  |    |    |    |    |    |    |    | 1  | 0  | 0 | 0 | 0 | 1 |   |   |   |   |   |
| ·    |    |    |    |    |    |    |    |    | 1 | 0 | 0 | 0 | 0 | 1 |   |   |   |   |
| ·    |    |    |    |    |    |    |    |    |   | 1 | 0 | 0 | 0 | 0 | 1 |   |   |   |
| ·    |  0 |    |    |    |    |    |    |    |   |   | 1 | 0 | 0 | 0 | 0 | 1 |   |   |
|      |    |    |    |    |    |    |    |    |   |   |   | 1 | 0 | 0 | 0 | 0 |   |   |
|      |    |    |    |    |    |    |    |    |   |   |   |   | 1 | 0 | 0 | 0 |   |   |
|      |    |    |    |    |    |    |    |    |   |   |   |   |   | 1 | 0 | 0 |   |   |
|      |    |    |    |    |    |    |    |    |   |   |   |   |   |   | 1 | 0 |   |   |
|      |    |    |    |    |    |    |    |    |   |   |   |   |   |   |   | 1 |   |   |

FIG.7

|                  | (a) | (b) | (c) | (d) | (e) |
|------------------|-----|-----|-----|-----|-----|
| WEIGHT PATTERN 1 | 1   | 1   | 1   | 0   | 0   |
| WEIGHT PATTERN 2 | 1   | 1   | 0   | 0   | 0   |
| WEIGHT PATTERN 3 | 1   | 1   | 0   | 0   | 1   |
| WEIGHT PATTERN 4 | 1   | 0   | 1   | 1   | 1   |

120A $$\begin{array}{c|ccccccccccccccc}
 & p1 & p2 & p3 & p4 & p5 & p6 & p7 & p8 & p9 & \cdots \\
\hline
c1 & 1 \\
c2 & 0 & 1 \\
c3 & 0 & 0 & 1 \\
c4 & 1 & 0 & 0 & 1 \\
c5 & 0 & 1 & 0 & 0 & 1 & & & & & & & & 0 \\
c6 & 1 & 0 & 1 & 0 & 0 & 1 \\
c7 & & 1 & 0 & 1 & 0 & 0 & 1 \\
c8 & & & 1 & 0 & 1 & 0 & 0 & 1 \\
c9 & & & & 1 & 0 & 1 & 0 & 0 & 1 \\
c10 & & & & & 1 & 0 & 1 & 0 & 0 & 1 \\
c11 & & & & & & 1 & 0 & 1 & 0 & 0 & 1 \\
c12 & & & & & & & 1 & 0 & 1 & 0 & 0 & 1 \\
c13 & & & & & & & & 1 & 0 & 1 & 0 & 0 & 1 \\
\vdots & & & & & & & & & 1 & 0 & 1 & 0 & 0 & 1 \\
 & & & & & & & & & & 1 & 0 & 1 & 0 & 0 & 1 \\
 & & & & & & & & & & & 1 & 0 & 1 & 0 & 0 & 1 \\
 & & & 0 & & & & & & & & & 1 & 0 & 1 & 0 & 0 \\
 & & & & & & & & & & & & & 1 & 0 & 1 & 0 \\
 & & & & & & & & & & & & & & 1 & 0 & 1 \\
 & & & & & & & & & & & & & & & 1 & 0 \\
 & & & & & & & & & & & & & & & & 1 \\
\end{array}$$

$$H = \begin{bmatrix} & \text{us1} & \text{up1} & \text{p1} & \text{us2} & \text{up2} & \text{p2} & \text{us3} & \text{up3} & \text{p3} & \text{us4} & \text{up4} & \text{p4} & \text{us5} & \text{up5} & \text{p5} & \cdots \\ c_1 & 1 & 1 & 1 & & & & & & & & & & & & & \\ c_2 & 0 & 1 & 1 & 1 & 0 & 1 & & & & & & & & & & \\ c_3 & 1 & 1 & 1 & 1 & 1 & 1 & 1 & 0 & 1 & & & & & & & \\ c_4 & & & & 0 & 1 & 1 & 1 & 1 & 1 & 1 & 0 & 1 & & & & \\ c_5 & & & & & & & 1 & 1 & 1 & 1 & 1 & 1 & 1 & 0 & 1 & \\ c_6 & & & & & & & & & & 0 & 1 & 1 & 1 & 1 & 1 & \cdots \\ c_7 & & & & & & & & & & & & & 1 & 1 & 1 & \cdots \\ c_8 & & & & & & & & & & & & & 0 & 1 & 1 & \cdots \\ c_9 & & & & & & & & & & & & & & & 1 & \cdots \\ \vdots & & & & & & & & & & & & & & & & \end{bmatrix}$$

| | us1 | up1 | us2 | up2 | us3 | up3 | us4 | up4 | us5 | up5 | ... |
|---|---|---|---|---|---|---|---|---|---|---|---|
| c1 | 1 | 1 | 1 | 1 | 1 | 1 | 1 | 1 | 1 | 1 | |
| c2 | 0 | 1 | 0 | 1 | 0 | 1 | 0 | 1 | 0 | 1 | |
| c3 | 1 | 1 | 1 | 1 | 1 | 1 | 1 | 1 | 1 | 1 | |
| c4 | | | | | | | | | | | |
| c5 | | | | | | | | | | | |
| c6 | | | | | | | | | | | |
| c7 | | | | | | | | | | | |
| c8 | | | | | | | | | | | |
| c9 | | | | | | | | | | | |
| ... | | | | | | | | | | | |

|  | p1 | p2 | p3 | p4 | p5 | p6 | p7 | p8 | p9 | · · · |
|---|---|---|---|---|---|---|---|---|---|---|
| c1 | 1 | | | | | | | | | |
| c2 | 0 | 1 | | | | | | | | |
| c3 | 1 | 0 | 1 | | | 0 | | | | |
| c4 | | 1 | 0 | 1 | | | | | | |
| c5 | | | 1 | 0 | 1 | | | | | |
| c6 | | | | 1 | 0 | 1 | | | | |
| c7 | | | | | 1 | 0 | 1 | | | |
| c8 | | | | | | 1 | 0 | 1 | | |
| c9 | | | | | | | 1 | 0 | 1 | |
| · | | | 0 | | | | | | | |
| · | | | | | | | | | | |

$$\begin{bmatrix}
\begin{array}{ccccccc}
u1 & u2 & u3 & u4 & u5 & u6 & u7 \\
1 & 1 & 0 & 1 & 1 & 0 & 1 \\
1 & 0 & 0 & 1 & 1 & 1 & 1 \\
 & & 1 & 1 & 0 & 1 & 1 & 0 & 1 \\
 & & 1 & 0 & 0 & 1 & 1 & 1 & 1 \\
\end{array}
& \mathbf{0} \\
& \ddots \\
\mathbf{0} & \\
\end{bmatrix}$$

| | u1 | p1 | u2 | p2 | u3 | p3 | u4 | p4 | u5 | p5 | u6 | p6 | u7 | p7 | u8 | p8 | u9 | p9 | u10 | p10 | u11 | p11 |
|---|---|---|---|---|---|---|---|---|---|---|---|---|---|---|---|---|---|---|---|---|---|---|
| c1 | 1 | 1 | | | | | | | | | | | 1 | 1 | | | | | | | | |
| c2 | 1 | | 1 | 1 | | | | | | | | | 1 | | 1 | 1 | | | | | | |
| c3 | 0 | | 1 | | 1 | 1 | | | | | | | 0 | | 1 | | 1 | 1 | | | | |
| c4 | 1 | | 0 | | 1 | | 1 | 1 | | | | | 1 | | 0 | | 1 | | 1 | 1 | | |
| c5 | 0 | | 0 | | 0 | | 1 | | 1 | 1 | | | 0 | | 0 | | 0 | | 1 | | 1 | 1 |
| c6 | 0 | | 0 | | 0 | | 0 | | 1 | | 1 | 1 | 0 | | 0 | | 0 | | 0 | | 1 | 1 |
| c7 | | | 0 | 0 | | | | | | | | | 1 | 1 | 0 | 0 | 0 | 0 | 0 | 0 | 0 | 0 |
| c8 | | | | | 1 | 0 | | | | | | | 1 | 0 | 1 | 0 | 1 | 0 | 0 | 0 | 0 | 0 |
| c9 | | | | | | | 0 | 0 | | | | | 1 | 0 | 0 | 0 | 0 | 1 | 1 | 0 | 0 | 0 |
| c10 | | | | | | | | | 0 | 0 | | | 1 | 0 | 0 | 0 | 0 | 0 | 0 | 1 | 1 | 0 |
| c11 | | | | | | | | | | | 0 | 0 | 1 | 0 | 1 | 0 | 1 | 0 | 0 | 0 | 1 | 1 |
| c12 | | | | | | | | | | | | | 0 | 1 | 0 | 1 | 0 | 1 | 0 | 1 | 0 | 1 |
| c13 | | | | | | | | | | | | | 1 | 1 | 0 | 0 | 1 | 1 | 0 | 0 | 1 | 1 |

FIG.40

$$H = \begin{bmatrix} \cdots & d5 & g5 & d4 & g4 & d3 & g3 & d2 & g2 & d1 & g1 & t1 & s1 & t2 & s2 & t3 & s3 & t4 & s4 \\ \cdots & & & & & & & & & & & & & & & & & & \\ \cdots & & & & & & & & & & & & & & & & & & \\ \cdots & 0 & & & & & & & & & & & & & & & & & \\ \text{ct1} & & 0 & 1 & 1 & 0 & 0 & 0 & 0 & 0 & 0 & 1 & 0 & 0 & 1 & 1 & 0 & 0 & 1 \\ \text{ct2} & & & 1 & 0 & 1 & 1 & 0 & 1 & 0 & 0 & 0 & 1 & 0 & 1 & 1 & 0 & 1 & 0 \\ \text{ct3} & & & & & 0 & 0 & 0 & 0 & 1 & 0 & 0 & 0 & 1 & 0 & 0 & 1 & 1 & 1 \\ \text{ct4} & & & & & & & 0 & 1 & 0 & 0 & 0 & 0 & 0 & 0 & 0 & 0 & 0 & 1 \end{bmatrix}$$

GENERATING POLYNOMIAL $$G = \begin{bmatrix} 1 & (D^2+1)/(D^2+D+1) \end{bmatrix}$$

PARITY CHECK POLYNOMIAL $$(D^2+1)X(D)+(D^2+D+1)P(D)=0$$

PARITY CHECK MATRIX $$H = \begin{matrix}
1100000000000000000000000000000000000\ldots \\
0111000000000000000000000000000000000\ldots \\
1101100000000000000000000000000000000\ldots \\
0011011100000000000000000000000000000\ldots \\
0000110111000000000000000000000000000\ldots \\
0000001101110000000000000000000000000\ldots \\
0000000011011100000000000000000000000\ldots \\
0000000000110111000000000000000000000\ldots \\
0000000000001101110000000000000000000\ldots \\
\vdots
\end{matrix}$$

4301

TRANSMISSION SEQUENCE $w_i=(x_i,p_i)$

TRANSMISSION VECTOR $w=(x_1,p_1,x_2,p_2,x_3,p_3,x_4,p_4,x_5,p_5,\ldots,x_i,p_i,\ldots)$ $Hw=0$

$$H = \begin{pmatrix} H_1 & 1100000000000000000000000000000000000000000000000000000000000000 \\ H_2 & 1100000000000000000000000000000000000000000000000000000000000000 \\ H_3 & 1100000000000000000000000000000000000000000000000000000000000000 \\ H_4 & 1100000000000000000000000000000000000000000000000000000000000000 \\ \vdots & \vdots \\ H_m & 1100000000000000000000000000000000000000000000000000000000000000 \end{pmatrix}$$

FIG.55

| ENCODING SEQUENCE | $X_i$ | $P_i$ | $X_{i+1}$ | $P_{i+1}$ | $X_{i+2}$ | $P_{i+2}$ | $X_{i+3}$ | $P_{i+3}$ | $X_{i+4}$ | $P_{i+4}$ |
|---|---|---|---|---|---|---|---|---|---|---|
| #1 | ○ | ○ | × | × | × | × | ○ | ○ | × | × |
| #2 | × | × | ○ | ○ | × | × | × | × | ○ | ○ |
| #3 | × | × | × | × | ○ | ○ | × | × | × | × |
| #4 | × | ○ | ○ | ○ | × | × | ○ | ○ | × | × |
| #5 | × | × | × | ○ | ○ | × | × | × | ○ | × |
| #6 | × | × | × | × | × | ○ | ○ | × | × | × |

PUNCTURE PATTERN

○ : PUNCTURE BIT   × : TRANSMISSION BIT

FIG.56A

| ENCODING SEQUENCE | PUNCTURE PATTERN | $X_{i-1}$ | $P_{i-1}$ | $X_i$ | $P_i$ | $X_{i+1}$ | $P_{i+1}$ | $X_{i+2}$ | $P_{i+2}$ |
|---|---|---|---|---|---|---|---|---|---|
| | #1 | × | × | ○ | ○ | × | × | × | × |
| | | | | | | | | | |
| ENCODING SEQUENCE STATE | #1 | $DX(D)$ | $DP(D)$ | $X(D)$ | $P(D)$ | | | | |
| | #2 | $D^2X(D)$ | $D^2P(D)$ | $DX(D)$ | $DP(D)$ | $X(D)$ | $P(D)$ | | |
| | #3 | $D^3X(D)$ | $D^3P(D)$ | $D^2X(D)$ | $D^2P(D)$ | $DX(D)$ | $DP(D)$ | $X(D)$ | $P(D)$ |

1 BLOCK

○ : PUNCTURE BIT　　× : TRANSMISSION BIT

FIG.56B

| CODE | NUMBER OF PARITY CHECK POLYNOMIALS THAT MUST BE CHECKED WHEN CODING RATE R=2/3 (L=4) | NUMBER OF PARITY CHECK POLYNOMIALS THAT MUST BE CHECKED WHEN CODING RATE R=3/4 (L=3) | NUMBER OF PARITY CHECK POLYNOMIALS THAT MUST BE CHECKED WHEN CODING RATE R=5/6 (L=5/2, j=k/2) |
|---|---|---|---|
| TIME-INVARIANT LDPC-CC | $_{4k}C_k$ | $k$: ODD NUMBER $\frac{1}{3k} \times {}_{3k}C_k$<br>$k$: EVEN NUMBER ${}_{3k}C_k$ | ${}_{5j}C_{2j}$ |
| TIME-VARIANT-PERIOD-$m$ LDPC-CC | $\frac{1}{2k} \times {}_{4k}C_k \times LCM\{2k, m\}$ | $k$: ODD NUMBER $\frac{1}{6k} \times {}_{3k}C_k \times LCM\{6k, m\}$<br>$k$: EVEN NUMBER $\frac{2}{3k} \times {}_{3k}C_k \times LCM\{\frac{3k}{2}, m\}$ | $k$: ODD NUMBER $\frac{1}{10j} \times {}_{5j}C_{2j} \times LCM\{10j, m\}$<br>$k$: EVEN NUMBER $\frac{2}{5j} \times {}_{5j}C_{2j} \times LCM\{\frac{5j}{2}, m\}$ |

FIG.56C

ENCODER, DECODER, ENCODING METHOD, AND DECODING METHOD

TECHNICAL FIELD

The present invention relates to an encoder, decoder, encoding method, and decoding method using an LDPC-CC (Low-Density Parity-Check Convolutional Code).

BACKGROUND ART

In recent years, attention has been attracted to a Low-Density Parity-Check (LDPC) code as an error correction code that provides high error correction capability with a feasible circuit scale. Due to its high error correction capability and ease of implementation, an LDPC code has been adopted in an error correction code for IEEE802.11n high-speed wireless LAN (Local Area Network) systems, digital broadcasting systems, and so forth.

An LDPC code is an error correction code defined by a low-density parity check matrix (that is, a parity check matrix in which there are far fewer 1 elements than 0 elements). An LDPC code is a block code having a block length equal to number of columns N of a parity check matrix.

However, a characteristic of many current communication systems is that communication is based on variable-length packets and frames, as in the case of the Ethernet (registered trademark). A problem with applying an LDPC code, which is a block code, to a system of this kind is, for example, how to make a fixed-length LDPC code block correspond to a variable-length Ethernet (registered trademark) frame. With IEEE802.11n, a wireless LAN standard for which an LDPC code has been adopted, adjustment of the length of a transmission information sequence and an LDPC code block length is performed by applying padding and/or puncturing to a transmission information sequence. However, a problem with this is the necessity of changing the coding rate by means of padding or puncturing, and of performing redundant sequence transmission.

In contrast to this kind of block-wise LDPC code (hereinafter referred to as "LDPC-BC: Low-Density Parity-Check Block Code"), an LDPC-CC allowing encoding and decoding of information sequences with arbitrary length has been investigated (see Non-Patent Document 1).

An LDPC-CC is a convolutional code defined by a low-density parity-check matrix. FIG. 1 shows, as an example, parity check matrix $H_{[0,n]}^T$ of an LDPC-CC for which coding rate $R=\frac{1}{2}$ (=b/c).

With an LDPC-CC, elements $h_1^{(m)}(t)$ and $h_2^{(m)}(t)$ of parity check matrix $H_{[0,n]}^T$ are 0 or 1. Also, all elements other than $h_1^{(m)}(t)$ and $h_2^{(m)}(t)$ included in parity check matrix $H_{[0,n]}^T$ are 0. In FIG. 1, M represents the memory length for an LDPC-CC, and n represents the length of a transmission information sequence. As shown in FIG. 1, a characteristic of a parity check matrix of an LDPC-CC is that it is a parallelogram-shaped matrix in which 1 is placed only in diagonal terms of the matrix and neighboring elements, and the bottom-left and top-right elements of the matrix are zero.

Here, if an example in which coding rate $R=\frac{1}{2}$ (=b/c) is shown, when $h_1^{(0)}(t)=1$ and $h_2^{(0)}(t)=1$, LDPC-CC encoding is performed by means of equation 1 and equation 2 in accordance with parity check matrix $H_{[0,n]}^T$ in FIG. 1.

(Equation 1)
$$v_{1,t} = u_t \quad [1]$$

(Equation 2)
$$v_{2,t} = \sum_{i=0}^{M} h_1^{(i)}(t) u_{t-i} + \sum_{i=1}^{M} h_2^{(i)}(t) v_{2,t-1} \quad [2]$$

Here, $u_t$ represents a transmission information sequence, and $v_{1,t}$ and $v_{2,t}$ represent transmission codeword sequences.

FIG. 2 shows an example of a main configuration of an LDPC-CC encoder that executes equation 1 and equation 2. As shown in FIG. 2, LDPC-CC encoder 10 comprises shift registers 11-1 through 11-M and 14-1 through 14-M, weight multipliers 12-0 through 12-M and 13-0 through 13-M, weight control section 16, and modulo 2 adder 15.

Shift registers 11-1 through 11-M and 14-1 through 14-M are registers storing and $v_{1,t-i}$ and $v_{2,t-i}$ (where i=0, . . . , M) respectively, and at a timing at which the next input comes in, output a stored value to the adjacent shift register to the right, and newly store a value output from the adjacent shift register to the left.

Weight multipliers 12-0 through 12-M and 13-0 through 13-M switch values of $h_1^{(m)}$ and $h_2^{(m)}$ to 0 or 1 in accordance with a control signal output from weight control section 16. Based on a parity check matrix stored internally, weight control section 16 outputs the values of $h_1^{(m)}$ and $h_2^{(m)}$ at that timing to weight multipliers 12-0 through 12-M and 13-0 through 13-M.

Modulo 2 adder 15 performs modulo 2 addition on the outputs of weight multipliers 12-0 through 12-M and 13-0 through 13-M, and calculates $v_{2,t}$.

By employing this kind of configuration, LDPC-CC encoder 10 can perform LDPC-CC encoding in accordance with a parity check matrix.

A characteristic of an LDPC-CC encoder is that it can be implemented with extremely simple circuitry as compared with the circuitry of an encoder that performs generator matrix multiplication, or an LDPC-BC encoder that performs computation based on backward substitution or forward substitution. Also, since an LDPC-CC is a convolutional code, it is not necessary to divide a transmission information sequence into fixed-length blocks when encoding, and an information sequence of any length can be encoded.

In LDPC-CC decoding, a sum-product algorithm can be applied based on a parity check matrix in the same way as with an LDPC-BC. Therefore, it is not necessary to use a decoding algorithm based on maximum likelihood sequence estimation such as a Viterbi algorithm, and decoding processing can be completed with little processing delay. Furthermore, in Non-Patent Document 1, a decoding algorithm is proposed that takes advantage of the structure of the parity check matrix, in which 1 s are arranged in a parallelogram configuration (see Patent Document 1).

When LDPC-CC and LDPC-BC decoding performance are compared using parameters such that the decoder circuit scales are equivalent, LDPC-CC decoding performance are shown to be superior (see Non-Patent Document 1).

Now we consider that an encoder terminates LDPC-CC encoding at an arbitrary length n, and a decoder decodes a corresponding received codeword sequence. In this case, the decoder requires the codeword that encoded transmission information sequences after the n-th bit and shift register states at the end of encoding in order to make probability propagation of the rear c×M bits equivalent to that of the other bits in sum-product decoding.

However, when a transmission information sequence is simply encoded, since encoder shift register states at the end of encoding depend on the transmission information sequence, it is difficult to decide those states uniquely on the receiver side.

If decoding processing is performed on the receiver side based on a received codeword sequence in such a situation, a phenomenon occurs whereby errors increase at the end of a received information sequence obtained after decoding, particularly in the rear c×M bits.

In order to prevent such errors, it is necessary for termination processing (termination) that uniquely decides a terminal state of encoding to be executed on a transmission information sequence.

With a convolutional code conforming to IEEE802.11n, termination is executed by adding "tail bits" comprising the six 0 s to the rear of a transmission information sequence when performing encoding. The number of bits in the tail, six, is the same as the number of shift registers in an encoder. In this way, the state of an encoder shift register can be made all-zeros at a point in time at which tail bit input ends. A codeword output when a tail bit is input is necessary for decoding processing on the receiver side, and is therefore transmitted to the receiver side together with a transmission codeword.

In the case of an LDPC-CC, as shown in equation 2, codewords $v_{2,t-i}$ for the past M times are necessary to find codeword $v_{2,t}$, and therefore shift registers for storing codeword $v_{2,t-i}$ for the past M times are provided in an LDPC-CC encoder. A register storing a transmission information sequence can be set to an all-zero state by making the end of a transmission information sequence a length-M all-zero sequence (termination), but a problem is that it is difficult to set a shift register storing codeword $v_{2,t-i}$ to an all-zero state with only this termination processing.

In Non-Patent Document 2, termination processing is proposed that sets the state of a shift register at the end of encoding to all-zeros by performing encoding after adding a termination sequence to the rear of a transmission information sequence.

In the termination processing proposed in Non-Patent Document 2, a transmission codeword sequence is defined as shown in equation 3. Equation 3 is an example for a case in which coding rate R=½. In equation 3, $v_{1\times 2n}$ is a length-2n codeword sequence obtained by convolutional encoding of a length-n information sequence, $x_{1\times 2L}$ is a termination codeword sequence obtained by convolutional encoding of a length-L termination sequence, and $0_{1\times 2M}$ is a length-2M 0-sequence.

(Equation 3)

$$[v_{1\times 2n}, x_{1\times 2L}, 0_{1\times 2M}] H'_{2(n+L+M)\times(n+L+M)} = 0_{1\times(n+L+M)} \quad [3]$$

Here, termination sequence $x_{1\times 2L}$ is decided by equation 4 and equation 5.

(Equation 4)

$$[v_{1\times 2n}, x_{1\times 2L}, 0_{1\times 2M}] \begin{bmatrix} A_{2n\times n} & B_{2n\times(L+M)} \\ 0_{2L\times n} & D_{2L\times(L+M)} \\ 0_{2M\times n} & F_{2M\times(L+M)} \end{bmatrix} = 0_{1\times(n+L+M)} \quad [4]$$

(Equation 5)

$$x_{1\times 2L} D_{2L\times(L+M)} = v_{1\times 2n} B_{2n\times(L+M)} = \beta \quad [5]$$

The state of a shift register can be set to an all-zero state by encoding a transmission codeword sequence to which such a termination sequence has been added with an LDPC-CC encoder. By having a transceiver-side communication apparatus transmit a transmission codeword that has undergone termination processing in this way to the receiver side, the receiver side decoder can uniquely decide a shift register state at the end of encoding, and performs error correction decoding at a desired level of performance.

FIG. 3 shows a configuration of an LDPC-CC encoder to which a termination sequence generation section that generates termination sequence $x_{1\times 2L}$ shown in equation 5 has been added. LDPC-CC encoder 20 shown in FIG. 3 comprises termination sequence generation section 17, parity check matrix storage section 18, and switch 19 in addition to the configuration elements of LDPC-CC encoder 10.

Parity check matrix storage section 18 stores a parity check matrix of an LDPC-CC.

Termination sequence generation section 17 generates termination sequence $x_{1\times 2L}$ in accordance with equation 5, using the parity check matrix stored in parity check matrix storage section 18 and $v_{1,t}$ and $v_{2,t}$, and outputs obtained termination sequence $x_{1\times 2L}$ to switch 19.

Switch 19 switches a sequence output to shift register 11-1 to either a transmission information sequence or a termination sequence based on a termination processing control signal. Specifically, switch 19 outputs a transmission information sequence to shift register 11-1 when the termination processing control signal indicates transmission information sequence encoding, and outputs a termination sequence to shift register 11-1 when the termination processing control signal indicates termination processing.

FIG. 4 shows an LDPC-CC encoder 20 input sequence and output sequence. FIG. 4A shows an input sequence input to LDPC-CC encoder 20, and FIG. 4B shows an output sequence output from LDPC-CC encoder 20. In FIG. 4, a time series runs in the right-to-left direction of each sequence.

An LDPC-CC encoder 20 input sequence is composed of an information sequence comprising n bits, a padding sequence comprising 0 to M bits, and a termination sequence comprising (M+1) bits.

Here, information sequence length n is arbitrary, and therefore when information sequence decoding ends, a weight pattern output to weight multipliers 12-0 through 12-M and 13-0 through 13-M from weight control section 16 differs according to the value of n. This shows that $D_{2L\times(L+M)}$ in equation 5 differs according to n. As a result, there are cases in which $D_{2L\times(L+M)}$ is and is not full-rank. Consequently, $D_{2L\times(L+M)}$ when a termination sequence is found differs according to number of bits n of an information sequence. Thus, in order to make $D_{2L\times(L+M)}$ when performing termination processing the same regardless of number of bits n of an information sequence, a padding sequence of K bits (where K=0 to M) is inserted after an information sequence. A padding sequence may be any kind of sequence, as long as it is a sequence known on the encoding side and on the decoding side. For example, an all-zero sequence can be used.

A padding sequence and termination sequence are sequences necessary for termination processing, and since they are only for padding and termination processing use and do not include information of any kind, they constitute information transmission overhead.

In addition to a codeword sequence obtained by encoding an information sequence, an LDPC-CC encoder 20 output sequence also includes a codeword sequence obtained by encoding a padding sequence and termination sequence. As a result, information transmission overhead is (K+M+1)×c bits, where K represents the length of a padding sequence, and c represents the denominator of LDPC-CC coding rate R=b/c.

Patent Document 1: U.S. Patent Application No. 60/682,178 Specification

Non-Patent Document 1: Alberto Jimenez Felstorom, and Kamil Sh. Zigangirov, "Time-Varying Periodic Convolutional Codes With Low-Density Parity-Check Matrix," IEEE Transactions on Information Theory, Vol. 45, No. 6, pp 2181-2191, September 1999.

Non-Patent Document 2: Zhengang Chen, Stephen Bates, and Ziaodai Dong, "Low-Density Parity-Check Convolutional Codes Applied to Packet Based Communication Systems," Proceeding of IEEE Globecom 2005, pp 1250-1254.

Non-Patent Document 3: Stephen Bates, Duncan G. Elliott, Ramkrishna Swamy, "Termination Sequence Generation Circuits for Low-Density Parity-Check Convolutional Codes," IEEE Transactions on Circuits and Systems-1: Regular Papers, Vol. 53, No. 9, September 2006.

Non-Patent Document 4: R. D. Gallager, "Low-Density Parity-Check Codes," Cambridge, Mass.: MIT Press, 1963.

Non-Patent Document 5: M. P. C. Fossorier, M. Mihaljevic, and H. Imai, "Reduced complexity iterative decoding of low density parity check codes based on belief propagation," IEEE Trans. Commun., vol. 47., no. 5, pp. 673-680, May 1999.

Non-Patent Document 6: J. Chen, A. Dholakia, E. Eleftheriou, M. P. C. Fossorier, and X.-Yu Hu, "Reduced-complexity decoding of LDPC codes," IEEE Trans. Commun., vol. 53., no. 8, pp. 1288-1299, August 2005.

Non-Patent Document 7: Y. Ogawa, "Sum-product decoding of turbo codes," M. D. Thesis, Dept. Elec. Eng., Nagaoka Univ. of Technology, February 2007.

Non-Patent Document 8: S. Lin, D. J. Jr., Costello, "Error control coding: Fundamentals and applications," Prentice-Hall.

Non-Patent Document 9: R. M. Tanner, D. Sridhara, A. Sridharan, T. E. Fuja, and D. J. Costello Jr., "LDPC block and convolutional codes based on circulant matrices," IEEE Trans. Inform. Theory, vol. 50, no. 12, pp. 2966-2984, December 2004.

Non-Patent Document 10: G. Richter, M. Kaupper, and K. Sh. Zigangirov, "Irregular low-density parity-Check convolutional codes based on protographs," Proceeding of IEEE ISIT 2006, pp 1633-1637.

DISCLOSURE OF INVENTION

Problems to be Solved by the Invention

However, a problem with the above conventional configuration is an increase in the LDPC-CC encoder circuit scale resulting from the need for a configuration for generating termination sequence $x_{1 \times 2L}$. As an example, it is stated in Non-Patent Document 3 that adding termination sequence generation circuitry to an LDPC-CC encoder results in an approximately 7-fold increase in the LDPC-CC encoder circuit scale.

Also, with the above conventional configuration, a (K+M+1)×c-bit sequence is necessary as a transmitted termination sequence, and there are problems of an increase in the amount of overhead and degradation of transmission efficiency resulting from outputting a redundant signal sequence. For example, when an 8,000-bit transmission information sequence is transmitted using an LDPC-CC with memory length M=200, 400 bits or more—that is, redundant bits equivalent to 5% or more of the transmission information sequence—must be transmitted for termination.

It is an object of the present invention to provide an encoder, decoder, encoding method, and decoding method that enable an LDPC-CC encoding termination sequence to be provided with a simple configuration, and an amount of a termination sequence transmitted in a transmission channel to be reduced.

Means for Solving the Problem

One aspect of an encoder of the present invention is an encoder that performs coding rate R=b/c, memory length M convolutional encoding in accordance with a parity check matrix of a Low-Density Parity-Check Convolutional Code (LDPC-CC), and employs a configuration whereby an information code sequence obtained by encoding an information sequence, and a termination code sequence obtained by encoding a termination sequence of not more than (M×b) bits, are connected.

One aspect of an encoder of the present invention is an encoder that performs coding rate R=b/c, memory length M convolutional encoding in accordance with a parity check matrix of a Low-Density Parity-Check Convolutional Code (LDPC-CC), and employs a configuration comprising: a first encoder that generates a first codeword sequence by performing encoding on an input sequence based on an partial check matrix for information bits obtained by extracting columns corresponding to information bits of the parity check matrix; a second encoder that generates a second codeword sequence by performing encoding on the first codeword sequence based on a parity partial matrix obtained by extracting columns corresponding to parity bits of the parity check matrix; and a termination sequence supplying section that supplies a termination sequence of a number of bits equal to a number obtained by multiplying the memory length of the first encoder by b as the input sequence.

One aspect of a decoder of the present invention is a decoder that performs coding rate R=b/c, memory length M convolutional decoding in accordance with a parity check matrix of a Low-Density Parity-Check Convolutional Code (LDPC-CC), and employs a configuration whereby estimates of an information sequence, a termination sequence, an information code sequence obtained by encoding the information sequence, and a termination code sequence obtained by encoding the termination sequence, obtained from a communication channel, are taken as an input sequence, BP (Belief Propagation) decoding is performed on the input sequence, and an estimated information sequence obtained by BP decoding is output.

One aspect of an encoding method of the present invention is an encoding method that performs coding rate R=b/c, memory length M convolutional encoding in accordance with a parity check matrix of a Low-Density Parity-Check Convolutional Code (LDPC-CC), and has: a step of taking an information sequence and a termination code sequence of not more than (M×b) bits as an input sequence, and performing encoding on the input sequence based on the parity check matrix; and a step of outputting an information code sequence obtained by encoding the information sequence, and a termination code sequence obtained by encoding the termination sequence.

One aspect of a decoding method of the present invention is a decoding method that performs coding rate R=b/c, memory length M convolutional decoding in accordance with a parity check matrix of a Low-Density Parity-Check Convolutional Code (LDPC-CC), and has: a step of taking estimates of an information sequence, a termination sequence, an information code sequence obtained by encoding the information sequence, and a termination code sequence obtained by encoding the termination sequence, obtained from the encoding side, as an input sequence, and performing BP (Belief Propagation) decoding on the input sequence; and a step of outputting an estimated information sequence obtained by BP decoding.

Advantageous Effects of Invention

The present invention enables an LDPC-CC encoding termination sequence to be provided with a simple configuration, and an amount of a termination sequence transmitted in a transmission channel to be reduced.

BRIEF DESCRIPTION OF DRAWINGS

FIG. 1 is a drawing showing an example of a conventional parity check matrix of an LDPC-CC;

FIG. 5 is a drawing showing an example of a parity check matrix of an LDPC-CC according to Embodiment 1 of the present invention;

FIG. 6 is a drawing showing an partial parity check matrix for information bits according to Embodiment 1;

FIG. 7 is a drawing showing a partial parity check matrix for parity bits according to Embodiment 1;

FIG. 10 is a drawing showing weight patterns stored in a weight control section according to Embodiment 1;

FIG. 16 is a drawing showing another example of a parity check matrix of an LDPC-CC according to Embodiment 1;

FIG. 17 is a drawing showing another example of a partial parity check matrix for parity bits according to Embodiment 1;

FIG. 19 is a drawing showing a time-variant partial parity check matrix for parity bits according to Embodiment 1;

FIG. 22 is a drawing showing an example of a parity check matrix of an LDPC-CC according to Embodiment 2 of the present invention;

FIG. 23 is a drawing showing an partial parity check matrix for information bits according to Embodiment 2;

FIG. 24 is a drawing showing a partial parity check matrix for parity bits according to Embodiment 2;

FIG. 29 is a drawing showing an example of a parity check matrix of an LDPC-CC according to Embodiment 3 of the present invention;

FIG. 30 is a drawing showing an partial parity check matrix for information bits according to Embodiment 3;

FIG. 31 is a drawing showing a partial parity check matrix for parity bits according to Embodiment 3;

FIG. 40 is a drawing showing a termination section of a parity check matrix of an LDPC-CC according to Embodiment 4;

FIG. 43 is a drawing showing a termination section of a parity check matrix of an LDPC-CC according to Embodiment 5;

FIG. 45 is a drawing showing a termination section of a parity check matrix of an LDPC-CC according to Embodiment 5;

FIG. 47 is a drawing showing a parity check matrix of a (7, 5) convolutional code;

FIG. 50 is a drawing showing an example of a configuration of a parity check matrix of an LDPC-CC according to Additional Embodiment 1;

FIG. 51 is a drawing showing a parity check matrix of a (7, 5) convolutional code;

FIG. 52 is a drawing showing an example of a configuration of a parity check matrix of an LDPC-CC according to Additional Embodiment 1;

FIG. 53 is a drawing showing an example of a configuration of a parity check matrix of an LDPC-CC according to Additional Embodiment 2;

FIG. 55 is a drawing showing an example of a configuration of a parity check matrix of a time-variant-period-m LDPC-CC according to Additional Embodiment 2;

FIG. 56A is a drawing for explaining a number of puncture patterns;

FIG. 56B is a drawing showing the relationship between an encoding sequence and a puncture pattern;

FIG. 56C is a drawing showing the number of parity check polynomials that must be checked in order to select a puncture pattern;

BEST MODE FOR CARRYING OUT THE INVENTION

Now, embodiments of the present invention will be described in detail with reference to the accompanying drawings.

Embodiment 1

In this embodiment, descriptions are given of an LDPC-CC encoder that performs LDPC-CC encoding, and a termination processing method thereof.

Figure 5:
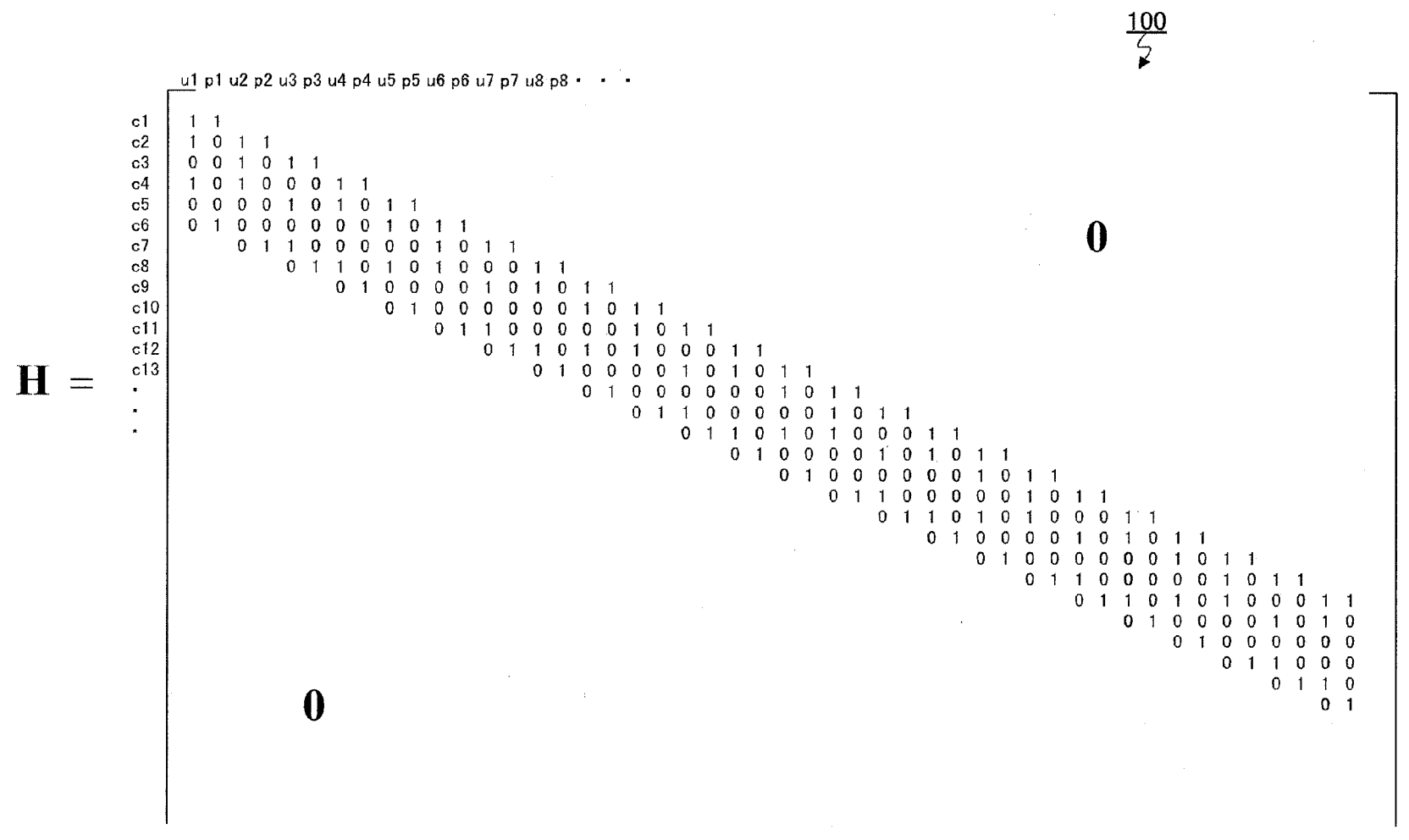

FIG. 5 shows an example of a parity check matrix of an LDPC-CC according to this embodiment. Parity check matrix 100 in FIG. 5 is a parity check matrix that defines a periodic time-variant LDPC-CC for which coding rate R=½ and memory length M=5. "Periodic time-variant" here indicates that a 1/0 arrangement pattern in the parity check matrix differs on a column-by-column basis, and that pattern has periodicity.

In FIG. 5, each row of parity check matrix 100 corresponds to a parity check equation. In FIG. 5, the parity check equations of the respective rows are labeled c1, c2, . . . . Each column of parity check matrix 100 corresponds to a bit of a transmission codeword sequence. Parity check matrix 100 in FIG. 5 is a parity check matrix that defines a systematic code, and the columns are arranged in the order: transmission codeword sequence first information bit u1, first parity bit p1, second information bit u2, second parity bit p2, . . . .

FIG. 6 shows partial parity check matrix (hereinafter also referred to as "partial parity check matrix for information bits") 110 obtained by extracting columns corresponding to information bits from parity check matrix 100, and FIG. 7 shows partial parity check matrix (hereinafter also referred to as a "partial parity check matrix for parity bits") 120 obtained by extracting columns corresponding to parity bits from parity check matrix 100.

As shown in FIG. 6 and FIG. 7, an LDPC-CC encoder according to this embodiment is characterized by performing LDPC-CC encoding after analyzing parity check matrix 100 into partial parity check matrix for information bits 110 and partial parity check matrix for parity bits 120.

Figure 8:
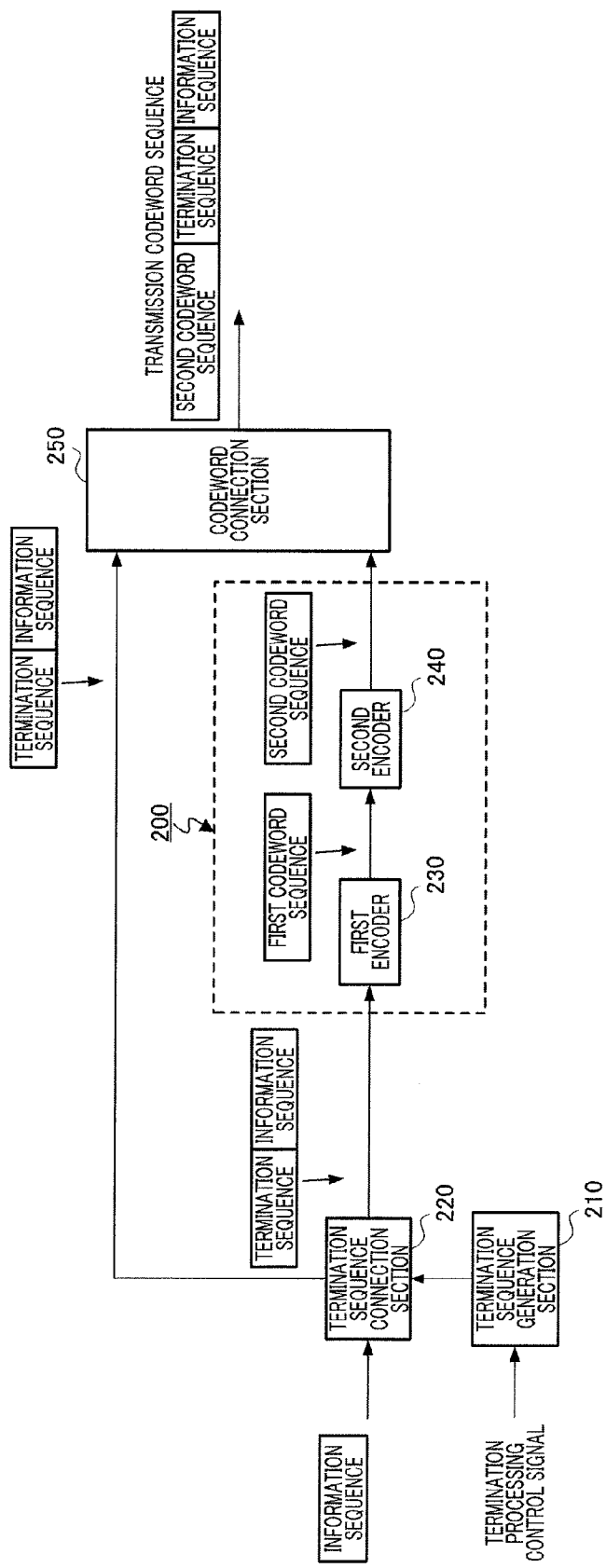
FIG. 8 is a block diagram showing a configuration of an LDPC-CC encoder according to Embodiment 1.

FIG. 8 shows an example of a configuration of an LDPC-CC encoder according to this embodiment. LDPC-CC encoder 200 in FIG. 8 comprises first encoder 230 and second encoder 240. In addition to LDPC-CC encoder 200, FIG. 8 also shows termination sequence generation section 210, termination sequence connection section 220, and codeword connection section 250, and LDPC-CC encoder 200 performs encoding of a systematic code in which an information sequence appears as-is in a transmission codeword sequence.

Termination sequence generation section 210 generates a termination sequence necessary for performing LDPC-CC encoder 200 termination processing, and outputs the generated termination sequence to termination sequence connection section 220.

Termination sequence connection section 220 has a termination sequence output from termination sequence generation section 210 as input, and connects the termination sequence to the end of an information sequence. Termination sequence connection section 220 outputs the connected information sequence and termination sequence to first encoder 230. In this way, a termination sequence provided from termination sequence generation section 210 is made a first encoder 230 information sequence, and a connected information sequence and termination sequence are output to codeword connection section 250.

First encoder 230 performs encoding on an information sequence or termination sequence output from termination sequence connection section 220 based on partial parity check matrix for information bits 110, and acquires a first codeword sequence. First encoder 230 outputs the first codeword sequence to second encoder 240.

Second encoder 240 performs encoding on the first codeword sequence output from first encoder 230 based on partial parity check matrix for parity bits 120, and acquires a second codeword sequence. Second encoder 240 outputs the second codeword sequence to codeword connection section 250.

Codeword connection section 250 connects the information sequence and termination sequence to the second codeword sequence and generates a transmission codeword sequence, and outputs that transmission codeword sequence as a codeword.

Thus, LDPC-CC encoder 200 connects encoding using partial parity check matrix for information bits 110 that extracts columns corresponding to information bits from parity check matrix 100, and encoding using partial parity check matrix for parity bits 120 that extracts columns corresponding to parity bits from parity check matrix 100.

(First Encoder)

Figure 9:
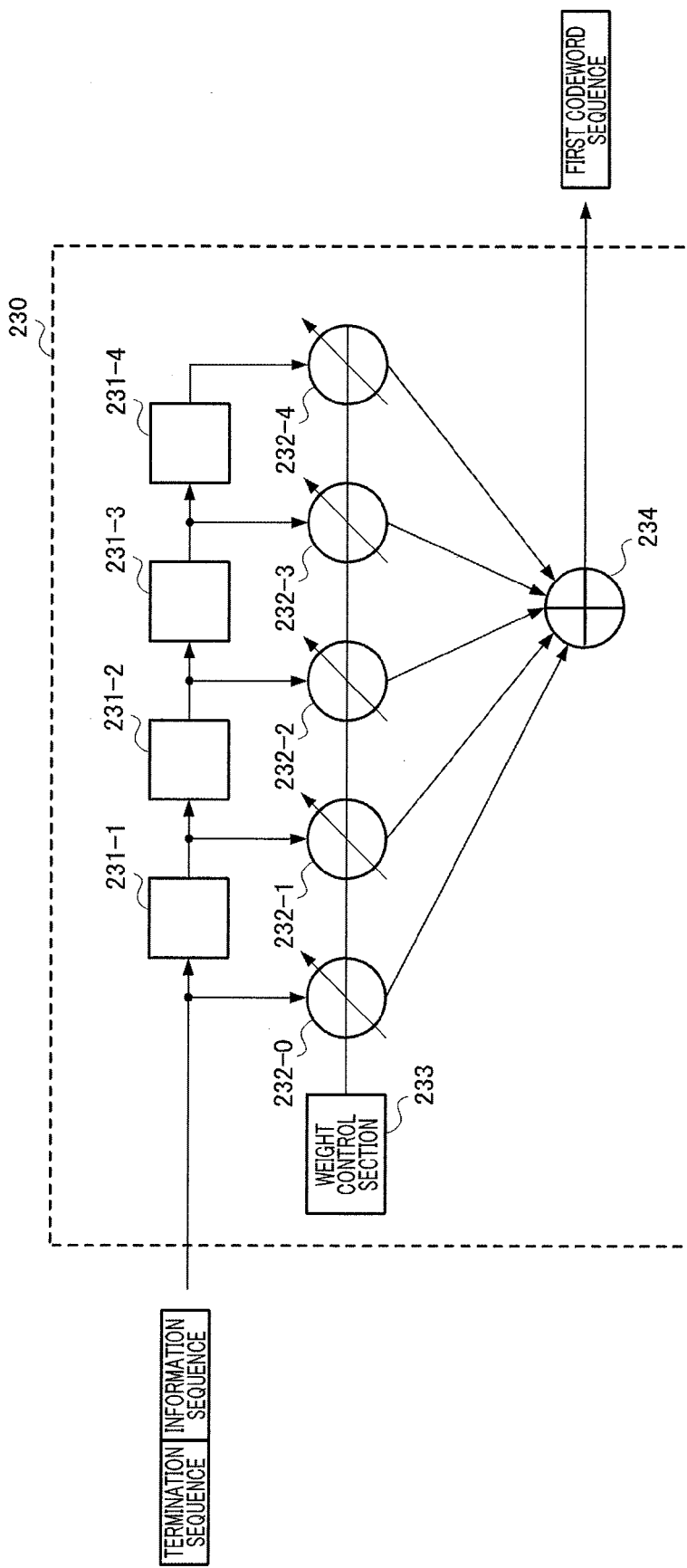
FIG. 9 is a block diagram showing an internal configuration of a first encoder according to Embodiment 1.

FIG. 9 shows the internal configuration of first encoder 230. First encoder 230 in FIG. 9 is a convolutional encoder that takes each column of partial parity check matrix for information bits 110 as a coefficient of a generating polynomial (an equation that represents a connection of a shift register to a modulo 2 adder). First encoder 230 is a non-recursive convolutional encoder with four delay operators (shift registers), and performs encoding on an information sequence based on a generating polynomial corresponding to the 1/0 arrangement of each column of partial parity check matrix for information bits 110.

In FIG. 9, first encoder 230 comprises shift registers 231-1 through 231-4, weight multipliers 232-0 through 232-4, weight control section 233, and modulo 2 adder 234. If the number of shift registers of a first encoder is designated M1, first encoder 230 shown in FIG. 9 is an example of a case in which M1=4. M1 is the memory length of a first encoder.

Shift registers 231-1 through 231-4 are registers storing input bits, and at a timing at which the next input comes in, output a stored value to the adjacent shift register to the right, and store a value output from the adjacent shift register to the left.

Weight multipliers 232-0 through 232-4 multiply outputs of shift registers 231-1 through 231-4 by a weight value in accordance with a weight pattern output from weight control section 233.

Based on a weight pattern stored internally, weight control section 233 outputs a weight value at that timing to weight multipliers 232-0 through 232-4.

Modulo 2 adder 234 performs modulo 2 addition on the output results of weight multipliers 232-0 through 232-4, and calculates the modulo 2 addition result as first codeword sequence codeword bit $v_{c1,t}$.

FIG. 10 shows weight patterns stored in weight control section 233. The weight patterns in FIG. 10 align the positions of a 1/0 sequence of each row of partial parity check matrix for information bits 110 in FIG. 6, with right and left reversed. As shown in FIG. 6, the 1/0 sequence of each row of partial parity check matrix for information bits 110 has four kinds of pattern repeatedly sequenced, and therefore weight control section 233 stores four weight patterns (weight patterns 1 through 4).

Weight control section 233 repeatedly outputs weight patterns 1 through 4 shown in FIG. 10 in order. Here, FIG. 10(a) indicates a weight value output to weight multiplier 232-0, FIG. 10(b) indicates a weight value output to weight multiplier 232-1, FIG. 10(c) indicates a weight value output to weight multiplier 232-2, FIG. 10(d) indicates a weight value output to weight multiplier 232-3, and FIG. 10(e) indicates a weight value output to weight multiplier 232-4.

(Second Encoder)

Second encoder 240 performs encoding based on a 1/0 sequence of each row of partial parity check matrix for parity bits 120. As shown in FIG. 7, the 1/0 sequence of each row of partial parity check matrix for parity bits 120 is {1, 0, 0, 0, 0, 1}. This indicates that a parity bit of a certain point in time is acquired by performing modulo 2 addition of input at that point in time and a parity bit of a point in time five before that point in time. For example, a parity bit of point in time p6 is found by performing modulo 2 addition of second encoder 240 input at point in time p6 and parity bit p1 obtained at point in time p1.

Consequently, encoding based on the 1/0 sequence of each row of partial parity check matrix for parity bits 120 can be implemented by means of a differential encoder with five delay operators (shift registers), a recursive convolutional encoder with five delay operators (shift registers), or an accumulator with five delay operators (shift registers).

Figure 11:
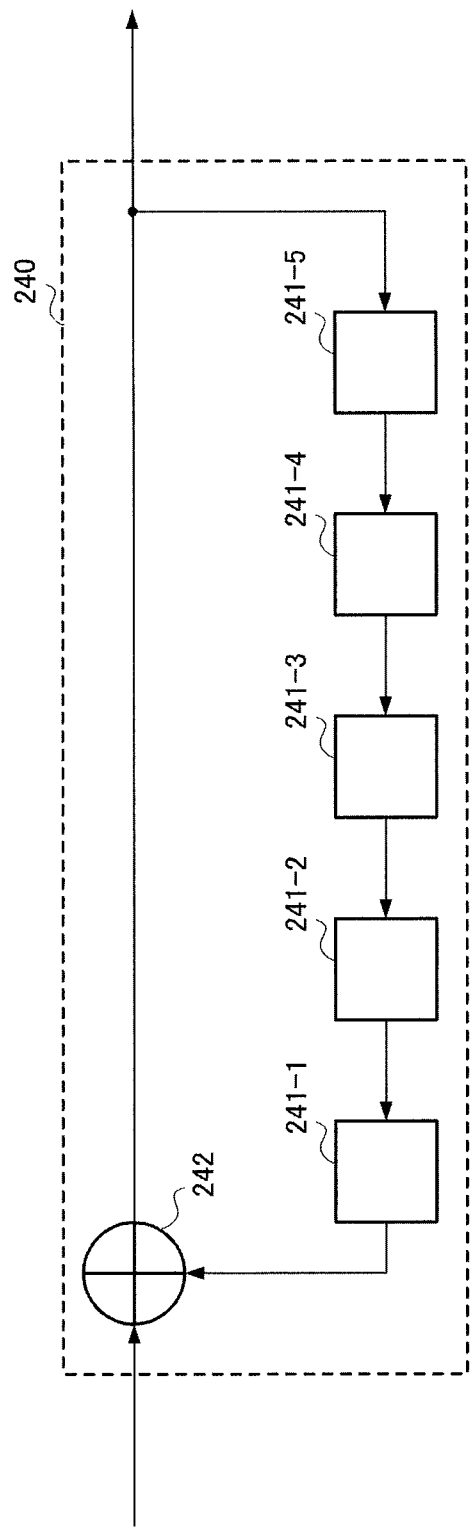
FIG. 11 is a block diagram showing an internal configuration of a second encoder according to Embodiment 1.

FIG. 11 shows the internal configuration of second encoder 240. Second encoder 240 in FIG. 11 comprises shift registers 241-1 through 241-5 and modulo 2 adder 242. If the number of delay operators (shift registers) of a second encoder is designated M2, second encoder 240 shown in FIG. 11 is an example of a case in which M2=5. M2 is the memory length of a second encoder.

Shift registers 241-1 through 241-5 are registers storing parity bit $p_{t-i}$, and at a timing at which the next input comes in, output a stored value to the adjacent shift register to the left, and store a value output from the adjacent shift register to the right.

Modulo 2 adder 242 performs modulo 2 addition on first codeword sequence codeword bit $v_{c1,t}$ input to second encoder 240 and shift register 241-1 output, and outputs parity bit $p_t$ obtained as an addition result to codeword connection section 250 as second codeword sequence codeword bit $v_{c2,t}$. Second codeword sequence codeword bit $v_{c2,t}$ corresponds to $v_{2,t}$ shown in equation 2.

Codeword connection section 250 connects an information sequence or termination sequence to a second codeword sequence output from second encoder 240, and outputs the resulting connected sequence as a transmission codeword sequence.

Thus, first encoder 230 executes encoding on an input sequence and calculates first codeword sequence codeword bit $v_{c1,t}$, and second encoder 240 has first codeword sequence codeword bit $v_{c1,t}$ as input and calculates second codeword sequence codeword bit $v_{c2,t}$.

The ability to calculate second codeword sequence codeword bit $v_{c2,t}$ of an LDPC-CC codeword sequence by connecting first encoder 230 and second encoder 240 in this way is due to the fact that codeword bit $v_{c2,t}$ is generated by equation 2 in LDPC-CC encoding.

The memory size of an LDPC-CC encoder is M=max(M1, M2). M1 indicates the number of delay operators (shift registers) of the first encoder, M2 indicates the number of delay operators (shift registers) of the second encoder, and max(•) represents finding the maximum value of the numbers in (•).

Termination processing of LDPC-CC encoder 200 configured as described above will now be explained.

(Termination Processing)

In FIG. 8, termination sequence generation section 210 generates a termination sequence for LDPC-CC encoder 200 termination, and provides this termination sequence to termination sequence connection section 220. Due to the configurations of first encoder 230 and second encoder 240, a termination sequence is as described below.

As shown in FIG. 9, first encoder 230 according to this embodiment is a non-recursive convolutional encoder, and can therefore set the states of shift registers 231-1 through 231-4 at the end of encoding to all-zeros by inputting a zero sequence of the same number of bits as number of shift registers M1—that is, a 4-bit zero sequence—to first encoder 230. That is to say, a termination sequence for first encoder 230 termination is {0, 0, 0, 0}.

On the other hand, as shown in FIG. 11, second encoder 240 according to this embodiment is a differential encoder with five delay operators (shift registers), and a value stored in each shift register is output to a communication channel at a point in time prior thereto. Consequently, the state of a shift register can be decided uniquely on the decoding side by using a received codeword, and therefore second encoder 240 termination processing is unnecessary.

From the above, it follows that a termination sequence necessary for LDPC-CC encoder 200 termination processing is a zero sequence of the same number of bits as the number of shift registers (M1) of first encoder 230. Therefore, termination sequence generation section 210 need only generate a 4-bit ((M1×b)–bit) zero sequence as a termination sequence, and provide this to termination sequence connection section 220.

Termination sequence connection section 220 connects a termination sequence provided from termination sequence generation section 210 to the end of an information sequence, and outputs the connected information sequence and termination sequence to first encoder 230.

Figures 12A, 12B:
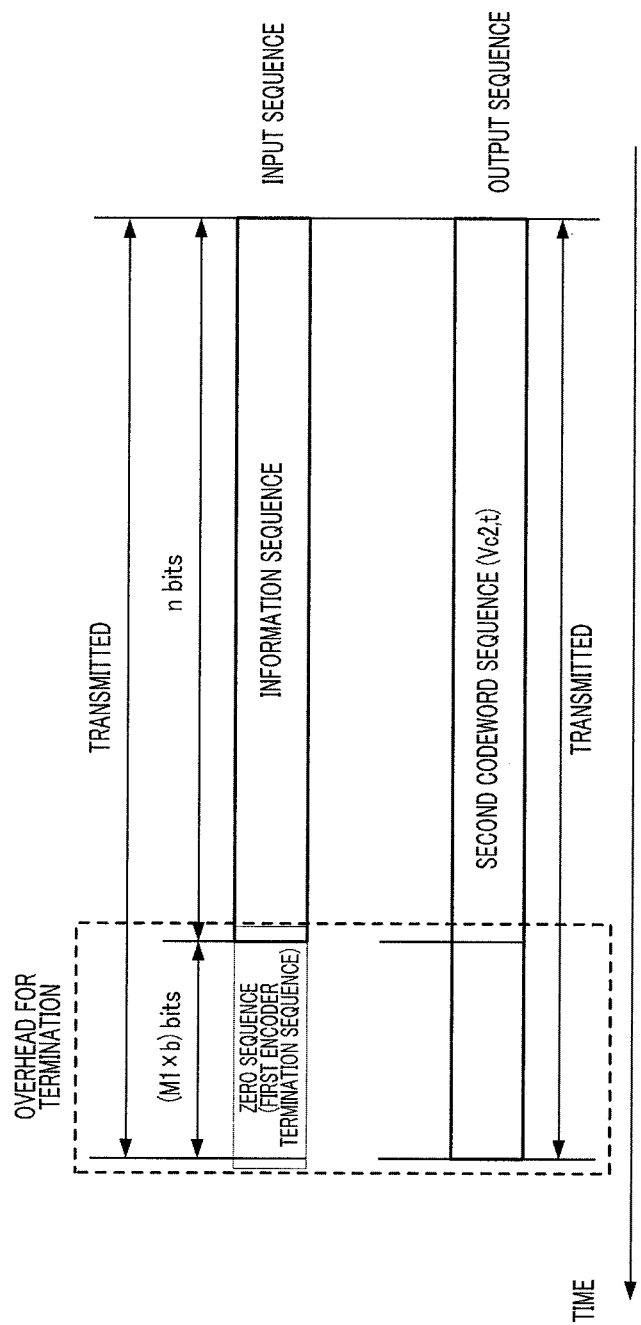
FIG. 12 is a drawing showing an input sequence and an output sequence of an LDPC-CC encoder according to Embodiment 1.

FIG. 12 shows an input sequence and an output sequence of LDPC-CC encoder 200. FIG. 12A shows a first encoder 230 information sequence, and FIG. 12B shows a second codeword sequence corresponding to a parity bit section output from codeword connection section 250.

As shown in FIG. 12, an input sequence input to first encoder 230 comprises an information sequence of n bits and a termination sequence of (M1×b) bits.

With LDPC-CC encoder 200 according to this embodiment, a termination sequence can be a zero sequence of a number of bits equal to a number obtained by multiplying first encoder 230 memory length M1 by b, and therefore a termination sequence need not be found by solving equation 5, and does not depend on a weight pattern when termination processing is started. Consequently, there is no need for insertion of a K-bit padding sequence (where K=0 to M) as required in the case of LDPC-CC encoder 20. As a result, when LDPC-CC encoder 200 is used, information transmission overhead due to termination processing is (M1×c) bits.

Thus, with LDPC-CC encoder 200 according to this embodiment, first encoder 230 that performs encoding based on partial parity check matrix for information bits 110 and second encoder 240 that performs encoding based on partial parity check matrix for parity bits 120 are connected, and LDPC-CC encoding is performed based on parity check matrix 100.

As described above, second encoder 240 that performs encoding based on partial parity check matrix for parity bits 120 is configured as a differential encoder. Consequently, a value stored in each shift register is output to a communication channel at a point in time prior thereto, and the state of a shift register can be decided uniquely on the decoding side by means of a received codeword, making second encoder 240 termination processing unnecessary.

Therefore, by configuring LDPC-CC encoder 200 as described above, LDPC-CC encoder 200 termination processing can be implemented by performing encoding after connecting a 0-sequence of the same number of bits as the number of shift registers of first encoder 230—that is, of a number of bits equal to a number obtained by multiplying first encoder 230 memory length M1 by b—to the end of an information sequence.

Thus, termination sequence generation section 210 need only provide a termination sequence comprising the same number of 0 as the number of shift registers—that is, a number of 0 s equal to a number obtained by multiplying first encoder 230 memory length M1 by b—and therefore termination sequence generation section 210 can be configured on a much smaller scale than termination sequence generation circuitry in an above-described conventional LDPC-CC encoder.

Also, whereas with an above-described conventional LDPC-CC encoder configuration, encoder termination processing cannot be performed simply by inputting a 0-sequence comprising the same number of bits as the number of LDPC-CC encoder shift registers to the encoder, with this embodiment termination processing can be performed simply by inputting a 0-sequence comprising the same number of bits as the number of shift registers in first encoder 230 to LDPC-CC encoder 200. Whereas overhead when using above-described conventional LDPC-CC encoder 20 is (K+M+1)×b/R=(K+M+1)×c, information transmission overhead due to LDPC-CC encoder 200 termination processing is M1×b/R=M1×c bits, and since M1×c≦(K+M+1)×c, information transmission overhead due to termination processing can be reduced with LDPC-CC encoder 200 according to this embodiment as compared with a case in which above-described conventional LDPC-CC encoder 20 is used.

Figure 13:
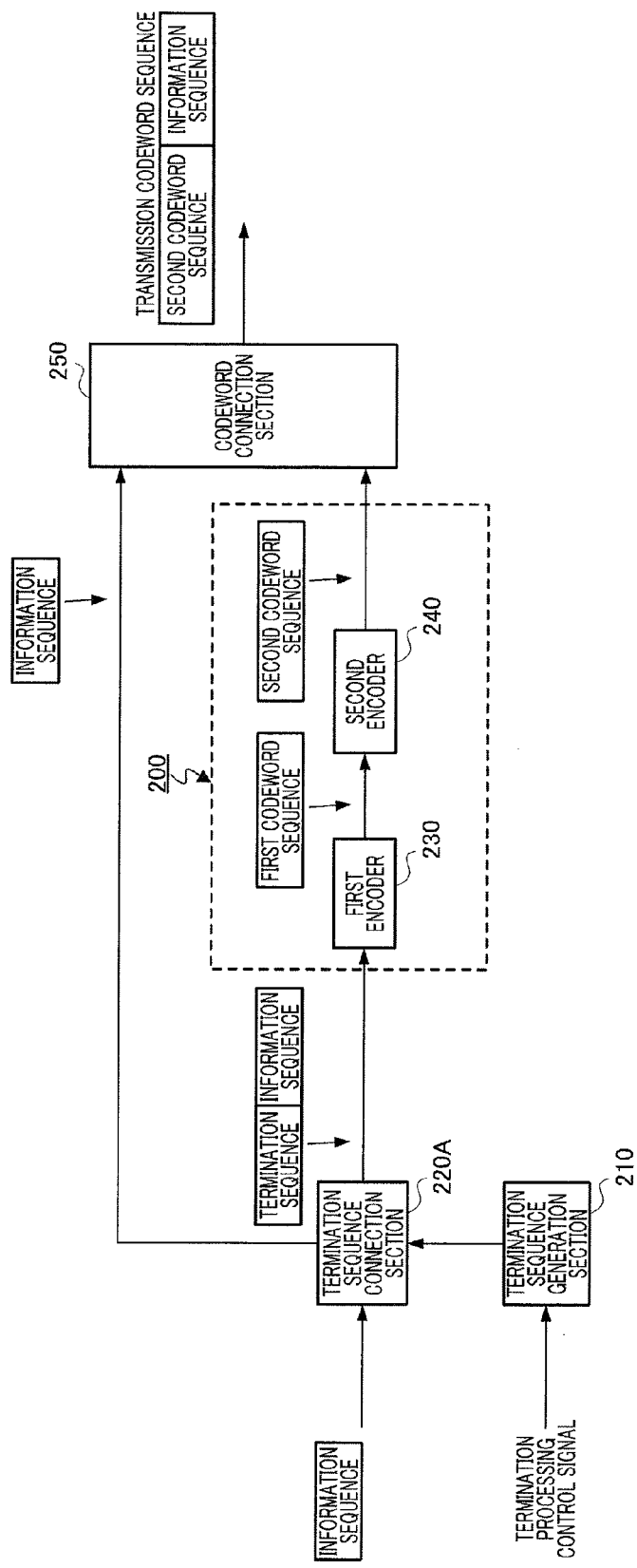
FIG. 13 is a block diagram showing another configuration of an LDPC-CC encoder according to Embodiment 1.

In FIG. 8, a configuration is employed whereby termination sequence connection section 220 connects a termination sequence to the end of an information sequence, and outputs the resulting connected sequence to first encoder 230 and codeword connection section 250, but provision may also be made for the use of termination sequence connection section 220A that outputs such a connected sequence to only first encoder 230, and outputs an information sequence to codeword connection section 250, as shown in FIG. 13.

As explained above, if first encoder 230 is configured as a non-recursive convolutional encoder, a termination sequence can be made a 0-sequence comprising the same number of bits as the number of shift registers in first encoder 230, and therefore what a termination sequence is can be known in advance on the decoding side without a termination sequence being transmitted from the encoding side. Therefore, what a termination sequence is can be known in advance on the decoding side even if provision is made for a termination sequence not to be output to codeword connection section 250 from termination sequence connection section 220A, as shown in FIG. 13, enabling a reduction in overhead equivalent to the non-transmission of a termination sequence to be achieved.

Figure 14:
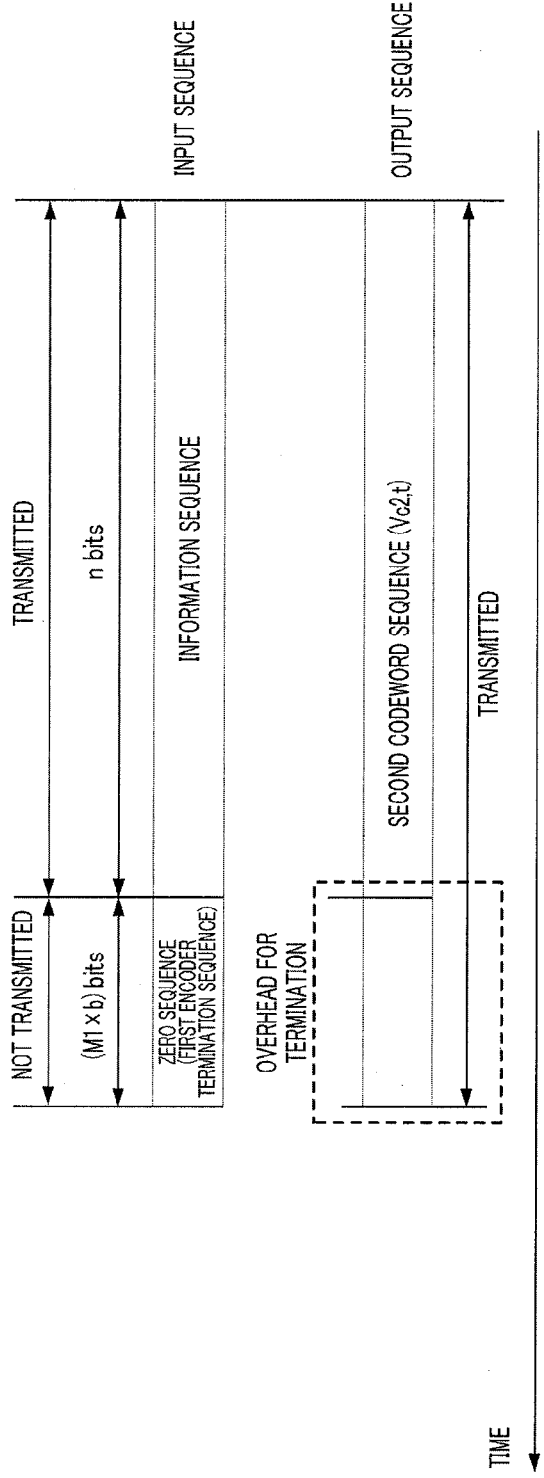
FIG. 14 is a drawing showing an input sequence and an output sequence of an LDPC-CC encoder according to Embodiment 1.

FIG. 14 shows an input sequence and an output sequence of LDPC-CC encoder 200. FIG. 14A shows a first encoder 230 information sequence, and FIG. 14B shows a second codeword sequence corresponding to a parity bit section output from codeword connection section 250.

As shown in FIG. 14, an input sequence input to first encoder 230 comprises an information sequence of n bits and a termination sequence of (M1×b) bits. However, since the termination sequence is an all-zero sequence and can be known on the decoding side, it need not be transmitted in a transmission channel.

Therefore, information transmission overhead due to LDPC-CC encoder 200 termination processing is M1×(c−b) bits. Since R=b/c, M1×(c−b)<M1×c, and overhead can be further reduced by not transmitting a termination sequence in a transmission channel.

Also since M1×(c−b)≦(K+M+1)×c, performing LDPC-CC encoder 200 termination processing as described above enables transmission channel utilization efficiency to be improved compared with above-described conventional LDPC-CC encoder 20 in which a (K+M+1)/R-bit overhead is produced.

Figure 15:
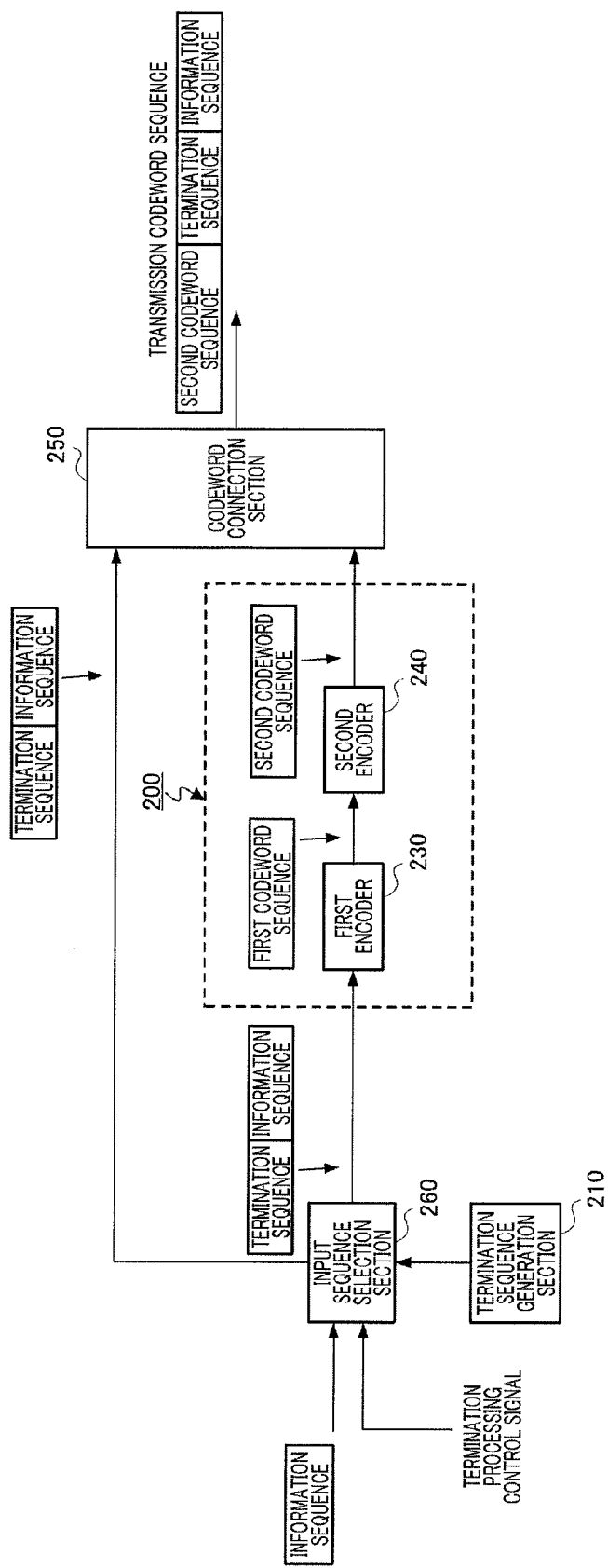
FIG. 15 is a block diagram showing another configuration of an LDPC-CC encoder according to Embodiment 1.

Termination sequence connection section 220 in FIG. 8 employs a configuration whereby a sequence in which a termination sequence is connected to the end of an information sequence is output to first encoder 230 and codeword connection section 250, but the configuration is not limited to this. For example, input sequence selection section 260 may be used instead of termination sequence connection section 220, as shown in FIG. 15.

Input sequence selection section 260 switches a sequence output to first encoder 230 and codeword connection section 250 according to a termination processing control signal. A termination processing control signal is a signal directing the start of termination processing, and when the termination processing control signal indicates a state prior to the start of termination processing, input sequence selection section 260 outputs an information sequence to first encoder 230 and codeword connection section 250. On the other hand, when the termination processing control signal indicates the start of termination processing, input sequence selection section 260 outputs a termination sequence to first encoder 230 and codeword connection section 250.

Also, provision may also be made for input sequence selection section 260 to perform switching so that a termination sequence is not output to codeword connection section 250, in the same way as in the case of termination sequence connection section 220a. Specifically, provision may be made for input sequence selection section 260 to perform switching so that an information sequence is output to first encoder 230 and codeword connection section 250 when the termination processing control signal indicates a state prior to the start of termination processing, and a termination sequence is output to first encoder 230 when the termination processing control signal indicates the start of termination processing.

In the above description, a case has been described in which LDPC-CC encoding is performed based on parity check matrix 100 in FIG. 5, but the present invention is not limited to this, and may also be applied to a case in which LDPC-CC encoding is performed based on another parity check matrix.

Figure 16:
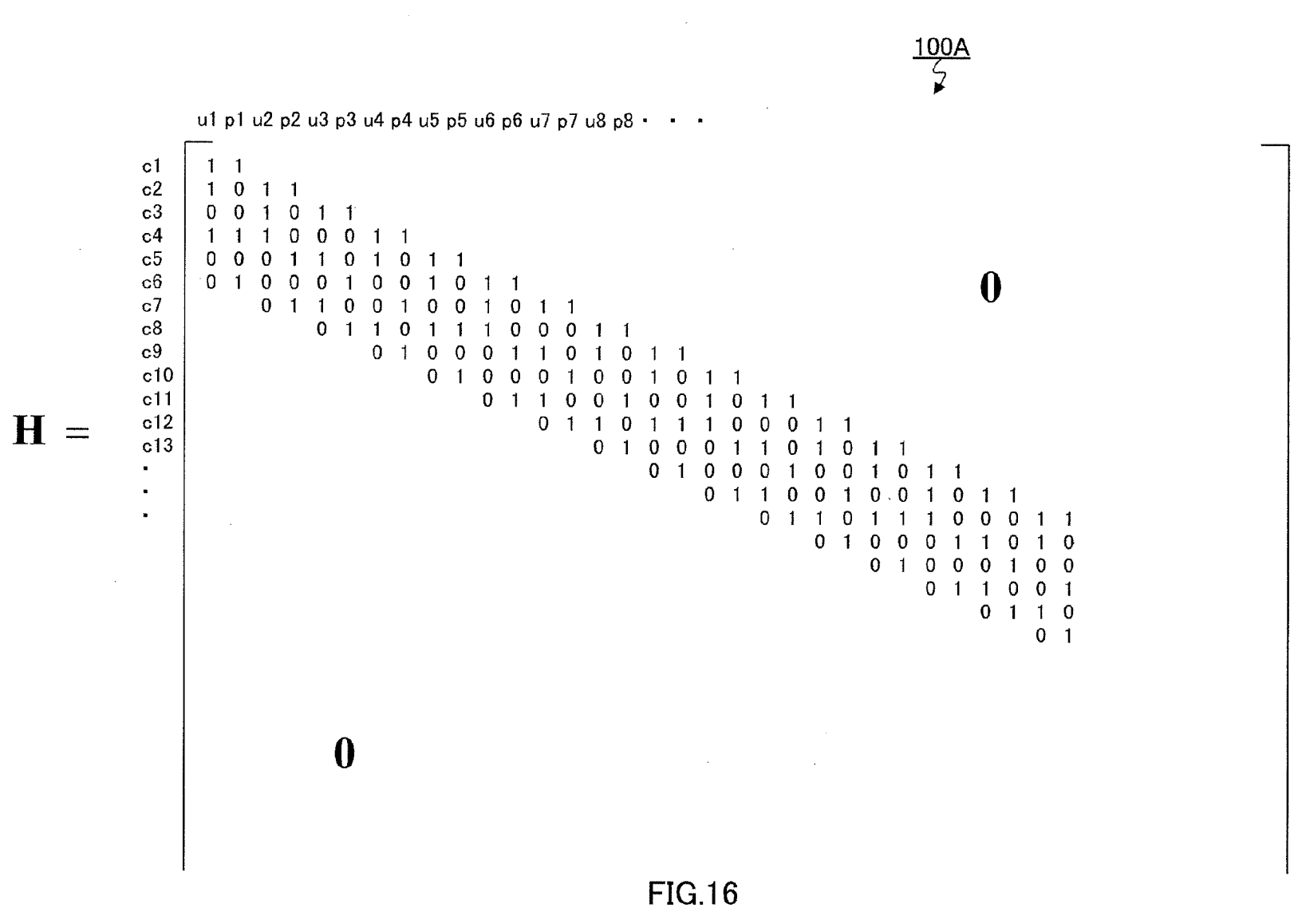

As an example, a description is given below of an LDPC-CC encoder that performs LDPC-CC encoding based on the parity check matrix shown in FIG. 16. A partial parity check matrix obtained by extracting columns corresponding to parity bits from parity check matrix 100A in FIG. 16 is shown in FIG. 17. A partial parity check matrix obtained by extracting columns corresponding to information bits is similar to partial parity check matrix for information bits 110, and therefore a description thereof is omitted here. The column-direction 1/0 sequence of partial parity check matrix for parity bits 120A in FIG. 17 is {1, 0, 1, 0, 0, 1}. This indicates that, for example, parity bit p6 obtained at point in time p6 is obtained by performing modulo 2 addition of second encoder 240 input at point in time p6 and parity bits p1 and p3 obtained at points in time p1 and p3. That is to say, encoding based on the 1/0 sequence of each row of partial parity check matrix for parity bits 120A can be implemented by means of a differential encoder with five delay operators (shift registers), a recursive convolutional encoder with five delay operators (shift registers), or an accumulator with five delay operators (shift registers).

Figure 18:
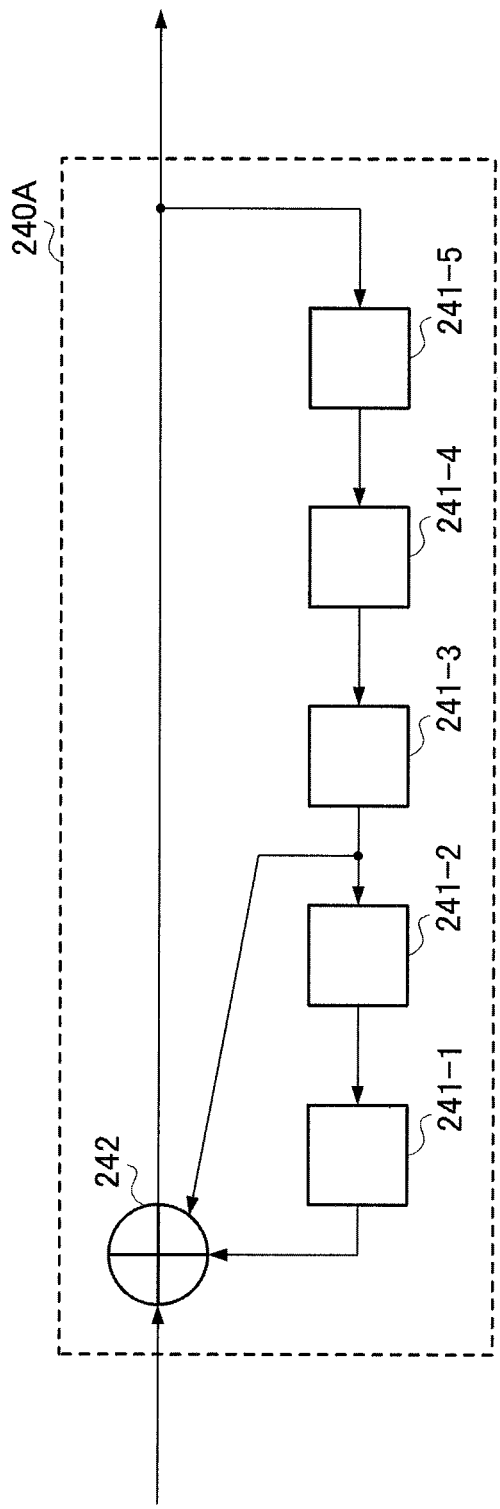
FIG. 18 is a block diagram showing another internal configuration of a second encoder according to Embodiment 1.

FIG. 18 shows a configuration of a second encoder that performs encoding using partial parity check matrix for parity bits 120A in FIG. 17. Second encoder 240A in FIG. 18 comprises shift registers 241-1 through 241-5 and modulo 2 adder 242 in the same way as second encoder 240 in FIG. 11, but differs from second encoder 240 in that the output of shift register 241-3 is output to modulo 2 adder 242.

As in the case of second encoder 240 in FIG. 11, second encoder 240A in FIG. 18 is also configured as a differential encoder, and therefore a value stored in each shift register is output to a communication channel at a point in time prior thereto. Consequently, the state of a shift register can be decided uniquely on the decoding side by using a received codeword, and therefore second encoder 240A termination processing is unnecessary, and it is only necessary to perform termination processing for first encoder 230, as described above, as LDPC-CC encoder 200 termination processing.

Figure 19:
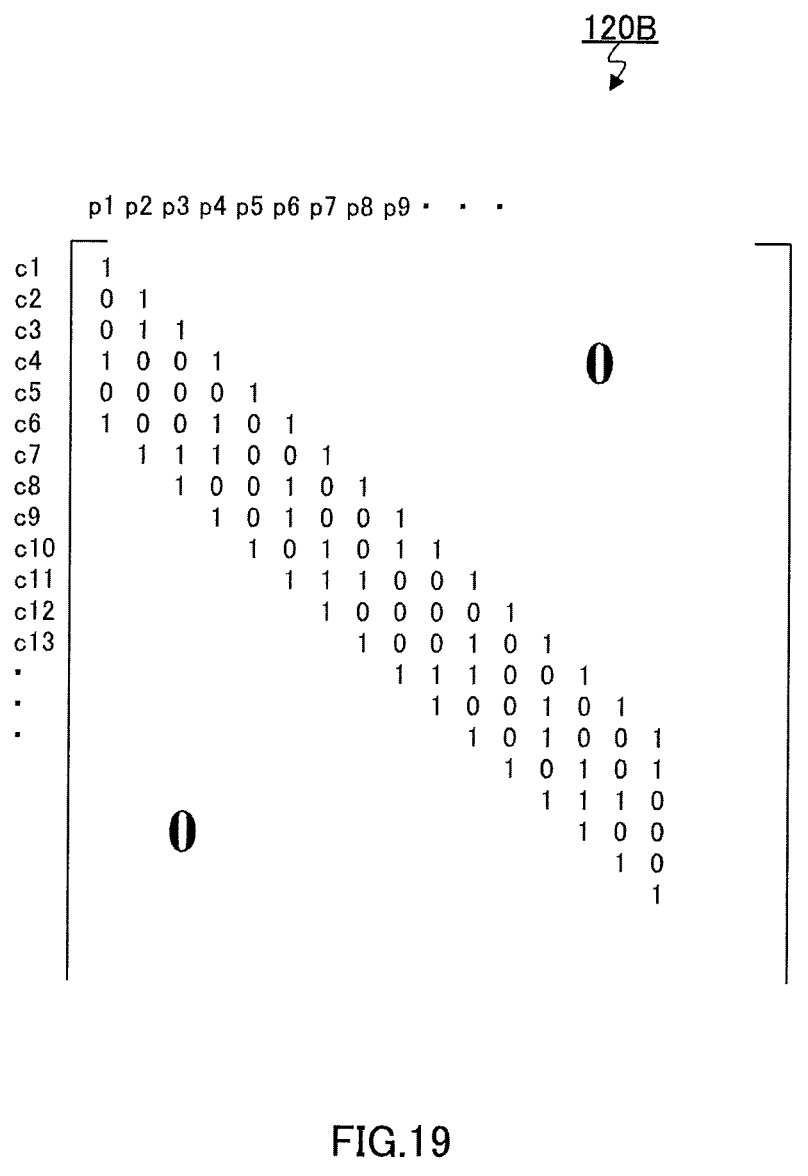

In the above description, a case has been described by way of example in which a partial parity check matrix for parity bits is time-invariant, but a partial parity check matrix for parity bits may also be time-variant. FIG. 19 shows an example of a case in which a partial parity check matrix for parity bits is time-variant. Partial parity check matrix for parity bits 120B in FIG. 19 has a different 1/0 arrangement pattern for each column.

Figure 20:
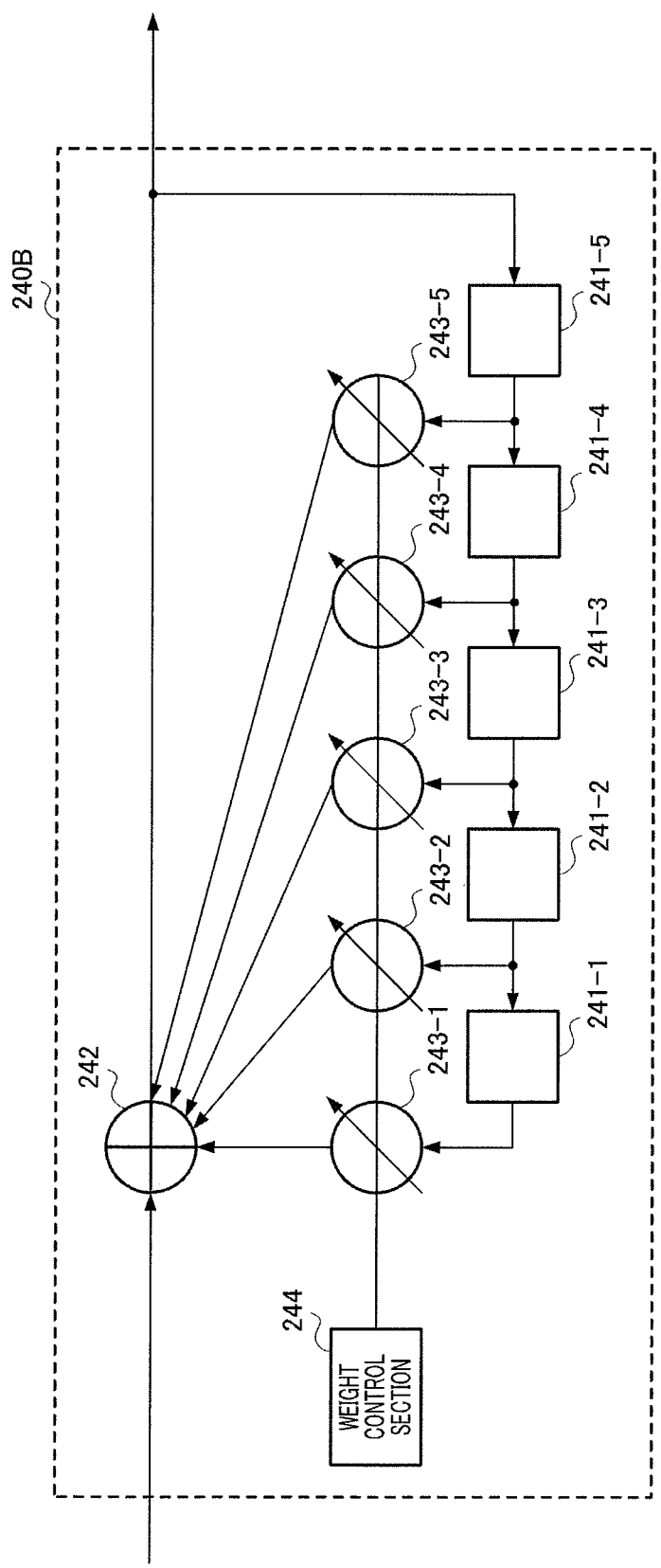
FIG. 20 is a block diagram showing another internal configuration of a second encoder according to Embodiment 1.

FIG. 20 shows a configuration of a second encoder that performs encoding using partial parity check matrix for parity bits 120B in FIG. 19. Second encoder 240B shown in FIG. 20 comprises shift registers 241-1 through 241-5, modulo 2 adder 242, weight multipliers 243-1 through 243-5, and weight control section 244.

Weight control section 244 outputs a weight pattern to weight multipliers 243-1 through 243-5 according to a row-direction 1/0 sequence of partial parity check matrix for parity bits 120B.

Weight multipliers 243-1 through 243-5 multiply shift register outputs by weights in accordance with a weight pattern output from weight control section 244.

As in the case of second encoder 240 in FIG. 11, second encoder 240B in FIG. 20 is also configured as a differential encoder, and therefore a value stored in each shift register is output to a communication channel at a point in time prior thereto. Consequently, the state of a shift register can be decided uniquely on the decoding side by using a received codeword, and therefore second encoder 240B termination processing is unnecessary, and it is only necessary to perform termination processing for first encoder 230, as described above, as LDPC-CC encoder 200 termination processing.

Figure 21:
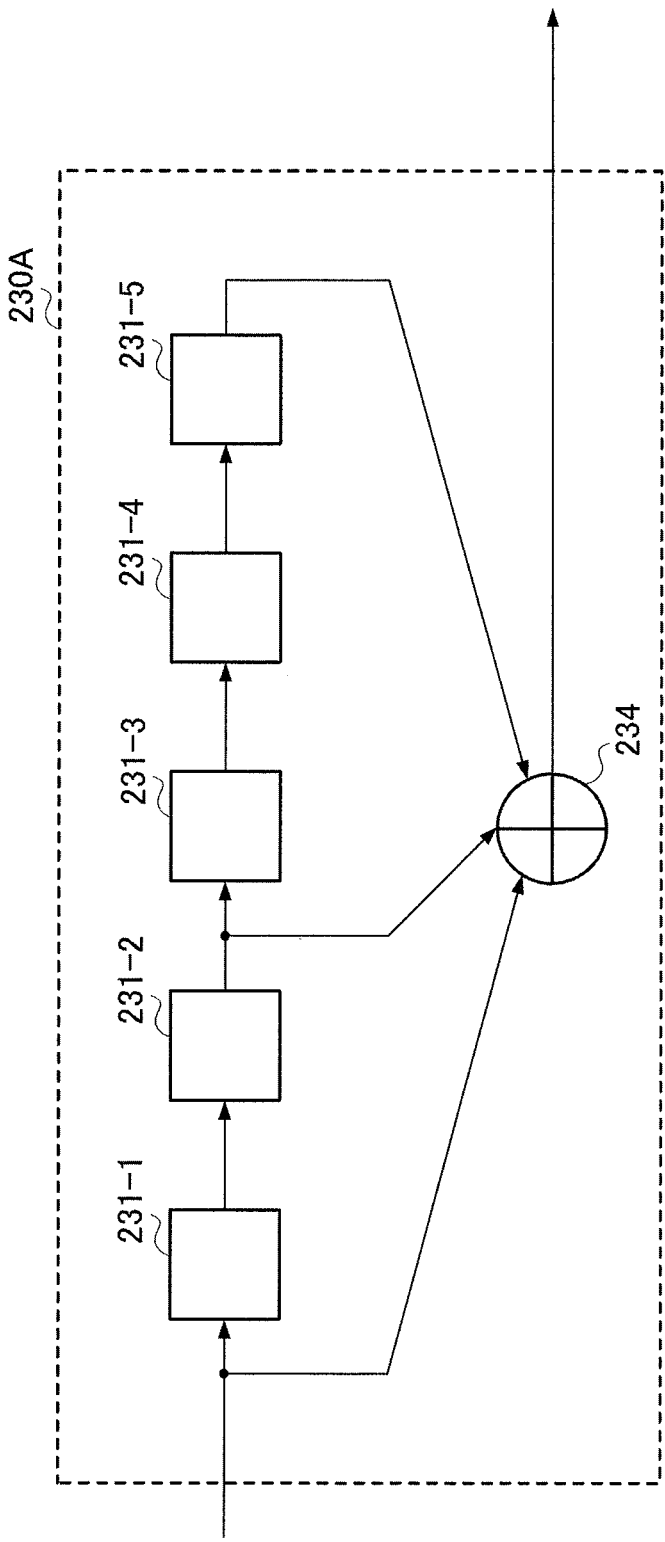
FIG. 21 is a block diagram showing another internal configuration of a first encoder according to Embodiment 1.

In the above description, a case has been described by way of example in which an information-bit-section partial parity check matrix is time-variant, but an information-bit-section partial parity check matrix may also be time-invariant. FIG. 21 shows a sample configuration of a first encoder when an information-bit-section partial parity check matrix is time-invariant. First encoder 230A in FIG. 21 comprises shift registers 231-1 through 231-5 and modulo 2 adder 234. As in the case of time-variant first encoder 230, it is only necessary to input a zero sequence of 5 bits ((M1×b) bits)—the same number as the number of shift registers in first encoder 230A—as a termination sequence for first encoder 230A termination processing.

Time-variant/time-invariant combinations are not limited to the above combinations, and other combinations may also be used. If a first encoder is configured as a non-recursive convolutional encoder, in the case of a different combination, also, second encoder termination processing is unnecessary, and it is only necessary to input a zero sequence comprising the same number of bits as the number of shift registers in the first encoder as LDPC-CC encoder 200 termination processing, enabling the effects of the present invention to be obtained.

Thus, according to this embodiment, there are provided first encoder 230 that generates a first codeword sequence by performing encoding on an input sequence based on partial parity check matrix for information bits 110 obtained by extracting columns corresponding to information bits of parity check matrix 100, and second encoder 240 that generates a second codeword sequence by performing encoding on the first codeword sequence based on partial parity check matrix for parity bits 120 obtained by extracting columns corresponding to parity bits of parity check matrix 100; and LDPC-CC encoding is executed by connecting first encoder 230 that performs encoding based on partial parity check matrix for information bits 110 and second encoder 240 that performs encoding based on partial parity check matrix for parity bits 120, and executing encoding.

Since encoding based on partial parity check matrix for parity bits 120 can be implemented using a differential encoder, termination processing for second encoder 240 is unnecessary, and termination sequence generation section 210 need only provide a termination sequence for first encoder 230 as a LDPC-CC encoder 200 termination sequence, enabling the amount of overhead to be reduced.

Also, if first encoder 230 is a non-recursive convolutional encoder, termination sequence generation section 210 need only provide a zero sequence as a termination sequence, enabling termination sequence generation section 210 to be implemented by means of an extremely simple configuration, and an increase in the circuit scale of LDPC-CC encoder 200 to be suppressed.

Furthermore, if first encoder 230 is a non-recursive convolutional encoder, a termination sequence can be made a zero sequence and can be known in advance on the decoding side, enabling overhead to be further reduced by not transmitting a termination sequence in a transmission channel, thereby enabling transmission channel utilization efficiency to be improved.

Embodiment 2

In Embodiment 1, a case was described in which a non-recursive convolutional encoder was used as a first encoder, but in this embodiment a description will be given of a configuration and termination method of an LDPC-CC encoder that uses a recursive convolutional encoder as a first encoder. Parts common to configuration elements described in above Embodiment 1 are assigned the same reference codes as in Embodiment 1, and descriptions thereof are omitted here.

FIG. 22 shows an example of a parity check matrix of an LDPC-CC according to this embodiment. Parity check matrix 300 in FIG. 22 represents a parity check matrix of an LDPC-CC (or convolutional code) for which the coding rate is ½ (=b/c) and memory length M=2.

In FIG. 22, parity check matrix 300 rows correspond to parity check equations c1, c2, . . . , and each column corresponds to a bit of a transmission codeword sequence. Here, a column to which index usx is attached (where x=1, 2, . . . ) corresponds to an information sequence bit, a column to which index upx is attached corresponds to a bit of a feedback sequence obtained by recursive convolutional encoding (hereinafter also referred to as a "feedback bit"), and a column to which index px is attached (where x=1, 2, . . . ) corresponds to a parity bit obtained by encoding.

FIG. 23 shows partial parity check matrix (hereinafter also referred to as "partial parity check matrix for information bits") 310 obtained by extracting columns corresponding to information bits of parity check matrix 300. Partial parity check matrix for information bits 310 in FIG. 23 includes columns corresponding to feedback bits as columns corresponding to information bits. FIG. 24 shows partial parity check matrix (hereinafter also referred to as a "partial parity check matrix for parity bits") 320 obtained by extracting columns corresponding to parity bits of parity check matrix 300.

As in Embodiment 1, an LDPC-CC encoder according to this embodiment is characterized by performing LDPC-CC encoding after analyzing parity check matrix 300 into partial parity check matrix for information bits 310 obtained by extracting columns corresponding to information bits and partial parity check matrix for parity bits 320 obtained by extracting columns corresponding to parity bits.

Figure 25:
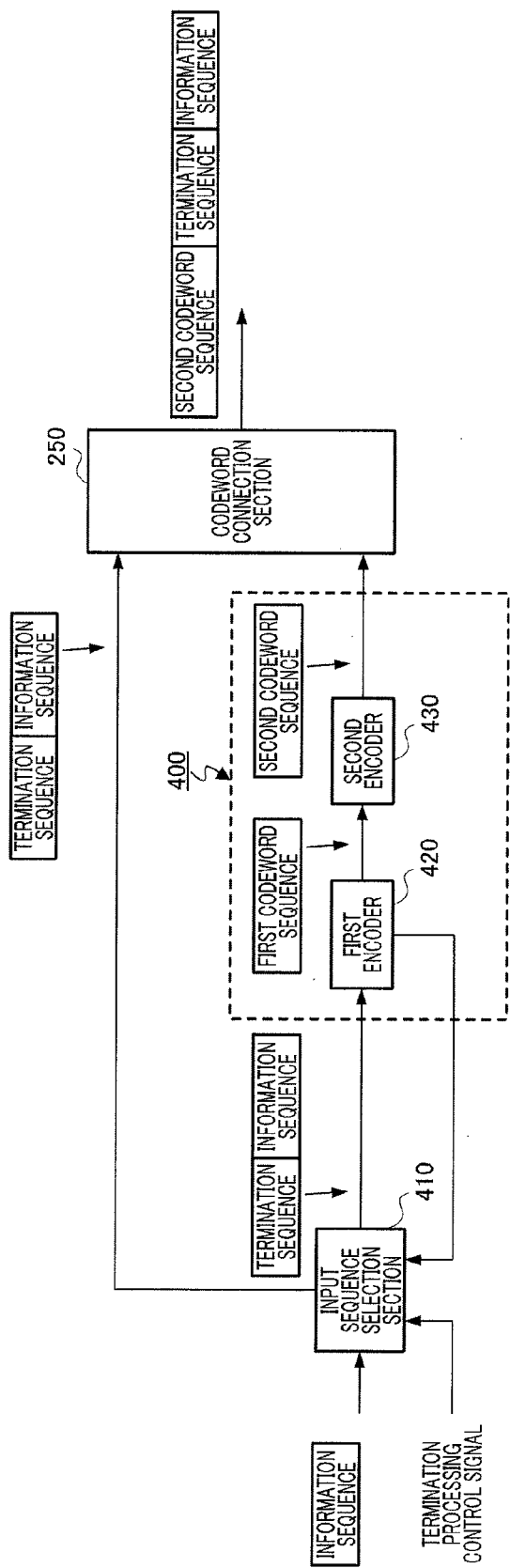
FIG. 25 is a block diagram showing a configuration of an LDPC-CC encoder according to Embodiment 2.

FIG. 25 shows an example of a configuration of an LDPC-CC encoder according to this embodiment. LDPC-CC encoder 400 in FIG. 25 comprises first encoder 420 and second encoder 430. FIG. 25 also shows input sequence selection section 410 and codeword connection section 250.

Input sequence selection section 410 selects a sequence output to first encoder 420 according to a termination processing control signal. A termination processing control signal is a signal directing the start of LDPC-CC encoder 400 termination processing, and when the termination processing control signal indicates a state prior to the start of termination processing, input sequence selection section 410 outputs an information sequence to first encoder 420 and codeword connection section 250. On the other hand, when the termination processing control signal indicates the start of termination processing, input sequence selection section 410 outputs a sequence output from first encoder 420 to first encoder 420 and codeword connection section 250 as a termination sequence.

(First Encoder)

First encoder 420 performs encoding on an input sequence based on partial parity check matrix for information bits 310.

Figure 26:
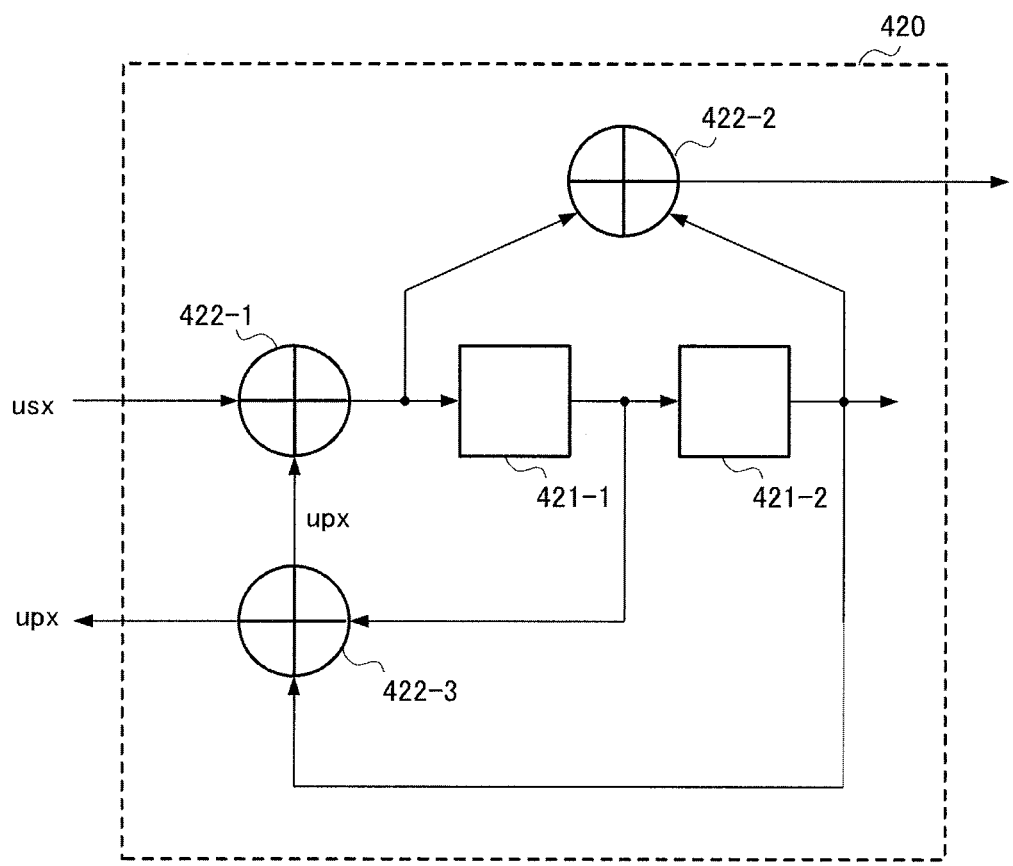
FIG. 26 is a block diagram showing an internal configuration of a first encoder according to Embodiment 2.

FIG. 26 shows the internal configuration of first encoder 420. First encoder 230 in FIG. 26 is a recursive convolutional encoder with two shift registers (M1=2), comprising shift registers 421-1 and 421-2 and modulo 2 adders 422-1 through 422-3.

Modulo 2 adder 422-1 performs modulo 2 addition of a bit input from first encoder 420 and a bit output from modulo 2 adder 422-3.

Modulo 2 adder 422-2 performs modulo 2 addition of modulo 2 adder 422-1 output and shift register 421-2 output.

Modulo 2 adder 422-3 performs modulo 2 addition of shift register 421-1 output and shift register 421-2 output.

First encoder 420 outputs modulo 2 adder 422-2 output to second encoder 430 as first codeword sequence codeword bit $v_{c1,t}$, and outputs modulo 2 adder 422-3 output to input sequence selection section 410.

(Second Encoder)

Second encoder 430 performs encoding based on partial parity check matrix for parity bits 320.

Figure 27:
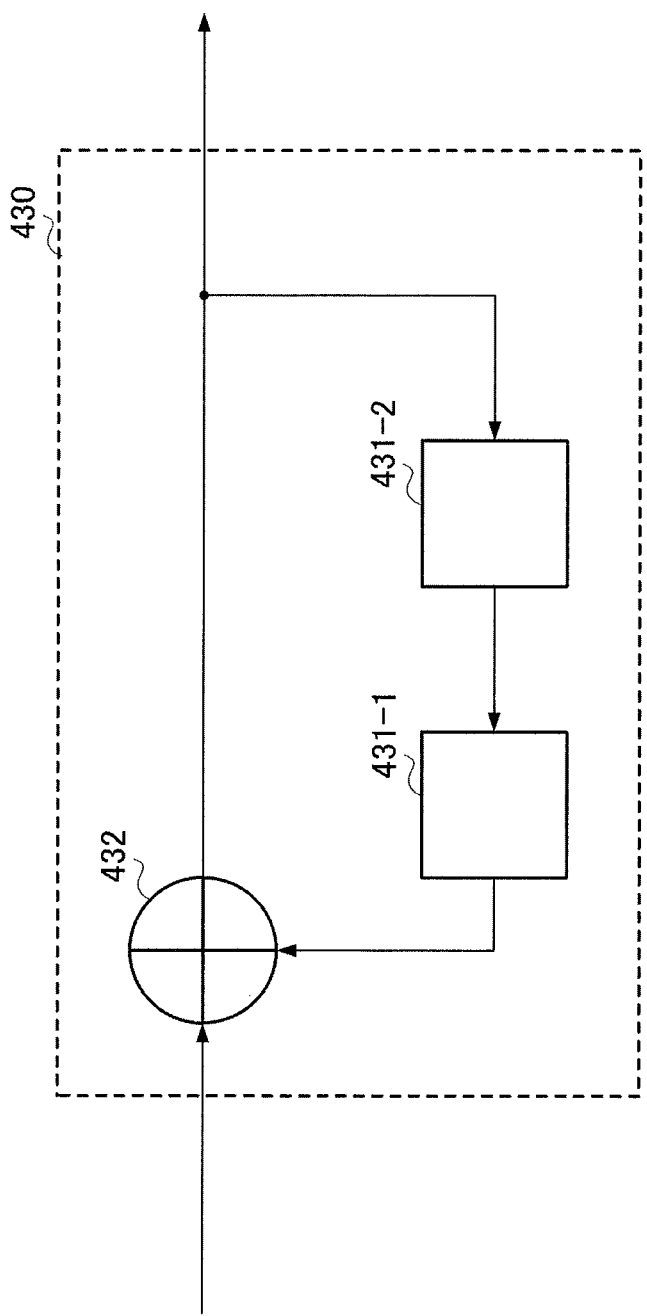
FIG. 27 is a block diagram showing an internal configuration of a second encoder according to Embodiment 2.

FIG. 27 shows the internal configuration of second encoder 430. Second encoder 430 in FIG. 27 is a differential encoder (also called a "recursive convolutional encoder" or "accumulator") with two shift registers (M2=2), comprising shift registers 431-1 and 431-2 and modulo 2 adder 432.

Modulo 2 adder 432 performs modulo 2 addition of first codeword sequence codeword bit $v_{c1,t}$ output from first encoder 420 and shift register 431-1 output, outputs the result to shift register 431-2, and also outputs the result to codeword connection section 250 as second codeword sequence codeword bit $v_{c2,t}$.

Codeword connection section 250 connects an information sequence or termination sequence to a second codeword sequence output from second encoder 430, and outputs the resulting connected sequence as a transmission codeword sequence.

Termination processing of LDPC-CC encoder 400 configured as described above will now be explained.

(Termination Processing)

As in the case of LDPC-CC encoder 200 described in Embodiment 1, second encoder 430 of LDPC-CC encoder 400 is also configured as a differential encoder. As described above, a value stored in each shift register of a differential encoder is output to a communication channel at a point in time prior thereto. Consequently, the state of a shift register can be decided uniquely on the decoding side by using a received codeword, and therefore second encoder 430 termination processing is unnecessary, and it is only necessary to perform termination processing for first encoder 420, in the same way as in Embodiment 1, as LDPC-CC encoder 400 termination processing.

First encoder 420 termination processing will now be described.

As stated above, in first encoder 420, a result of modulo 2 addition of first encoder 420 input and modulo 2 adder 422-3 output is output to shift registers 421-1 and 421-2. Consequently, although it is difficult to set shift registers 421-1 and 421-2 to a zero state simply by inputting a zero sequence to first encoder 420, since first encoder 420 is a recursive convolutional encoder, first encoder 420 can be terminated by making modulo 2 adder 422-3 output first encoder 420 input.

Thus, input sequence selection section 410 outputs an information sequence to first encoder 420 when the termination processing control signal indicates a state prior to the start of termination processing and information sequence encoding is performed, and outputs the output of first encoder 420 modulo 2 adder 422-3 output from first encoder 420 to first encoder 420 when the termination processing control signal indicates the start of termination processing.

Thus, when first encoder 420 is a recursive convolutional encoder, a modulo 2 addition result of first encoder 420 modulo 2 adder 422-3 can be provided to first encoder 420 as a termination sequence, and separate generation of a termination sequence is unnecessary. Consequently, the provision of a termination processing generation section is unnecessary, and an increase in the circuit scale can be suppressed correspondingly.

Also, at (M1×c) bits, the length of a termination sequence necessary for termination processing can be made shorter than in the case of an above-described conventional LDPC-CC encoder requiring (K+M+1)×c bits, enabling information transmission overhead to be reduced.

In the above description, a case has been described by way of example in which first encoder 420 of LDPC-CC encoder 400 is a time-invariant recursive convolutional encoder, but this is not a limitation, and the first encoder may also be a time-variant recursive convolutional encoder.

Figure 28:
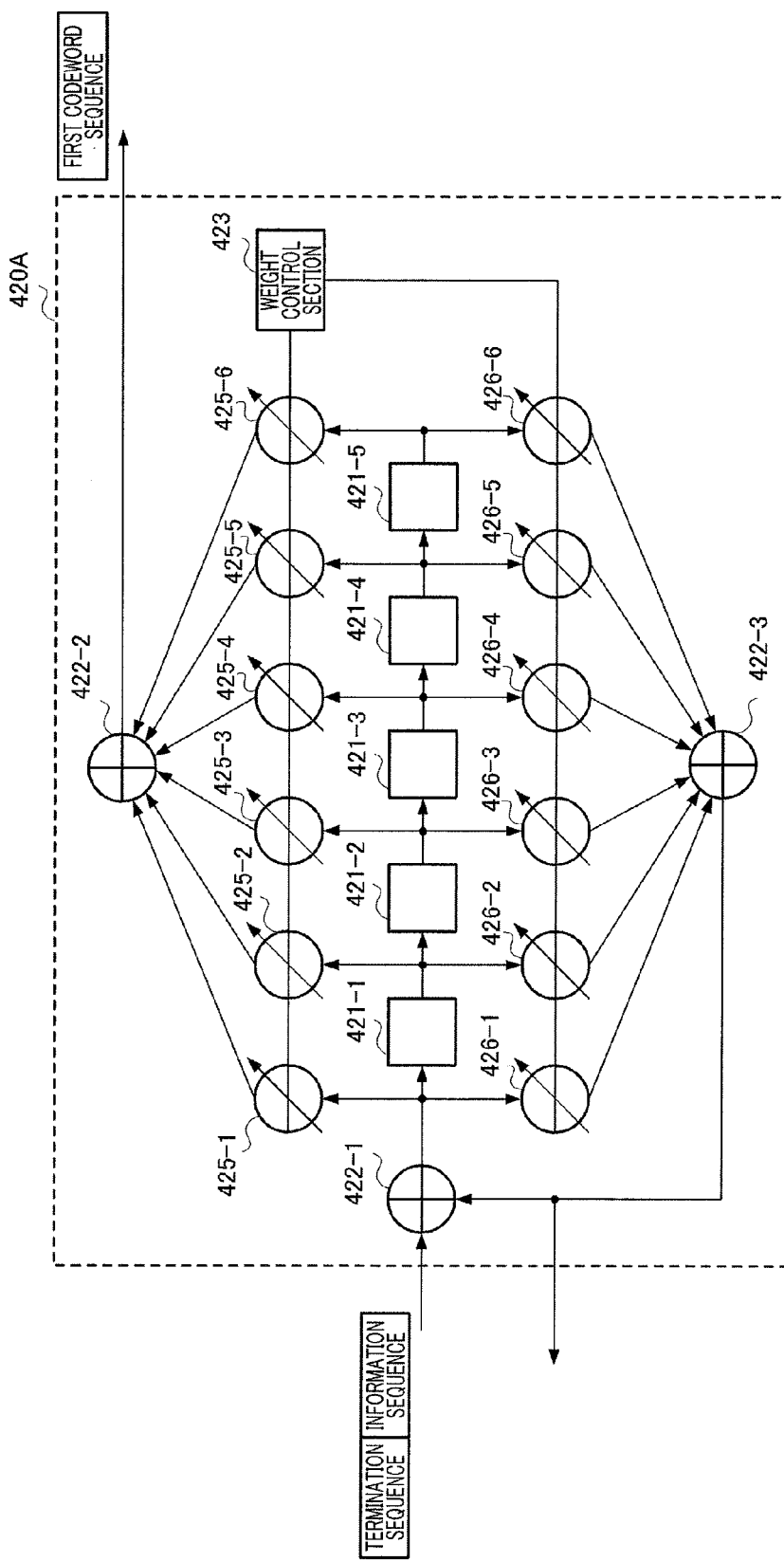
FIG. 28 is a block diagram showing another internal configuration of a first encoder according to Embodiment 2.

FIG. 28 shows a sample configuration of a first encoder in the case of a time-variant recursive convolutional encoder. Since first encoder 420A in FIG. 28 is a recursive convolutional encoder, as in the case of first encoder 420, a modulo 2 addition result of first encoder 420A modulo 2 adder 422-3 can be provided to first encoder 420A as a termination sequence, and separate generation of a termination sequence is unnecessary. Consequently, the provision of a termination processing generation section is unnecessary, and an increase in the circuit scale can be suppressed correspondingly.

In the above description, a case has been described by way of example in which second encoder 430 of LDPC-CC encoder 400 employs a time-invariant differential encoder configuration, but this is not a limitation, and an encoder may also be used that performs encoding based on a time-variant partial parity check matrix for parity bits in which the number of is in each row is two or more, and the 1/0 sequence differs for each row, as described in Embodiment 1.

Embodiment 3

In this embodiment a description will be given of a configuration and termination method of an LDPC-CC encoder that performs non-systematic LDPC-CC encoding in which an information sequence is not included in a transmission codeword sequence.

Figure 29:
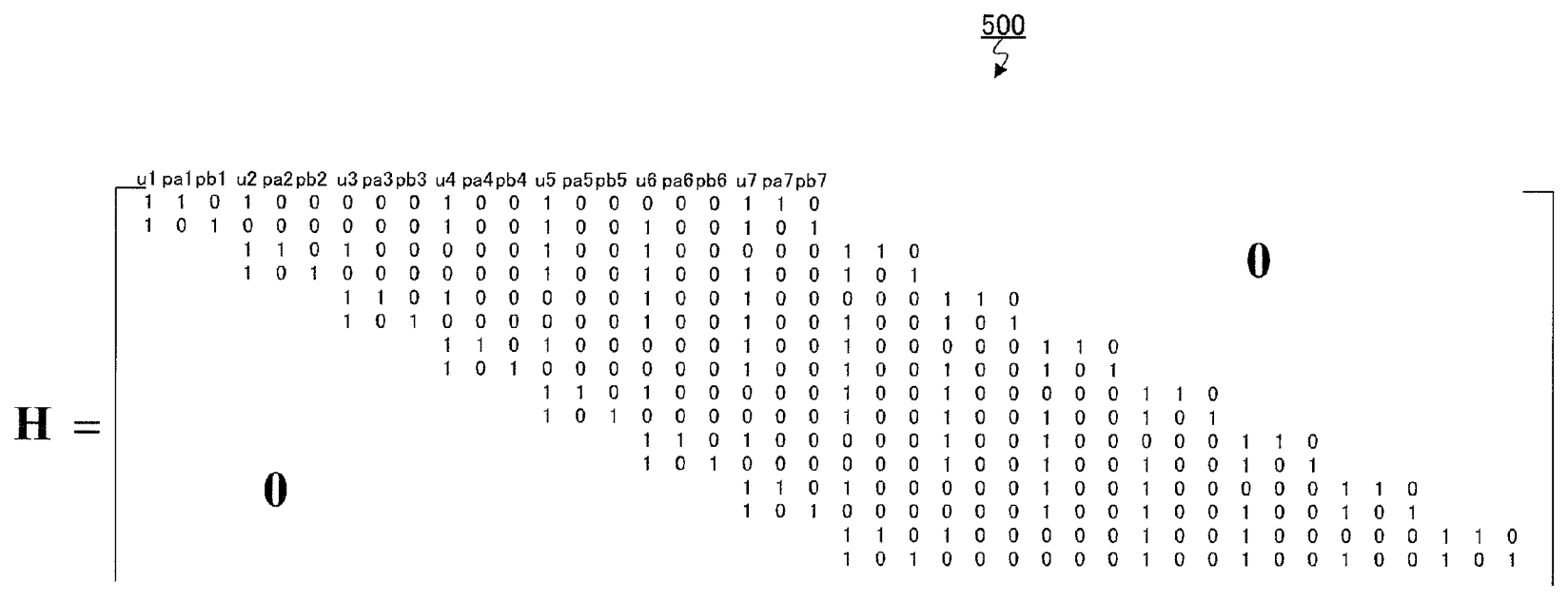

FIG. 29 shows an example of a parity check matrix of an LDPC-CC according to this embodiment. Parity check matrix 500 in FIG. 29 is a parity check matrix of a non-systematic convolutional code with a coding rate of ½.

Figure 31:
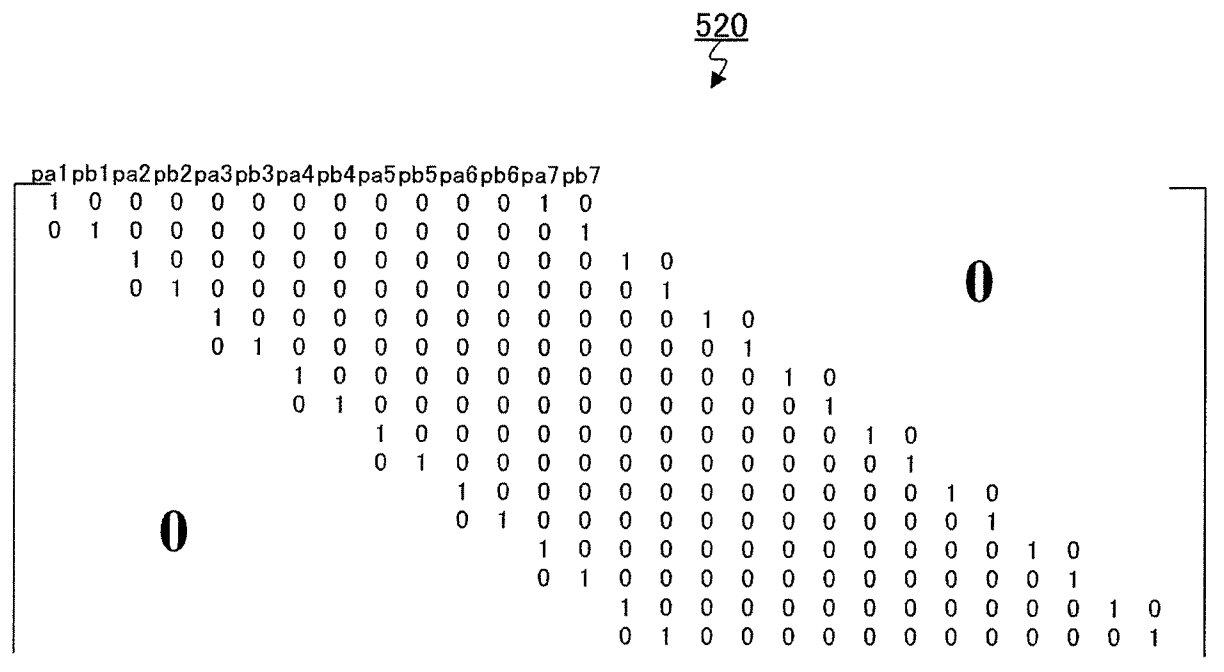

FIG. 30 shows partial parity check matrix (hereinafter also referred to as "partial parity check matrix for information bits") 510 obtained by extracting columns corresponding to information bits of parity check matrix 500, and FIG. 31 shows partial parity check matrix (hereinafter also referred to as a "partial parity check matrix for parity bits") 520 obtained by extracting columns corresponding to parity bits of parity check matrix 500.

As in Embodiment 1 and Embodiment 2, an LDPC-CC encoder according to this embodiment is characterized by performing LDPC-CC encoding after analyzing parity check matrix 500 into partial parity check matrix for information bits 510 obtained by extracting columns corresponding to information bits and partial parity check matrix for parity bits 520 obtained by extracting columns corresponding to parity bits.

Figure 32:
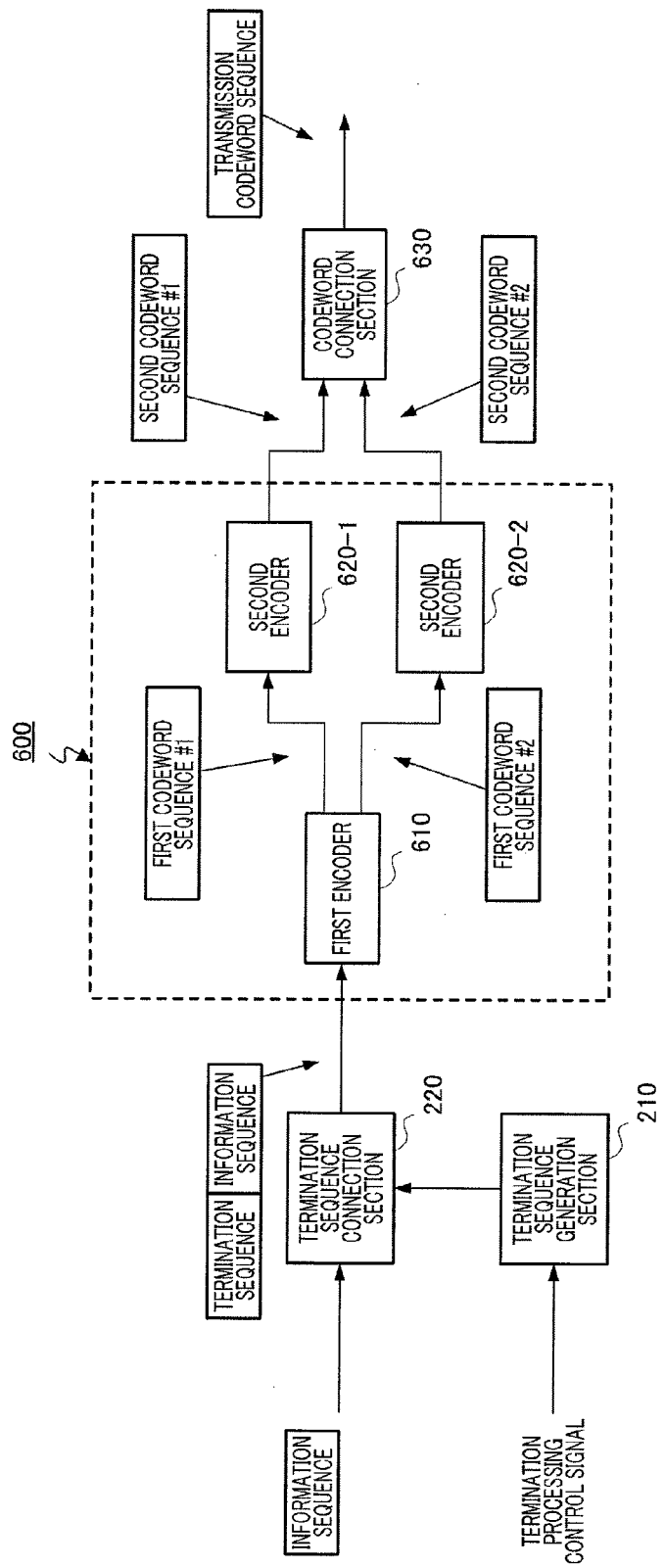
FIG. 32 is a block diagram showing a configuration of an LDPC-CC encoder according to Embodiment 3.

FIG. 32 shows an example of a configuration of an LDPC-CC encoder according to this embodiment. LDPC-CC encoder 600 in FIG. 32 comprises first encoder 610 and second encoders 620-1 and 620-2. FIG. 32 also shows termination sequence generation section 210, termination sequence connection section 220, and codeword connection section 630. Parts common to configuration elements described in above Embodiment 1 are assigned the same reference codes as in Embodiment 1, and descriptions thereof are omitted here.

(First Encoder)

First encoder 610 is a coding-rate-½ non-systematic convolutional encoder with six shift registers (M1=6) that performs encoding on an input sequence based on partial parity check matrix for information bits 510 obtained by extracting columns corresponding to information bits of parity check matrix 500.

Figure 33:
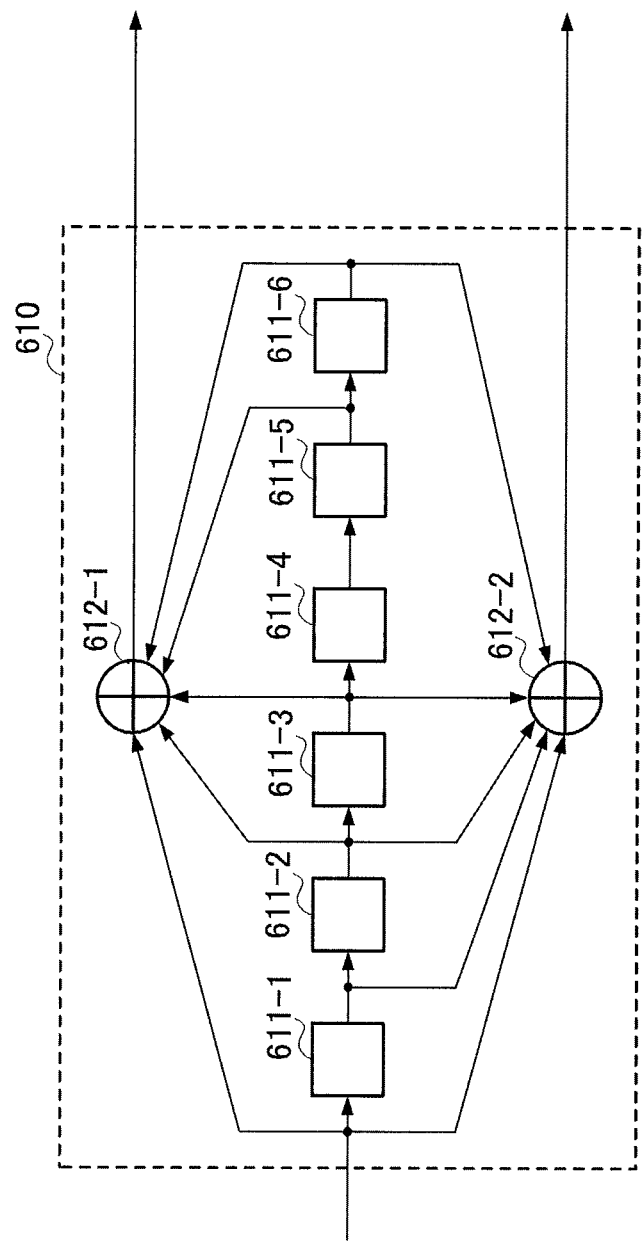
FIG. 33 is a block diagram showing an internal configuration of a first encoder according to Embodiment 3.

FIG. 33 shows the internal configuration of first encoder 610. First encoder 610 in FIG. 33 comprises shift registers 611-1 through 611-6 and modulo 2 adders 612-1 and 612-2.

Modulo 2 adder 612-1 performs modulo 2 addition of a bit input to first encoder 610, shift register 611-2 output, shift register 611-3 output, shift register 611-5 output, and shift register 611-6 output, and outputs the modulo 2 addition result to second encoder 620-1 as a first codeword sequence #1 codeword bit.

Modulo 2 adder 612-2 performs modulo 2 addition of a bit input to first encoder 610, shift register 611-1 output, shift register 611-2 output, shift register 611-3 output, and shift register 611-6 output, and outputs the modulo 2 addition result to second encoder 620-1 as a first codeword sequence #2 codeword bit.

(Second Encoders)

Figure 34:
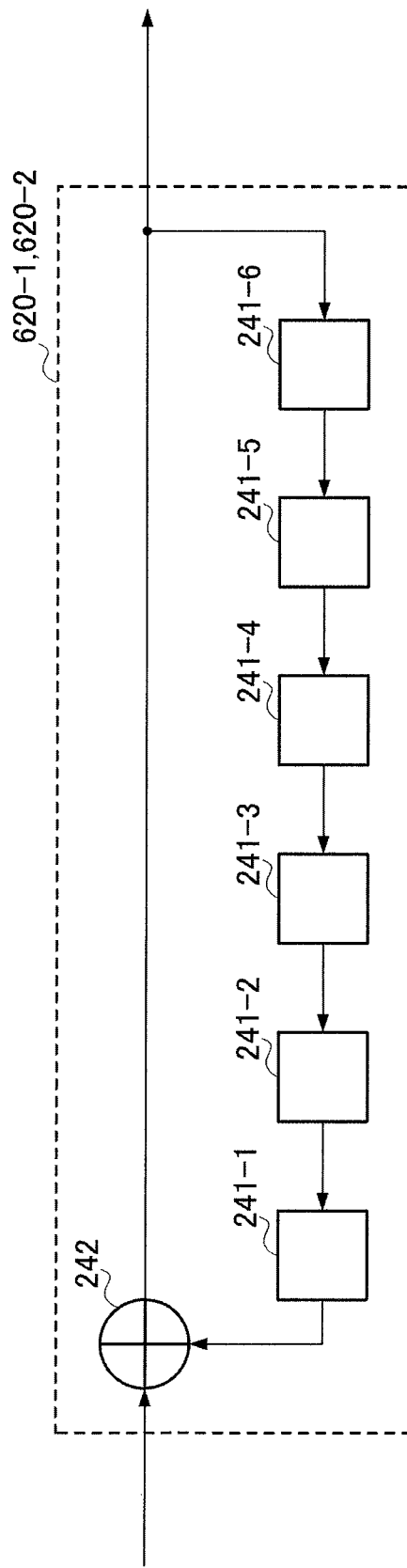
FIG. 34 is a block diagram showing an internal configuration of a second encoder according to Embodiment 3.

FIG. 34 shows the internal configuration of second encoders 620-1 and 620-2. Second encoders 620-1 and 620-2 employ a configuration in which shift register 241-6 has been added to second encoder 240 shown in FIG. 11.

Second encoder 620-1 has first codeword sequence #1 output from first encoder 610 as input, performs encoding on first codeword sequence #1 based on parity check equations of odd-numbered rows of partial parity check matrix for parity bits 520, and outputs a sequence after encoding to codeword connection section 630 as second codeword sequence #1. A second codeword sequence #1 codeword bit is obtained by modulo 2 addition of a codeword bit of first codeword sequence #1 of that point in time and a codeword bit of past second codeword sequence #1 stored in shift register 241-1.

Second encoder 620-2 has first codeword sequence #2 output from first encoder 610 as input, performs encoding based on parity check equations of even-numbered rows of partial parity check matrix for parity bits 520, and outputs a sequence after encoding to codeword connection section 630 as second codeword sequence #2. A second codeword sequence #2 codeword bit is obtained by modulo 2 addition of a codeword bit of first codeword sequence #2 of that point in time and a codeword bit of past second codeword sequence #2 stored in shift register 241-1.

Codeword connection section 630 connects second codeword sequence #1 output from second encoder 620-1 to second codeword sequence #2 output from second encoder 620-2, and outputs the resulting connected sequence as a transmission codeword sequence.

Termination processing of LDPC-CC encoder 600 configured as described above will now be explained.

(Termination Processing)

Since second encoders 620-1 and 620-2 in LDPC-CC encoder 600 employ differential encoder configurations, they do not require termination processing, as already explained in Embodiment 1 and Embodiment 2. Consequently, it is only necessary to perform termination processing for first encoder 610 as LDPC-CC encoder 600 termination processing.

Since first encoder 610 is a non-recursive convolutional encoder with six shift registers (M1=6), termination processing can be completed by inputting an M1-bit zero sequence as a termination sequence in order to make the states of the M1 shift registers all-zeros. M1 is the memory length of a first encoder.

From this, it follows that, when a termination processing control signal indicating the start of termination processing is input, termination sequence generation section 210 need only provide an M1-bit zero sequence to termination sequence connection section 220 as a termination sequence. As in Embodiment 1, when coding rate R=b/c, an (M1×b)-bit zero sequence should be used as a termination sequence.

Termination sequence connection section 220 connects a termination sequence to the end of an information sequence, and outputs the resulting connected sequence to first encoder 610.

Figure 35:
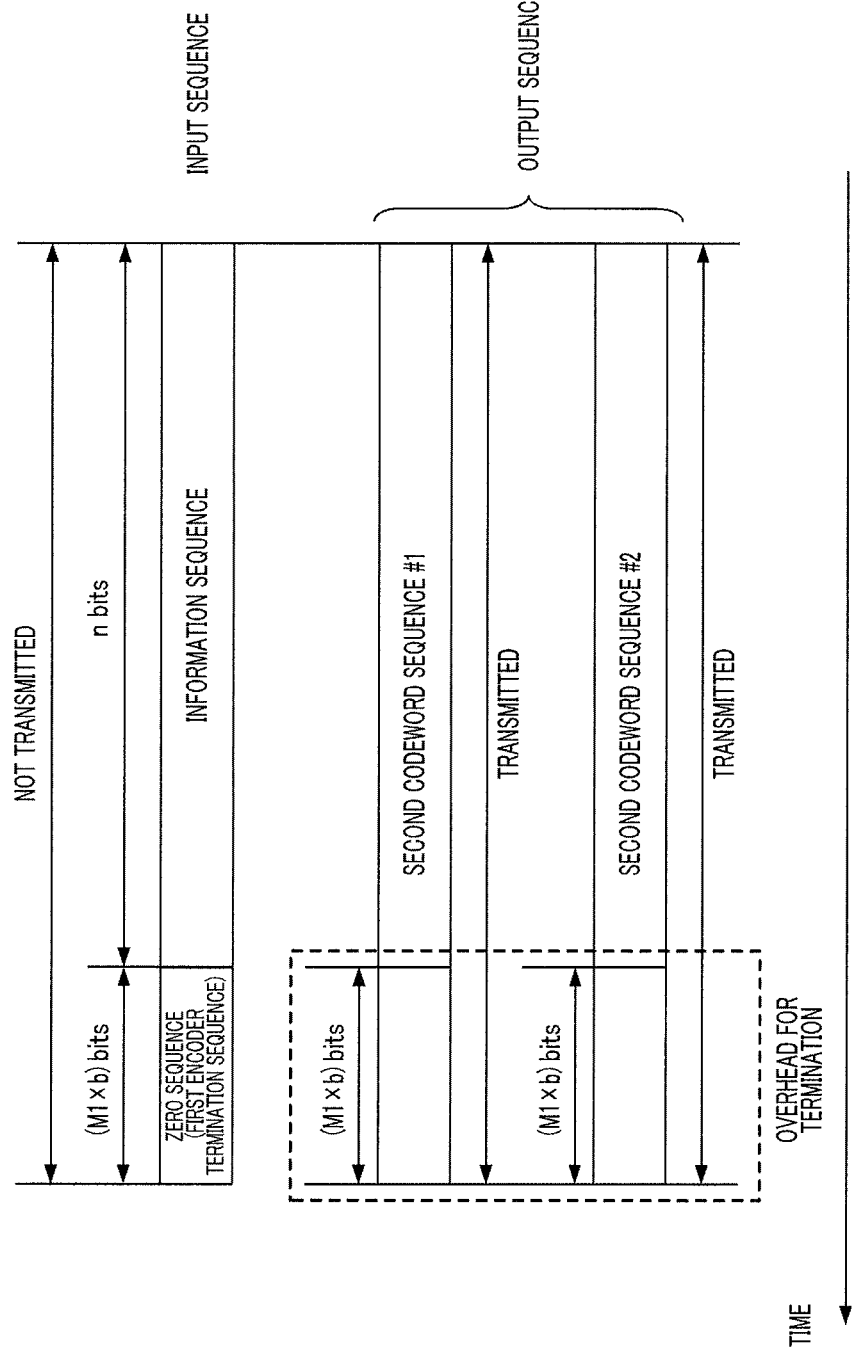
FIG. 35 is a drawing showing an input sequence and output sequences of an LDPC-CC encoder according to Embodiment 3.

FIG. 35 shows an input sequence and output sequences of LDPC-CC encoder 600. FIG. 35A shows a first encoder 610 information sequence, and FIG. 35B shows second encoder 620-1 and 620-2 output sequences.

As shown in FIG. 35, a first encoder 610 input sequence comprises an information sequence of n bits and a termination sequence of (M1×b) bits.

With LDPC-CC encoder 600 according to this embodiment, a termination sequence can be a zero sequence of a number of bits equal to a number obtained by multiplying first encoder 610 memory length M1 by b, and therefore a termination sequence need not be found by solving equation 5, and does not depend on a weight pattern when termination processing is started. Consequently, there is no need for insertion of a K-bit padding sequence (where K=0 to M) as required in the case of LDPC-CC encoder 20. As a result, when LDPC-CC encoder 600 is used, information transmission overhead due to termination processing is (M1×c) bits.

Thus, with LDPC-CC encoder 600 according to this embodiment, first encoder 610 that performs encoding based on partial parity check matrix for information bits 510 obtained by extracting columns corresponding to information bits of parity check matrix 500, and second encoders 620-1 and 620-2 that perform encoding based on partial parity check matrix for parity bits 520 obtained by extracting columns corresponding to parity bits of parity check matrix 500, are connected, and LDPC-CC encoding is performed based on parity check matrix 500.

As described above, second encoders 620-1 and 620-2 that perform encoding based on partial parity check matrix for parity bits 520 of parity check matrix 500 are configured as differential encoders. Consequently, as in the case of Embodiment 1 and Embodiment 2, termination processing for second encoders 620-1 and 620-2 is unnecessary.

Therefore, by configuring LDPC-CC encoder 600 as described above, LDPC-CC encoder 600 termination processing can be implemented by performing encoding after connecting a 0-sequence comprising the same number of bits as number of shift registers M1 of first encoder 610—that is, a number of bits equal to the memory length of first encoder 610—to the end of an information sequence.

Since termination sequence generation section 210 need only provide a termination sequence comprising the same number of 0 s as number of shift registers M1, termination sequence generation section 210 can be configured on a much smaller scale than termination sequence generation circuitry in an above-described conventional LDPC-CC encoder.

Also, whereas with an above-described conventional LDPC-CC encoder configuration, encoder termination processing cannot be performed simply by inputting a 0-sequence comprising the same number of bits as the number of LDPC-CC encoder shift registers to the encoder, with this embodiment termination processing can be performed simply by inputting a 0-sequence comprising the same number of bits as the number of shift registers in first encoder 610 to LDPC-CC encoder 600. Whereas overhead when using above-described conventional LDPC-CC encoder 20 is (K+M+1)×c, information transmission overhead due to LDPC-CC encoder 600 termination processing is (M1×c) bits, and since M1×c≦(K+M+1)×c, information transmission overhead due to termination processing can be reduced with LDPC-CC encoder 600 according to this embodiment as compared with a case in which above-described conventional LDPC-CC encoder 20 is used.

Figure 36:
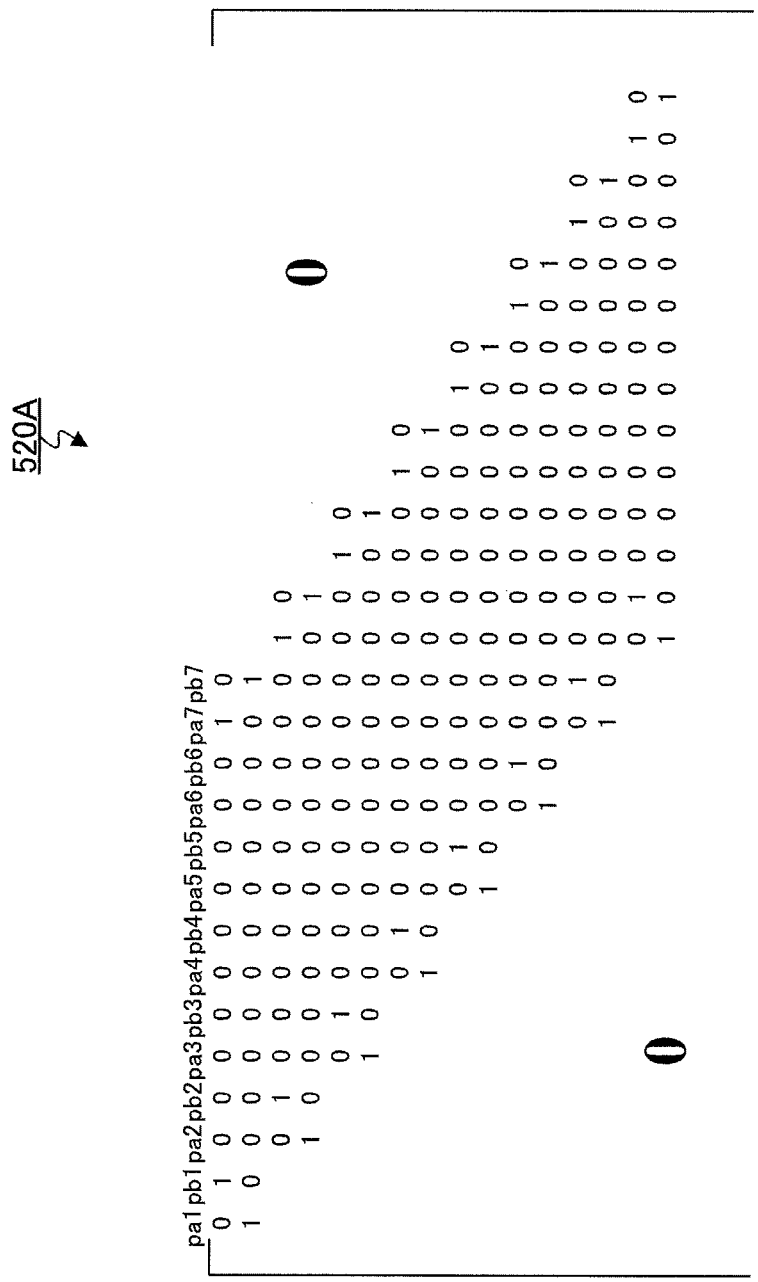
FIG. 36 is a drawing showing another example of a partial parity check matrix for parity bits according to Embodiment 3.

In the above description, a case has been described in which second encoders 620-1 and 620-2 perform encoding based on partial parity check matrix for parity bits 520, but this is not a limitation, and, for example, provision may also be made for encoding to be performed based on partial parity check matrix for parity bits 520A such as shown in FIG. 36.

Figure 37:
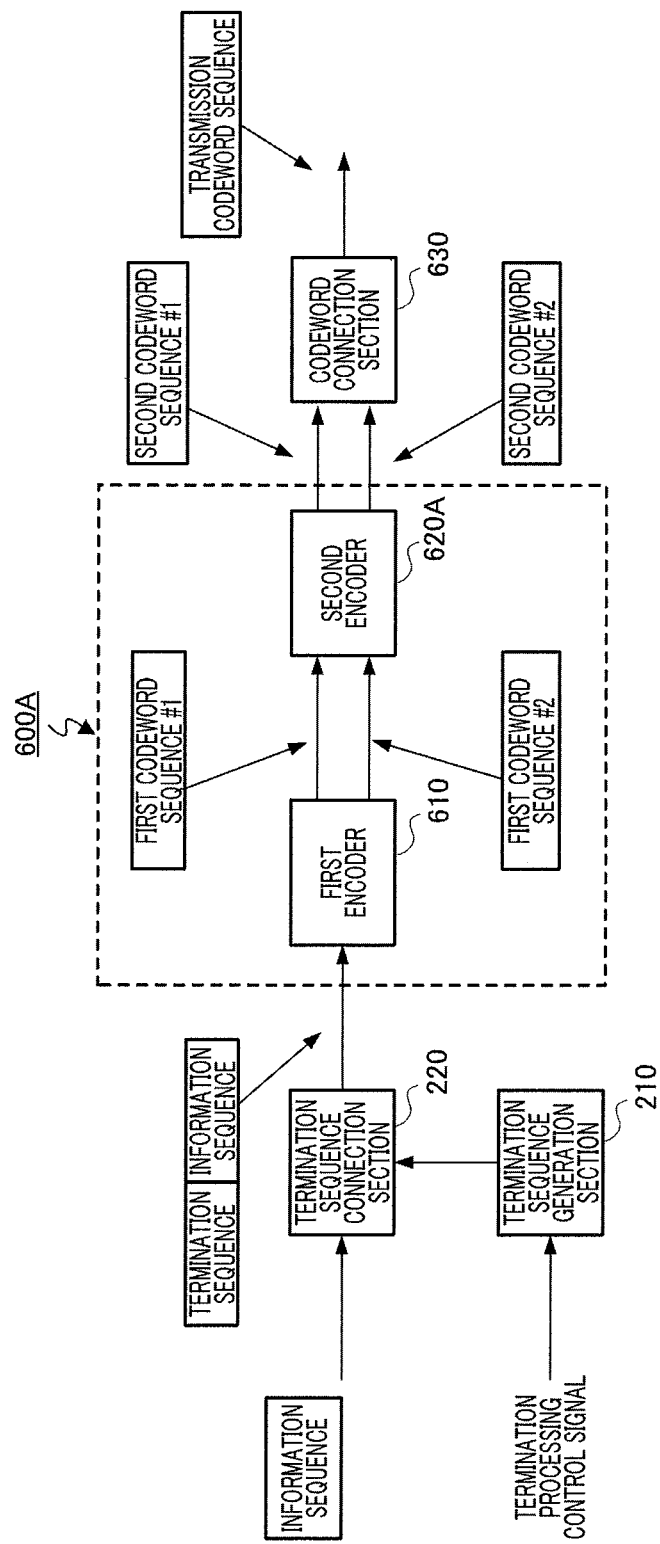
FIG. 37 is a block diagram showing another configuration of an LDPC-CC encoder according to Embodiment 3.

FIG. 37 shows LDPC-CC encoder 600A used in this case.

LDPC-CC encoder 600A comprises first encoder 610 and second encoder 620A. FIG. 37 also shows termination sequence connection section 220, termination sequence generation section 210, and codeword connection section 630.

Figure 38:
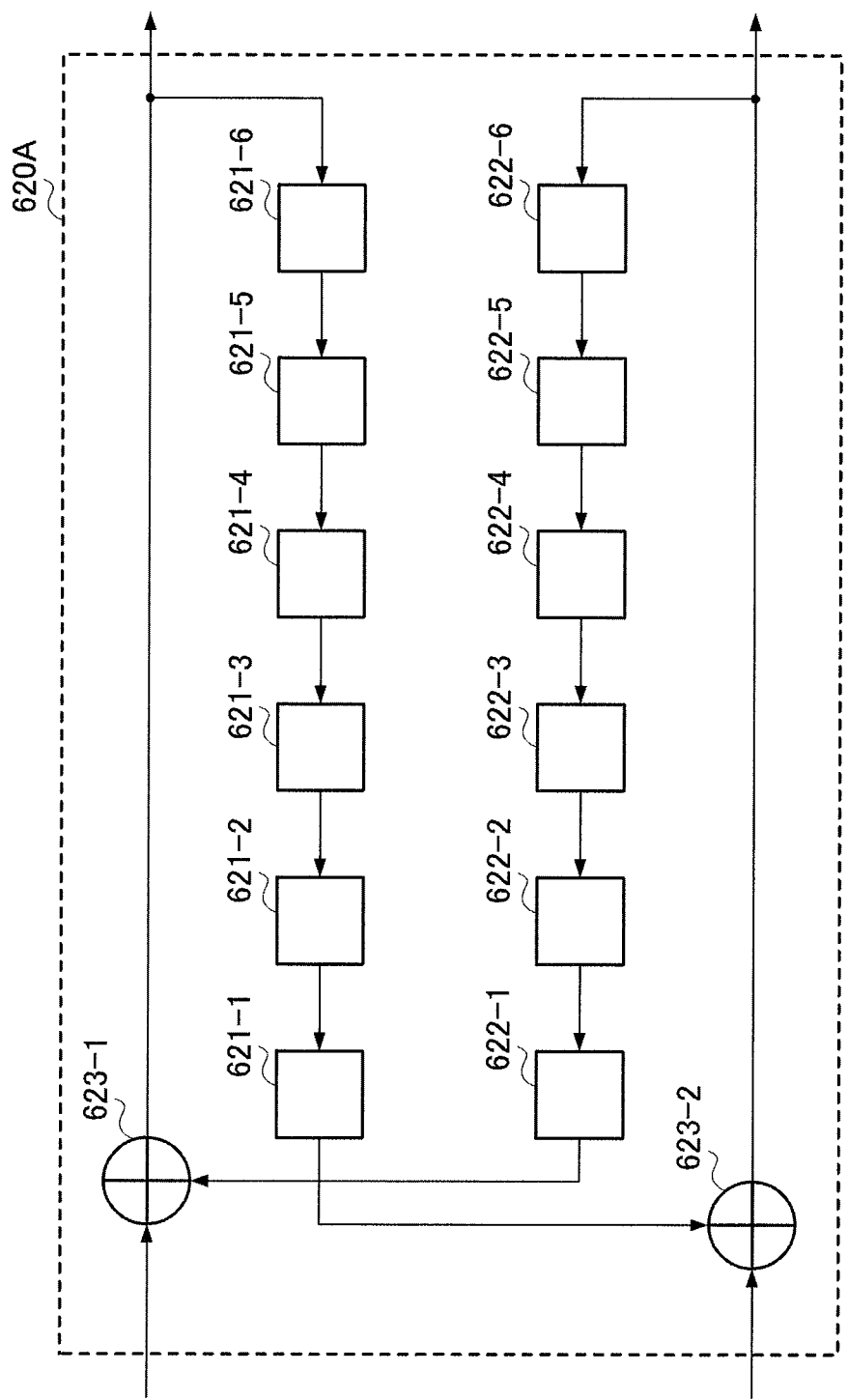
FIG. 38 is a block diagram showing another internal configuration of a second encoder according to Embodiment 3.

FIG. 38 shows the configuration of second encoder 620A.

Second encoder 620A comprises shift registers 621-1 through 621-6 and 622-1 through 622-6, and modulo 2 adders 623-1 and 623-2.

Second encoder 620A has first codeword sequence #1 and first codeword sequence #2 output from first encoder 610 as input, performs encoding based on parity check equations of partial parity check matrix for parity bits 520A, and outputs sequences after encoding to codeword connection section 630 as second codeword sequence #1 and second codeword sequence #2. A second codeword sequence #1 codeword bit is obtained by modulo 2 addition of a codeword bit of first codeword sequence #1 of that point in time and a codeword bit of past second codeword sequence #2 stored in shift register 622-1. A second codeword sequence #2 codeword bit is obtained by modulo 2 addition of a codeword bit of second codeword sequence #2 of that point in time and a codeword bit of past second codeword sequence #1 stored in shift register 621-1.

Since second encoder 620A in FIG. 38 employs a differential encoder configuration, as in the case of second encoders 620, it does not require termination processing, as already explained. Consequently, as with LDPC-CC encoder 600, it is only necessary to perform first encoder 610 termination processing as LDPC-CC encoder 600A termination processing, and therefore the same kind of effect can be obtained.

Embodiment 4

In this embodiment a description will be given of a configuration and termination method of an LDPC-CC encoder that enables the amount of memory used in decoding to be reduced. In this embodiment a second encoder is not used on a termination sequence, and a first termination code sequence generated by performing encoding using a first encoder is taken as a transmission codeword sequence.

Figure 39:
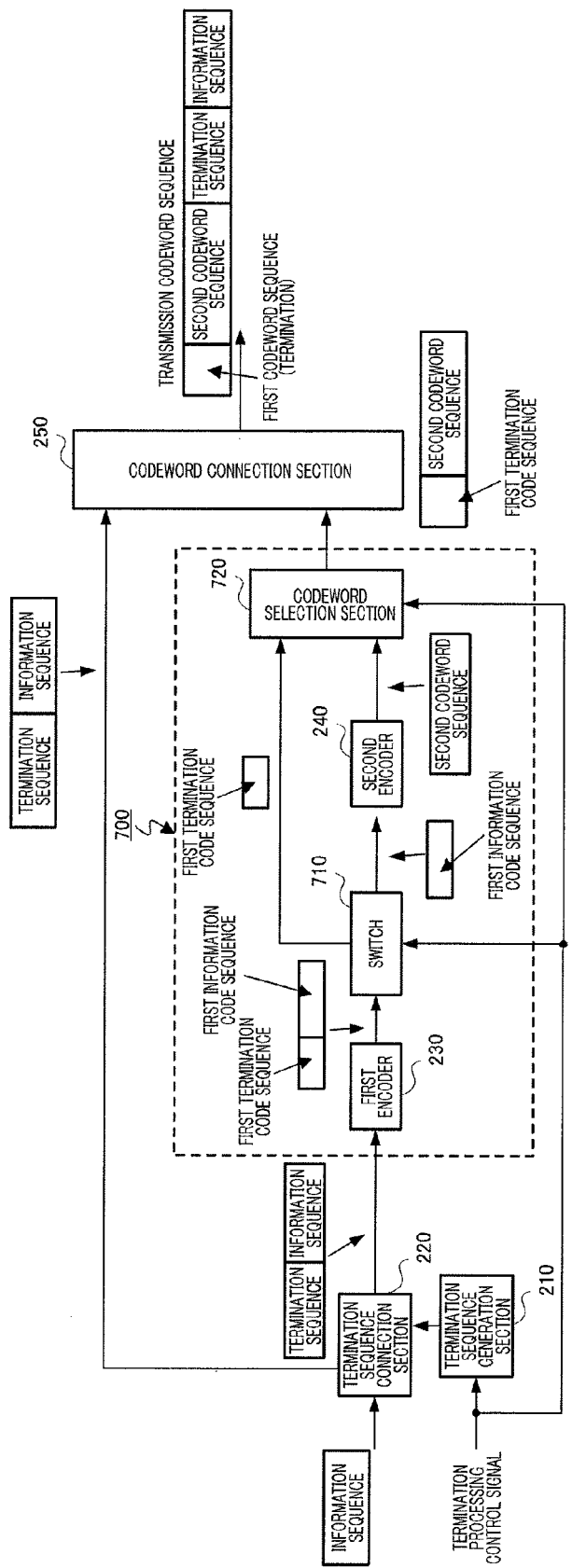
FIG. 39 is a block diagram showing a configuration of an LDPC-CC encoder according to Embodiment 4 of the present invention.

FIG. 39 shows a configuration of an LDPC-CC encoder according to this embodiment. Configuration parts in the LDPC-CC encoder according to this embodiment in FIG. 39 that are common to FIG. 8 are assigned the same reference codes as in FIG. 8, and descriptions thereof are omitted here.

LDPC-CC encoder 700 in FIG. 39 comprises first encoder 230, second encoder 240, and codeword selection section 720. FIG. 39 also shows termination sequence generation section 210, termination sequence connection section 220, codeword connection section 250, and switch 710.

Switch 710 has a first codeword sequence output from first encoder 230 as input, and switches the output destination of that first codeword sequence to second encoder 240 or codeword selection section 720 according to a termination processing control signal. Specifically, when the termination processing control signal indicates a state prior to the start of termination processing—that is, when first encoder 230 output is a codeword (first information code sequence) obtained by encoding an information sequence—switch 710 outputs the first information code sequence to second encoder 240. On the other hand, when the termination processing control signal indicates the start of termination processing—that is, when first encoder 230 output is a codeword (first termination code sequence) obtained by encoding a termination sequence—switch 710 outputs the first termination code sequence to codeword selection section 720.

Codeword selection section 720 selects a sequence to be output to codeword connection section 250 according to a termination processing control signal. Specifically, when the termination processing control signal indicates a state prior to the start of termination processing, codeword selection section 720 selects a second codeword sequence output from second encoder 240, and outputs this to codeword connection section 250. On the other hand, when the termination processing control signal indicates the start of termination processing, codeword selection section 720 selects a first termination code sequence output from switch 710, and outputs this to codeword connection section 250.

Thus, in this embodiment, a first termination code sequence generated as a result of performing first encoder 230 termination processing is output directly as a transmission codeword sequence without being encoded by second encoder 240.

Termination processing of LDPC-CC encoder 700 configured as described above will now be explained. As an example, a case will be described below in which first encoder 230 performs encoding based on partial parity check matrix for information bits 110 shown in FIG. 6, and second encoder 240 performs encoding based on partial parity check matrix for parity bits 120 shown in FIG. 7.

(Termination Processing)

Encoding is performed on an information sequence or termination sequence by first encoder 230 using partial parity check matrix for information bits 110, and a first codeword sequence is generated. The first codeword sequence is output to switch 710.

The first codeword sequence output destination is switched to either second encoder 240 or codeword selection section 720 by switch 710 according to a termination processing control signal. Specifically, when the termination processing control signal indicates a state prior to the start of termination processing—that is, when first encoder 230 output is a first information code sequence—the first information code sequence is output to second encoder 240.

On the other hand, when the termination processing control signal indicates the start of termination processing—that is, when first encoder 230 output is a first termination code sequence—the first termination code sequence is output to codeword selection section 720.

Thus, when termination processing is performed, a first termination code sequence is not output to second encoder 240, but is output to codeword connection section 250 via codeword selection section 720. Therefore, when termination processing is performed, a first termination code sequence is output directly from codeword connection section 250 as a transmission codeword sequence.

FIG. 40 shows a termination section of a parity check matrix when a first termination code sequence generated by performing encoding using only first encoder 230 and not using second encoder 24 is taken as a transmission codeword sequence. In FIG. 40, bits corresponding to parts enclosed by a square frame indicate bits added when a first termination code sequence is output to second encoder 240. When a first termination code sequence is output to second encoder 240, a 1 is set in parts enclosed by a square frame, and the corresponding bits are added. For example, with the c7 parity check equation, (u3+u6+u7) is output to second encoder 240 as a first termination code sequence, and p7 is calculated by second encoder 240 by adding past p2 to (u3+u6+u7).

By contrast, when a first termination code sequence is not output to second encoder 240 but is output to codeword selection section 720, past p2 added by second encoder 240 is not added to (u3+u6+u7), but p7 is added.

Therefore, as shown in FIG. 40, if a first termination code sequence is not output to second encoder 240 in termination processing, and a first termination code sequence is transmitted as a transmission codeword sequence, encoding is performed using a parity check equation for which a part enclosed by a square frame is replaced by 0.

As a result, the column weight of columns corresponding to a parity bit part of the parity check matrix from p2 onward is 1, and a zero sequence connected on the decoding side that is necessary when decoding these bits can be shortened. For example, in the example shown in FIG. 40, to consider u4, u8 included in parity check equation c8 in which u4 is included is also included in parity check equation c9, and u9 included in parity check equation c9 is also included in parity check equation c13. Consequently, on the decoding side it is necessary to further connect a zero sequence to the latter part of the termination sequence equivalent to a number of bits necessary for parity check equation c13 in order to decode u4. In the example shown in FIG. 40, a 4-bit zero sequence is connected.

Figure 41:
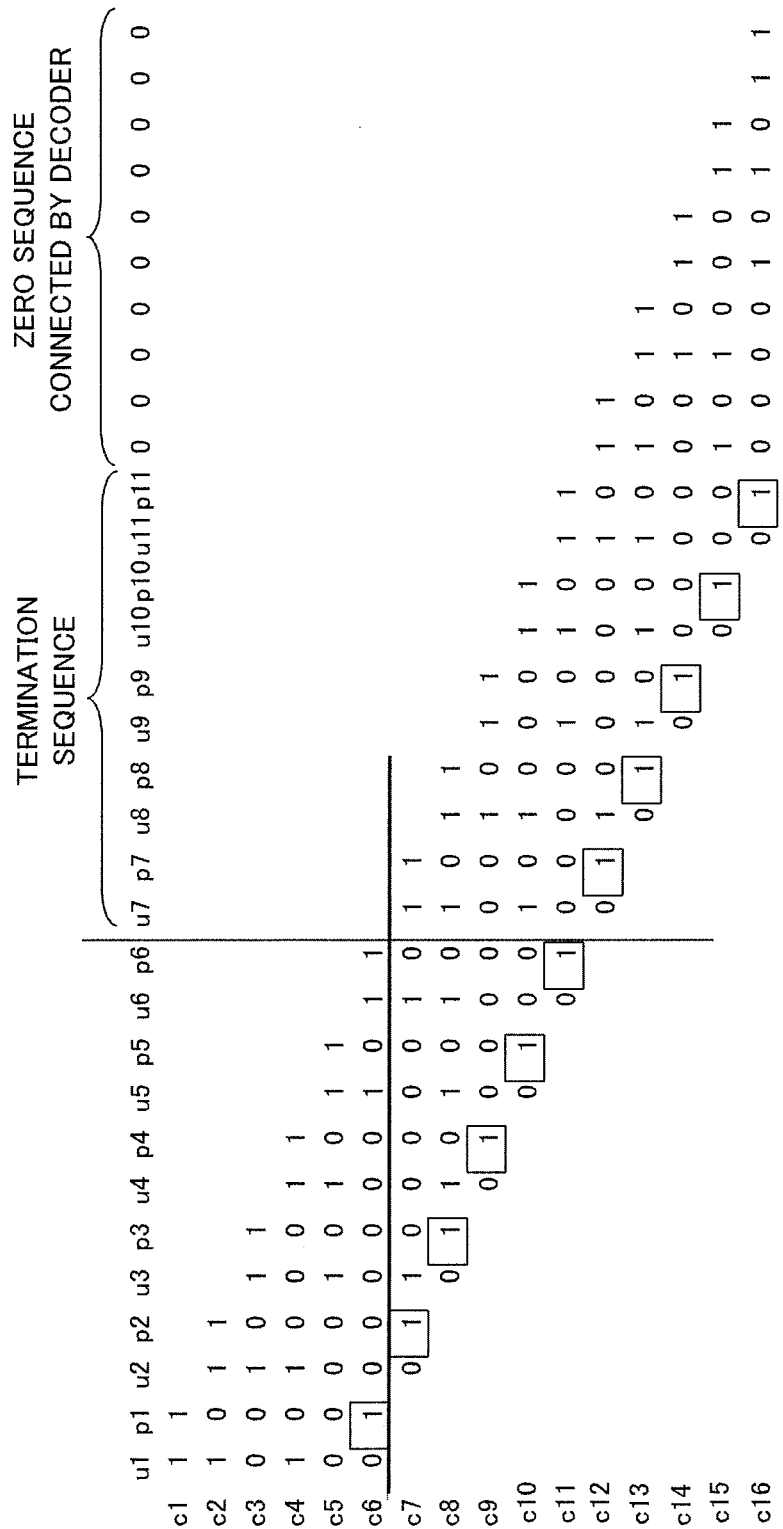
FIG. 41 is a drawing showing a termination section of a parity check matrix of an LDPC-CC according to Embodiment 1.

By contrast, the rear part of a parity check matrix when a first termination code sequence is output to second encoder 240 is shown in FIG. 41. In this case, a second codeword sequence obtained by performing encoding on a first termination code sequence is output to codeword connection section 250 via codeword selection section 720, and is transmitted from codeword connection section 250 as a transmission codeword sequence.

As shown in FIG. 41, with parity check equation c7, p7 is calculated by second encoder 240 by adding past p2 to (u3, u6, u7) output from first encoder 230 as a first termination code sequence. The same kind of process also applies to the other parity check equations. Consequently, in FIG. 41, a 1 is set in parts enclosed by a square frame.

In the example shown in FIG. 41, to consider p6, p11 included in parity check equation c11 in which p6 is included is also included in parity check equation c9, and u9 included in parity check equation c9 is also included in another parity check equation, c16, and therefore it is necessary to connect a zero sequence of a number of bits necessary for parity check equation c16. In the example shown in FIG. 41, a 10-bit zero sequence is connected.

By contrast, in this embodiment, by providing for encoding not to be performed on a first termination code sequence by second encoder 240, the number of bits of a zero sequence that needs to be connected can be reduced, as shown in FIG. 40. For example, it can be seen from a comparison with the termination section of Embodiment 1 parity check matrix 100 shown in FIG. 41 that the zero sequence that needs to be connected by the decoder has been shortened by 6 bits. As a result, the memory size required by a decoder, and the amount of decoding computation, can be reduced.

By not having a first termination code sequence encoded by second encoder 240, the column weight of corresponding columns becomes 1, and although error correction performance degrades, error correction performance degradation is expected to be minor due to the fact that a sequence that is not encoded by second encoder 240 is a termination sequence, and the fact that, since an LDPC-CC decoding algorithm performs reliability propagation in order from a codeword located on the left of a parity check matrix, an error in a termination sequence located in the rightmost column of the parity check matrix has little effect on decoding of codeword bits relating to information bits located to the left thereof. Therefore, LDPC-CC encoder 700 according to this embodiment is effective when applied to a case in which there are strict limitations on the memory size, amount of decoding computation, and so forth, of a decoder.

As described above, according to this embodiment, switch 710 performs switching as to whether or not a first codeword sequence output from first encoder 230 is output to second encoder 240 according to whether an input sequence is an information sequence or a termination sequence, and codeword selection section 720 outputs either a first codeword sequence or a second codeword sequence according to whether an input sequence is an information sequence or a termination sequence. By this means, the column weight of a parity check matrix can be decreased, and the number of bits of a 0-sequence that needs to be connected when termination processing is performed on the decoding side can be reduced, enabling the memory size and amount of decoding computation of a decoder to be reduced.

Embodiment 5

In Embodiment 1 through Embodiment 4, descriptions have been given of LDPC-CC encoders and encoding methods that enable an amount of a termination sequence transmitted in a transmission channel to be reduced. In this embodiment, an input sequence and output sequence of an above-described LDPC-CC encoder will be considered, and their relationship to a parity check matrix described, and a decoder and decoding method for decoding a transmission codeword sequence transmitted from an above-described LDPC-CC encoder will be described, focusing mainly on termination sequence processing.

(Encoding Method)

Figure 42:
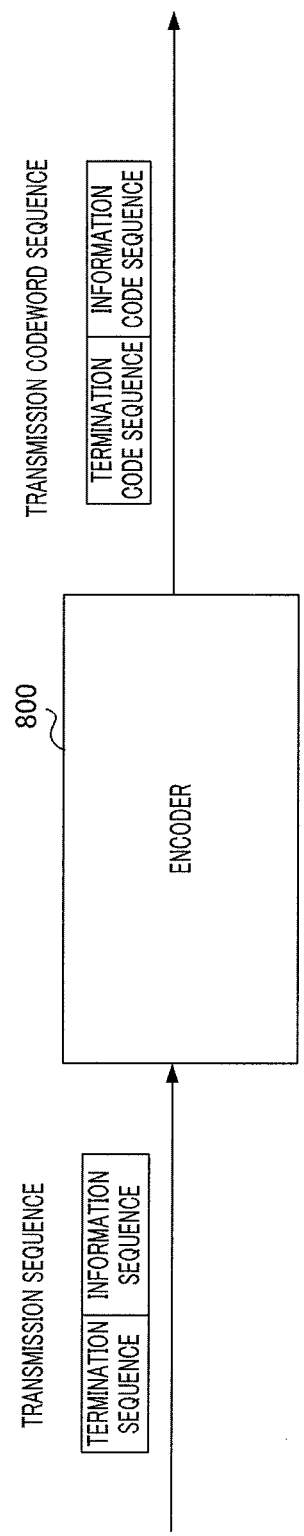
FIG. 42 is a drawing showing an input sequence and an output sequence of an LDPC-CC encoder according to Embodiment 5 of the present invention.

FIG. 42 shows an input sequence and an output sequence of an LDPC-CC encoder according to this embodiment. LDPC-CC encoder 800 in FIG. 42 is an encoder that performs coding rate R=b/c, memory length M LDPC-CC encoding based on a low-density parity check matrix.

LDPC-CC encoder 800 has an information sequence composed of information bits, followed by a termination sequence for LDPC-CC encoder 800 termination processing (these together being hereinafter referred to as a "transmission information sequence"), as an input sequence, and performs encoding on that input sequence.

When an input sequence is an information sequence, LDPC-CC encoder 800 outputs an information code sequence. When an input sequence is a termination sequence, LDPC-CC encoder 800 outputs a termination code sequence. An information code sequence and termination code sequence together are hereinafter referred to as a "transmission codeword sequence".

A description is given below of a termination sequence when LDPC-CC encoder 800 performs LDPC-CC encoding using the parity check matrix shown in FIG. 5. Parity check matrix 100 in FIG. 5 is a parity check matrix that defines an LDPC-CC for which coding rate R=½ and memory length M=5.

Of the labels assigned to the columns of parity check matrix 100 in FIG. 5, $u1, u2, \ldots$ correspond to bits of a transmission information sequence input to LDPC-CC encoder 800, and $p1, p2, \ldots$ correspond to bits of a transmission codeword sequence output from LDPC-CC encoder 800. A partial matrix obtained by extracting columns corresponding to $u1, u2, \ldots$ is partial parity check matrix for information bits 110 in FIG. 6, and a partial matrix obtained by extracting columns corresponding to $p1, p2, \ldots$ is partial parity check matrix for parity bits 120 in FIG. 7.

Incidentally, in each row of an partial parity check matrix for information bits, the maximum value of the difference between the index of the leftmost column in which a 1 is present and the index of the rightmost column in which a 1 is present corresponds to (M1×b). Partial parity check matrix for information bits 110 in FIG. 6 is an example in which b=1 and M1=4, coinciding with an above-described index difference maximum value of 4.

Also, in each row of a partial parity check matrix for parity bits, the maximum value of the difference between the index of the leftmost column in which a 1 is present and the index of the rightmost column in which a 1 is present corresponds to M2(c−b). Partial parity check matrix for parity bits 120 in FIG. 7 is an example in which b=1, c=2, and M2=5, coinciding with an above-described index difference maximum value of 5.

As explained in the above embodiments, the length of a termination sequence for LDPC-CC encoder 800 need only be M1×b=4×1=4. Also, LDPC-CC encoder 800 memory length M is taken as the larger of M1 and M2 (M=max(M1, M2)). That is to say, the length of a termination sequence is less than or equal to memory length M multiplied by b. Encoding is performed as described below.

First, a description will be given by way of example of a parity check equation labeled c6 in parity check matrix 100 for encoding when an information sequence is input to LDPC-CC encoder 800. Parity check equation c6 represents a generation method for bit p6 of a transmission codeword sequence output when bit u6 is input to LDPC-CC encoder 800 as a transmission information sequence bit.

Specifically, transmission codeword bit p6 is found by performing modulo 2 addition of bits corresponding to columns in which a 1 is set, other than p6, in row c6. That is to say, p6 is calculated as p6=p1+u5+u6.

Since the arrangement pattern of 1 s and 0 s in each row in parity check matrix 100 differs on a row-by-row basis, p7 is calculated as p7=p2+u3+u7.

Next, encoding when an (M1×b)-bit (=4-bit) termination sequence is input to LDPC-CC encoder 800 will be described.

A termination sequence is represented as t=[t1, t2, t3, t4], and an information sequence input immediately before the termination sequence is represented as d=[ . . . , d5, d4, d3, d2, d1]. A transmission information sequence at this time is u= [ . . . , d5, d4, d3, d2, d1, t1, t2, t3, t4].

Also, a transmission codeword sequence is designated v= [ . . . , g5, g4, g3, g2, g1, s1, s2, s3, s4], where information code sequence g5 through g1 is a transmission codeword sequence corresponding to information sequence d5 through d1, and termination code sequence s1 through s4 is a transmission codeword sequence corresponding to termination sequence t1 through t4.

FIG. 43 shows a termination section of parity check matrix 100. Termination code sequence s1 through s4 is calculated from the parity check equation ct1 through ct4 rows by means of equation 6-1 through equation 6-4.

(Equation 6-1)

$$s1=g5+d4+d1+t1$$

(Equation 6-2)

$$s2=g4+d3+d2+d1+t2$$

(Equation 6-3)

$$s3=g3+t1+t2+t3$$

(Equation 6-4)

$$s4=g2+t3+t4 \quad [6]$$

That is to say, termination code sequence s1 through s4 is generated using termination sequence t1 through t4, the 4 bits d1 through d4 after the information sequence, and the 5 bits g1 through g5 after the information code sequence.

As LDPC-CC encoder 800 is a convolutional encoder, it can use a sequence of any length as an information sequence. Also, LDPC-CC encoder 800 can be configured as a time-variant convolutional encoder. Consequently, bits used for termination code sequence generation vary depending on the length and values of an information sequence.

However, since the maximum value of the difference between the index of the leftmost column in which a 1 is present and the index of the rightmost column in which a 1 is present in each row of an partial parity check matrix for information bits and a partial parity check matrix for parity bits corresponds to (M1×b) and M2×(c−b) respectively, as explained above, termination code sequence bits can be represented as follows.

Namely, a termination code sequence is generated using a termination sequence comprising (M1×b) bits, at most (M1× b) bits after an information sequence, and at most M2×(c−b) bits after an information code sequence.

(Decoding Method)

Next, a description will be given of a decoding method of an LDPC-CC decoder that decodes a transmission codeword sequence output from LDPC-CC encoder 800.

Figure 44:
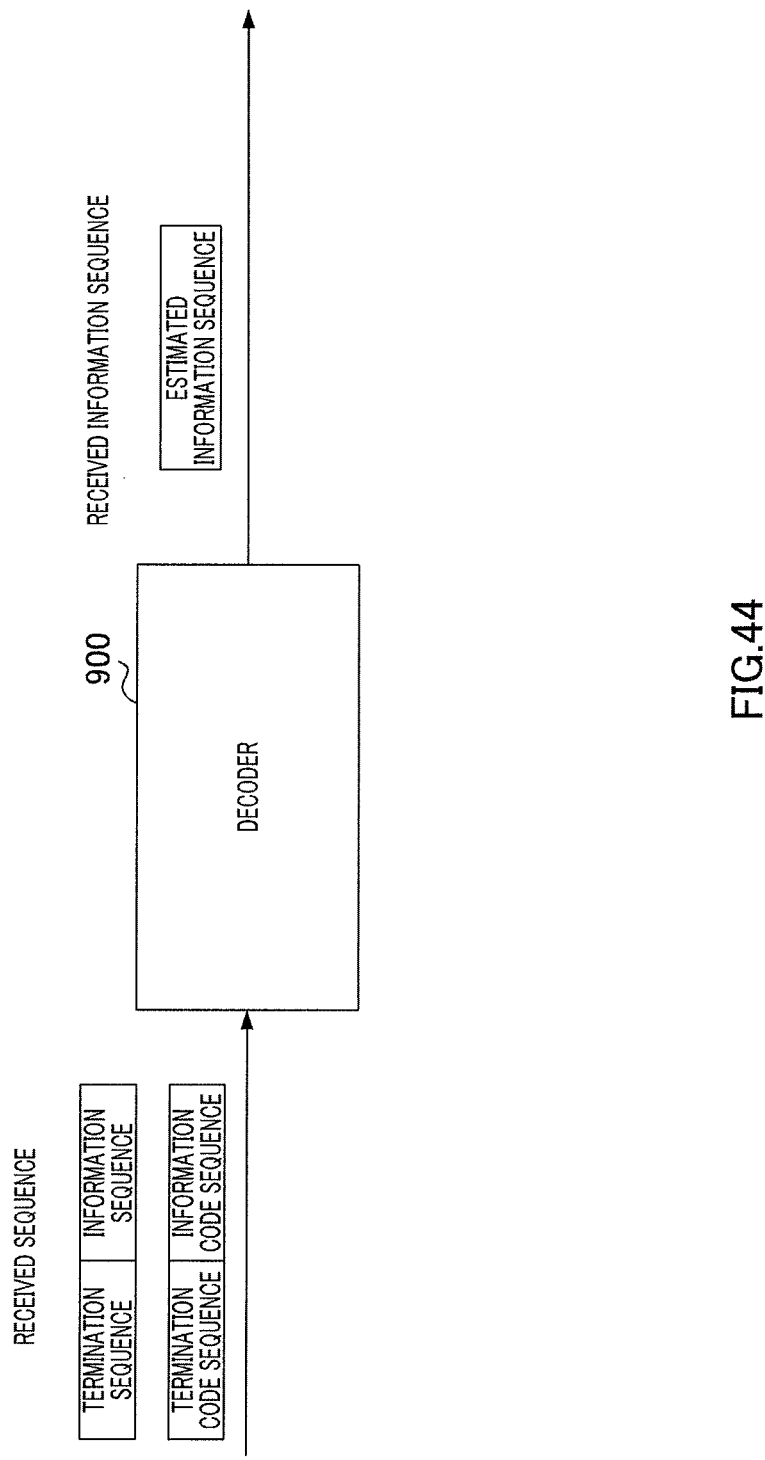
FIG. 44 is a drawing showing an input sequence and an output sequence of an LDPC-CC decoder according to Embodiment 5.

FIG. 44 shows an input sequence and an output sequence of an LDPC-CC decoder according to Embodiment 5. LDPC-CC decoder 900 in FIG. 44 is a decoder that performs coding rate R=b/c, memory length M LDPC-CC decoding based on a low-density parity check matrix.

LDPC-CC decoder 900 has estimates of a received sequence (comprising an information sequence, termination sequence, information code sequence, and termination code sequence) obtained from a communication channel as input, and performs decoding processing. As in the case of an LDPC-BC, a sum-product algorithm based on a parity check matrix can be applied as a decoding processing method. LDPC-CC decoder 900 outputs an estimated information sequence after decoding. A sequence comprising an information sequence estimate and a termination sequence estimate is called a received information sequence, and a sequence comprising an information code sequence estimate and a termination code sequence estimate is called a received codeword sequence.

Figure 45:
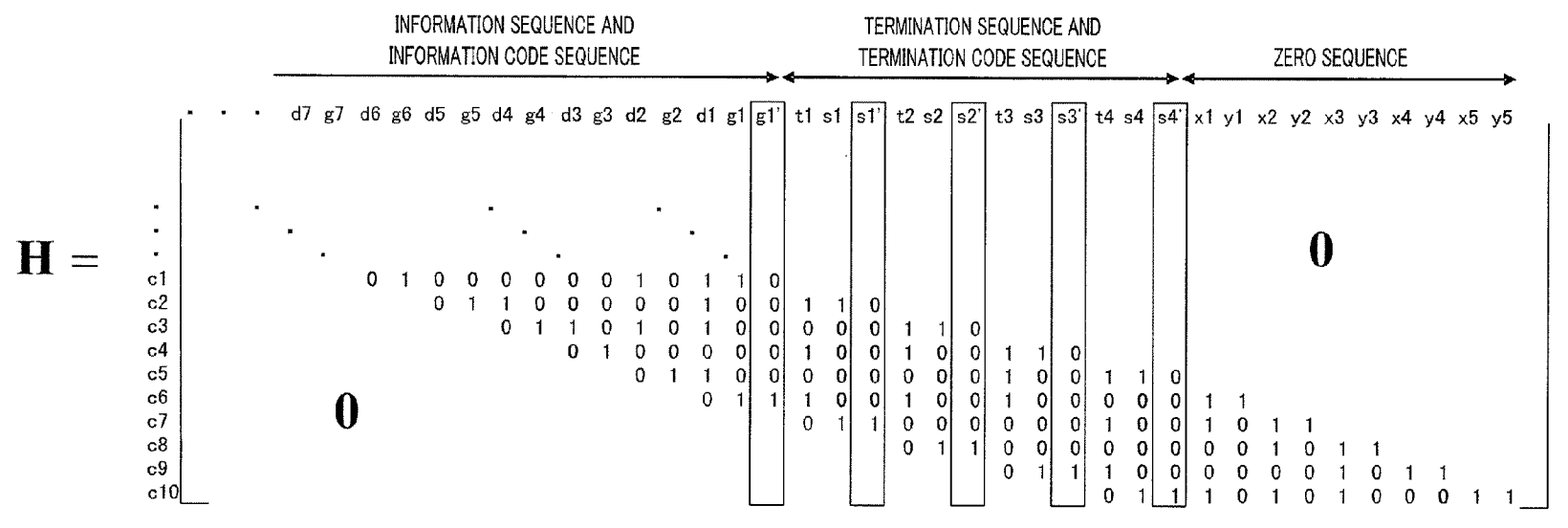

FIG. 45 shows an example of a termination section of a parity check matrix used for decoding processing by LDPC-CC decoder 900. The parity check matrix termination section shown in FIG. 45 is a termination section corresponding to parity check matrix 100 used by encoding-side LDPC-CC encoder 800.

When termination processing is performed on the encoding side, the state of LDPC-CC encoder 800 after completion of termination processing is all-zeros, and therefore when decoding is performed on the decoding side, memory length M zero sequences x and y are added respectively after a termination sequence and termination code sequence.

Also, in this embodiment, as shown in FIG. 45, LDPC-CC decoder 900 uses a parity check matrix in which one column respectively is inserted on the right of a column corresponding to the M2×(c−b)'th bit from the last bit of a received codeword sequence.

For an inserted column, there is a 1 in the same row as the lowest 1 in a column corresponding to a bit of a received codeword sequence (a column on the left of an inserted column), and other rows have all-zero columns. In the example shown in FIG. 45, five (=M2×(c−b)) columns g1', s1', s2', s3', and s4' have been inserted in the termination section of the parity check matrix.

Through this column insertion, parity check equations c6 through c10 of the parity check matrix in FIG. 45 become as shown in equation 7-1 through equation 7-5.

(Equation 7-1)

$$c6: y1=g1+g1'+t1+t2+t3+x1$$

(Equation 7-2)

$$c7: y2=s1+s1'+t4+x1+x2$$

(Equation 7-3)

$$c8: y3=s2+s2'+x2+x3$$

(Equation 7-4)

$$c9: y4=s3+s3'+t4+x3+x4$$

(Equation 7-5)

$$c10: y5=s4+s4'+x1+x2+x3+x5 \quad [7]$$

In this embodiment, LDPC-CC encoder 800 performs decoding using the same value as a communication channel value of a received codeword sequence bit column one to the left as a communication channel value of an inserted column. In the example shown in FIG. 45, the same values as g1, s1, s2, s3, and s4 are used respectively as communication channel values of columns g1', s1', s2', s3', and s4'.

The reason for this is that, with an LDPC-CC, codeword $v_{2,t-i}$ of a past time is necessary in order to find codeword $v_{2,t}$, as shown in equation 2, and therefore codeword $v_{2,t-i}$ of a past time is stored in a shift register of LDPC-CC encoder 800. When performing termination processing, LDPC-CC decoder 900 requires LDPC-CC encoder 800 shift register states, but what is stored in a shift register is a codeword of a past time, and a codeword of a past time has already been transmitted. Therefore, on the decoding side, termination processing is performed using a codeword stored in a shift register by performing decoding using a parity check matrix in which columns g1', s1', s2', s3', and s4' have been inserted to the right of g1, s1, s2, s3, and s4. Consequently, on the encoding side it is not necessary to transmit a codeword of a past time stored in a shift register necessary for finding $v_{2,t}$, and it is only necessary to use an (M1×b)-bit termination sequence.

When termination processing has been completed, equation 8-1 through equation 8-5 are obtained based on the fact that x1 through x5 are 0 and y1 through y5 are 0, and the fact that g1=g1' and sx=sx' (where x=1, . . . , 4).

(Equation 8-1)

$$c6: 0 = t1 + t2 + t3$$

(Equation 8-2)

$$c7: 0 = t4$$

(Equation 8-3)

$$c8: 0 = 0$$

(Equation 8-4)

$$c9: 0 = t4$$

(Equation 8-5)

$$c10: 0 = 0 \qquad [8]$$

Therefore, from equation 8-1 through equation 8-5, it can be seen that it is only necessary for t=[t1, t2, t3, t4] to be a sequence that satisfies the relationships of equation 9-1 and equation 9-2, and, for example, t=[0, 0, 0, 0] can be used as a termination sequence.

(Equation 9-1)

$$0 = t1 + t2 + t3$$

(Equation 9-2)

$$0 = t4 \qquad [9]$$

Thus, an LDPC-CC encoder according to this embodiment has a termination sequence comprising (M1×b) bits following an information sequence as input, and outputs an information code sequence and termination code sequence.

Also, an LDPC-CC encoder according to this embodiment performs decoding processing using a parity check matrix in which M2×(c−b) columns having the same communication channel values as M2×(c−b) bits after the respective received codeword sequence (a sequence comprising an information code sequence estimate and termination code sequence estimate) are added to a parity check matrix used for encoding.

In this way, LDPC-CC encoder termination processing can be performed using a termination sequence comprising (M1×b) zeros, computation for generating a termination sequence using an information code sequence and termination code sequence becomes unnecessary, and an LDPC-CC encoder can be implemented with a simple configuration.

In the above description, a case has been described by way of example in which LDPC-CC encoder 800 performs encoding using parity check matrix 100 of a non-recursive convolutional code, but the parity check matrix is not limited to parity check matrix 100, and the present invention can also be applied in a similar way to a case in which encoding is performed using parity check matrix 300 of a recursive convolutional code such as shown in FIG. 22, for example. However, in this case a termination sequence is not a zero sequence, but comprises (M1×b) feedback bits as described in Embodiment 2.

Figure 2:
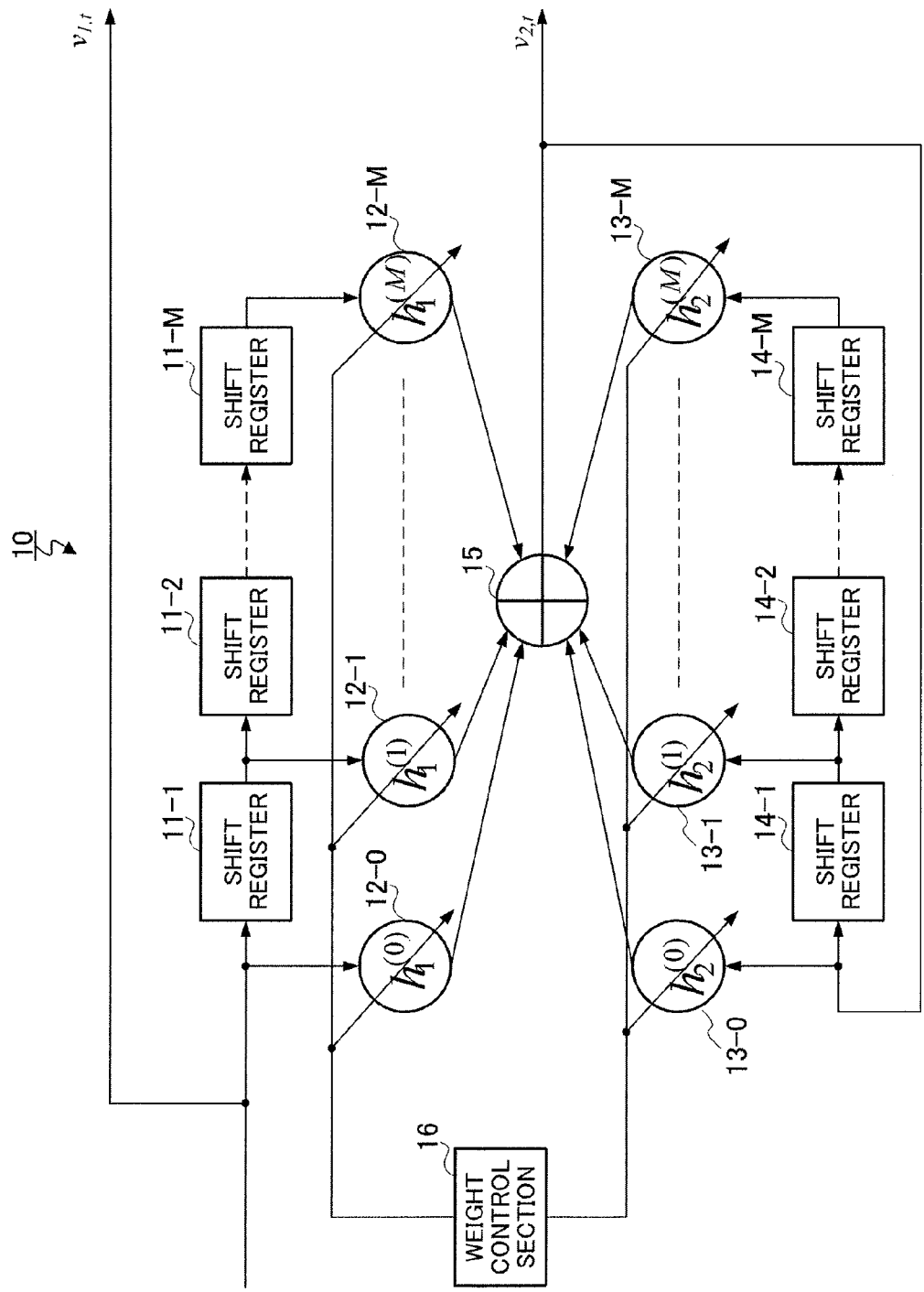
FIG. 2 is a block diagram showing an example of a configuration of a conventional LDPC-CC encoder.
Figure 3:
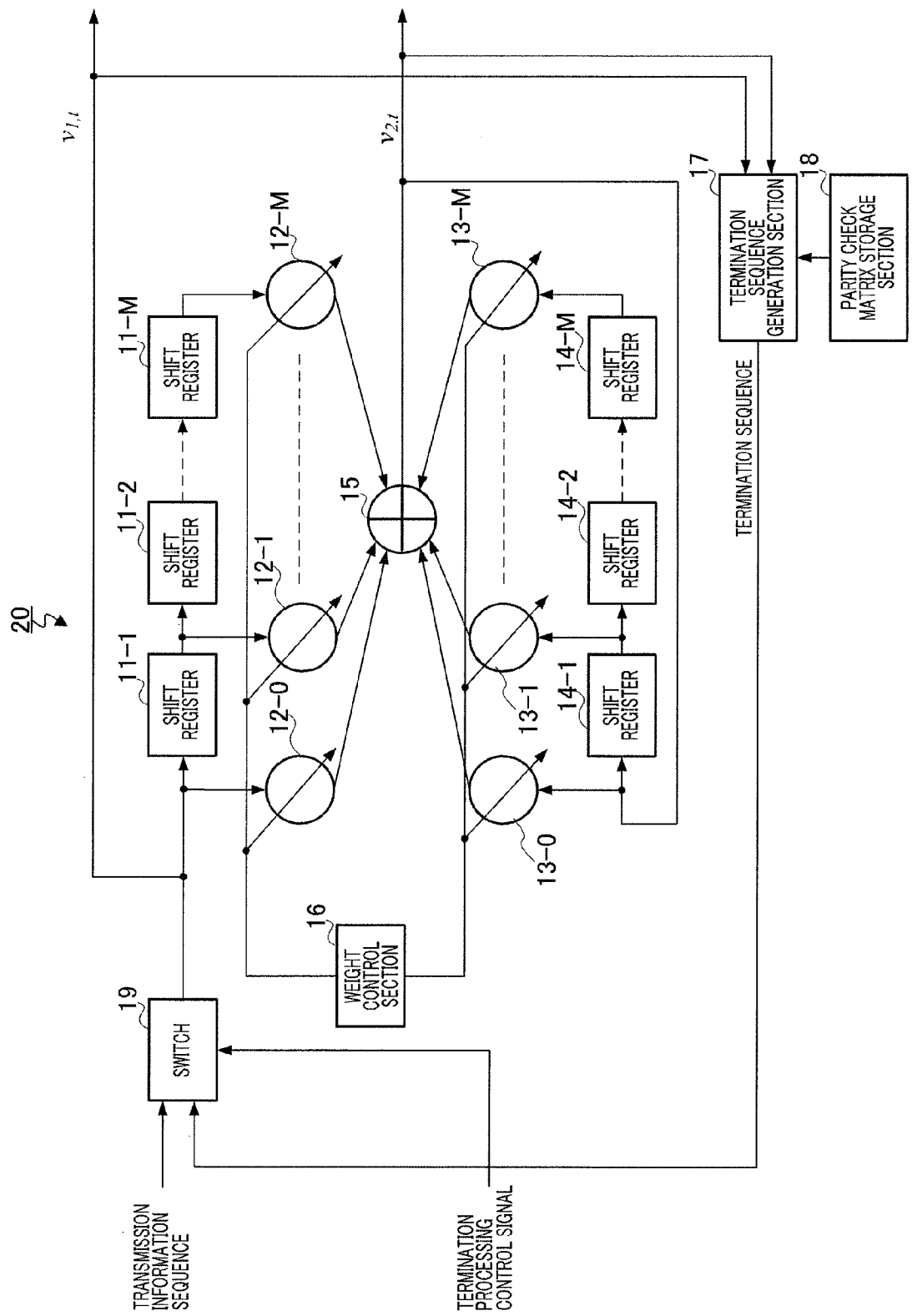
FIG. 3 is a block diagram showing an example of a configuration of an LDPC-CC encoder to which a conventional termination sequence generation section has been added.
Figure 4:
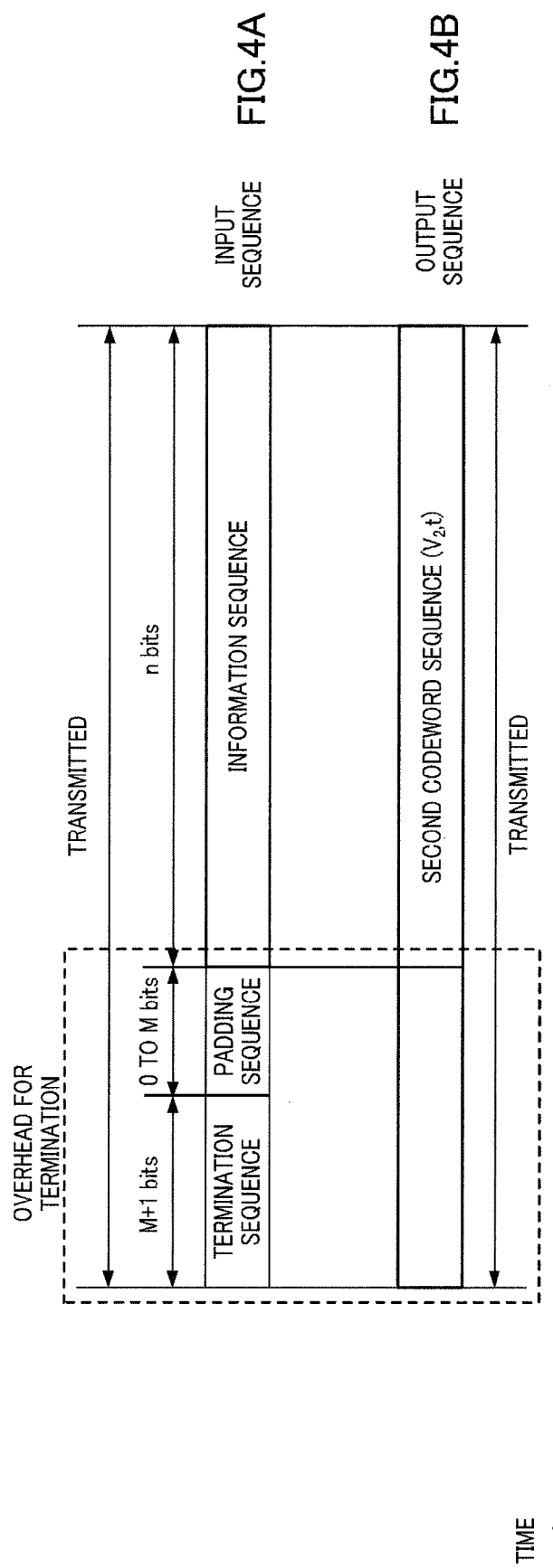
FIG. 4 is a drawing showing an input sequence and an output sequence of a conventional LDPC-CC encoder.

Also, if the termination sequence and decoding method described in this embodiment are used, the same kind of effect can also be obtained for conventional LDPC-CC encoder 10 such as shown in FIG. 2.

Additional Embodiment 1

In this embodiment, a method of designing a new LDPC-CC from a (7, 5) convolutional code will be described in detail.

Figure 46:
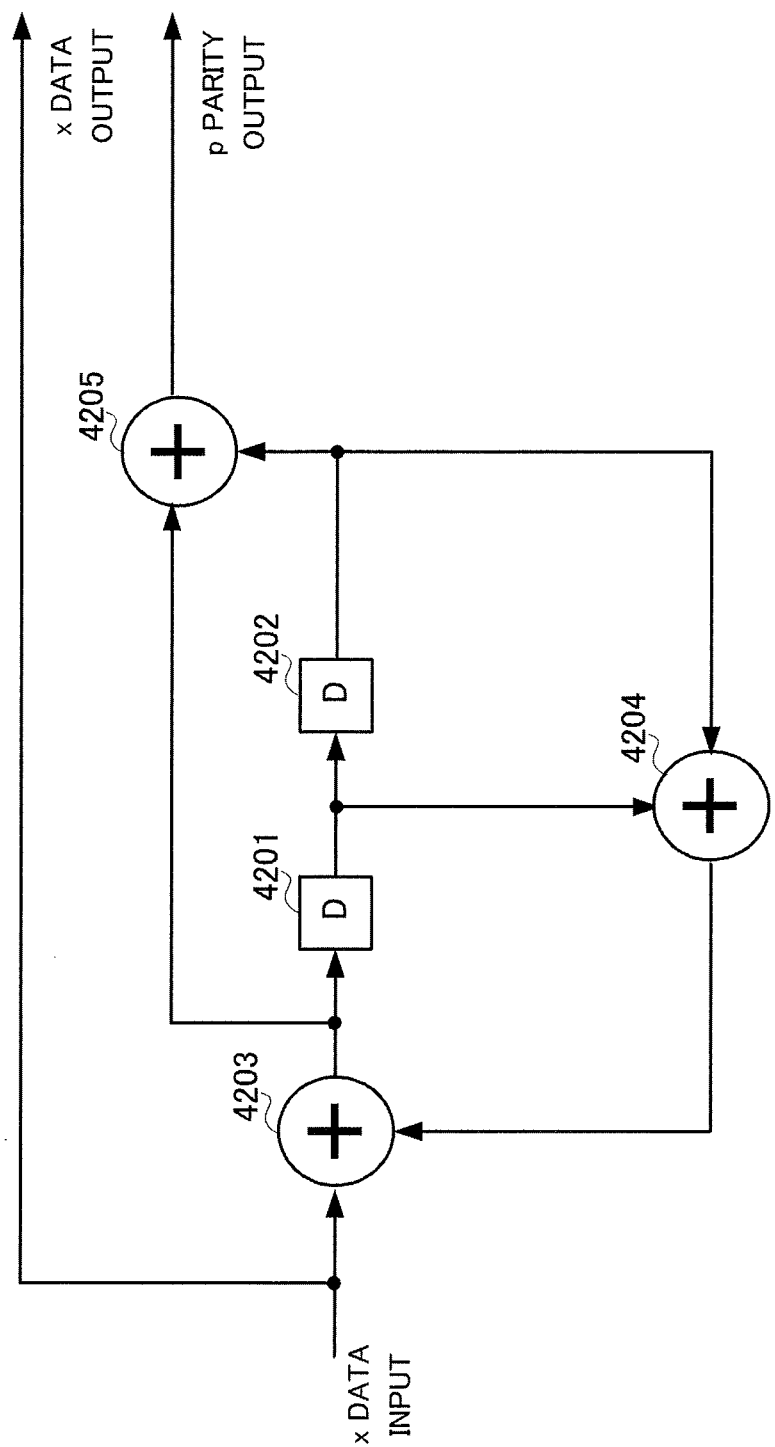
FIG. 46 is a drawing showing an encoder of a (7, 5) convolutional code.

FIG. 46 is a drawing showing a configuration of an encoder of a (7, 5) convolutional code. The encoder shown in FIG. 46 has shift registers 4201 and 4202, and exclusive OR circuits 4203, 4204, and 4205. The encoder shown in FIG. 46 outputs output x and parity p for input x. This code is a systematic code.

In the present invention, the fact that a convolutional code, which is a systematic code, is used is important.

A convolutional code with a coding rate of ½ and generating polynomial $G=[1 \; G_1(D)/G_0(D)]$ will be considered as an example. At this time, $G_1$ represents a feed-forward polynomial and $G_0$ represents a feedback polynomial. If an information sequence (data) polynomial representation is X(D), and a parity sequence polynomial representation is P(D), a parity check polynomial is represented as shown in equation 10 below.

(Equation 10)

$$G_1(D)X(D) + G_0(D)P(D) = 0 \qquad [10]$$

FIG. 47 shows information relating to a (7, 5) convolutional code. A (7, 5) convolutional code generating polynomial is represented as $G=[1 \; (D^2+1)/(D^2+D+1)]$. Therefore, a parity check polynomial is as shown in equation 11 below.

(Equation 11)

$$(D^2+1)X(D) + (D^2+D+1)P(D) = 0 \qquad [11]$$

Here, data at point in time i is represented by $X_i$, and parity by $P_i$, and transmission sequence $W_i$ is represented as $W_i=(X_i, P_i)$. Then transmission vector w is represented as $w=(X_1, P_1, X_2, P_2, \ldots, X_i, P_i)$. Thus, from equation 11, parity check matrix H can be represented as shown in FIG. 47. At this time, the relational expression in equation 12 below holds true.

(Equation 12)

$$Hw = 0 \qquad [12]$$

Therefore, in a receiving apparatus, parity check matrix H is used, and decoding can be performed using Belief Propagation (BP) decoding, min-sum decoding similar to BP decoding, offset BP decoding, Normalized BP decoding, shuffled BP decoding, or the like, as shown in Non-Patent Document 4 through Non-Patent Document 6.

Here, in the parity check matrix in FIG. 47, the part to the lower-left of row number=column number "1"s (the part to the lower-left of 4301 in FIG. 47) is defined as an approximate lower triangular matrix. The part to the upper-right of row number=column number "1"s is defined as an upper trapezoidal matrix.

Next, a design method for an LDPC-CC according to the present invention will be described in detail.

In order to implement an encoder with a simple configuration, a method is adopted whereby "1" is added to an approximate lower triangular matrix of parity check matrix H for a (7, 5) convolutional code shown in FIG. 47.

<Encoding Method>

Here, it will be assumed as an example that "1"s added to the parity check matrix in FIG. 47 comprise one data "1" and one parity "1". When one data "1" and one parity "1" are added to the approximate lower triangular matrix of parity check matrix H in FIG. 47, a parity check polynomial is represented as shown in equation 13 below. In equation 13, $\alpha \geq 3$ and $\beta \geq 3$.

(Equation 13)

$$(D^{\alpha}+D^2+1)X(D)+(D^{\beta}+D^2+D+1)P(D)=0 \quad [13]$$

Therefore, parity P(D) is represented as shown in equation 14 below.

(Equation 14)

$$P(D)=(D^{\alpha}+D^2+1)X(D)+(D^{\beta}+D^2+D)P(D) \quad [14]$$

When "1" is added to an approximate lower triangular matrix of a parity check matrix, since $D^{\beta}P(D)$, $D^2P(D)$, and DP(D) are past data and are known values, parity P(D) can easily be found.

<Positions at which "1" is Added>

Figure 48:
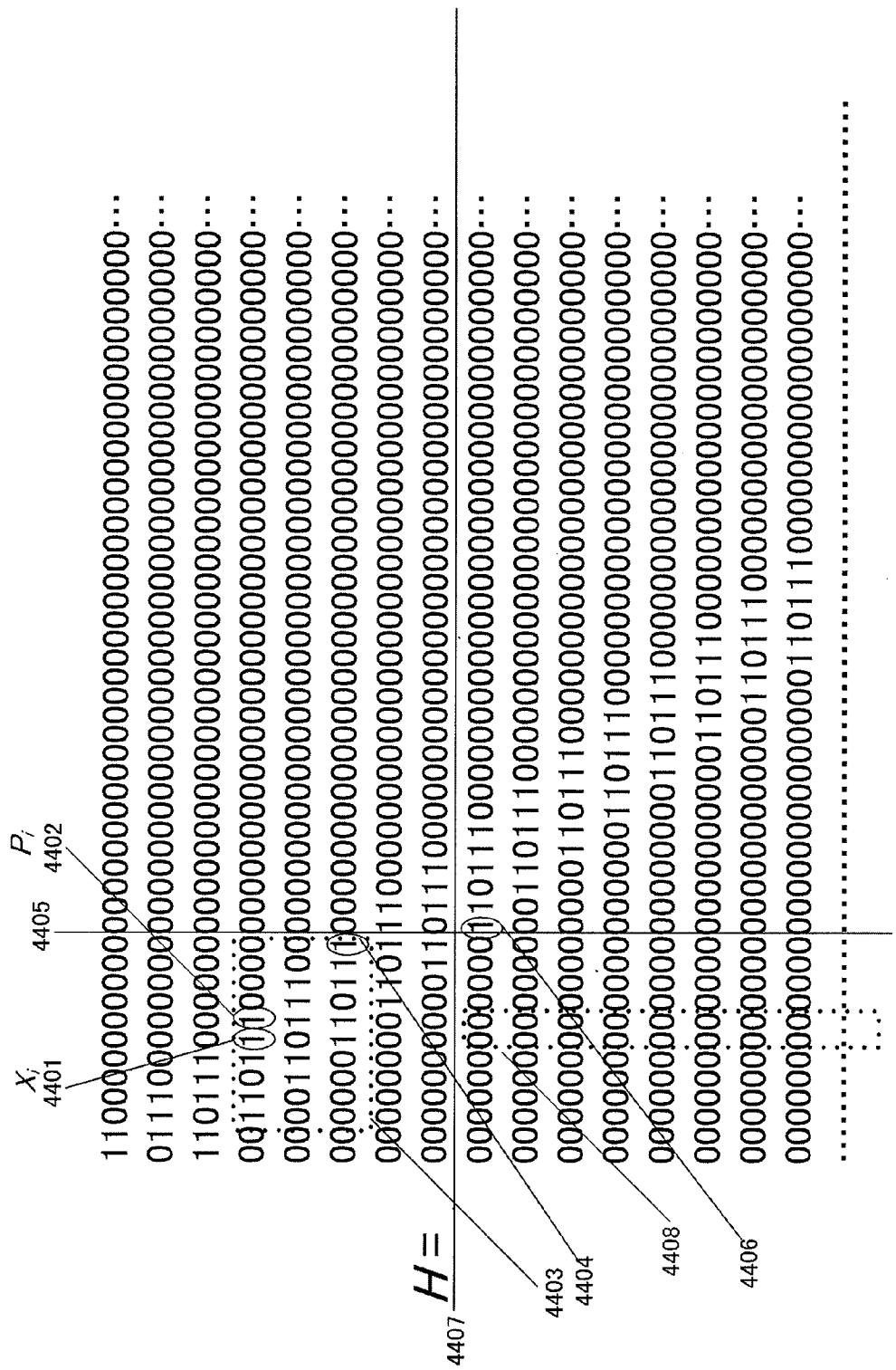
FIG. 48 is a drawing showing a parity check matrix of a (7, 5) convolutional code.

Next, positions of added "1"s will be described in detail using FIG. 48. In FIG. 48, reference code 4401 indicates a "1" relating to decoding of data $X_i$ of point in time i, and reference code 4402 indicates a "1" relating to decoding of parity $P_j$ of point in time i. Dotted line 4403 is a plot-graph involved in propagation of external information for data $X_i$ and parity $P_i$ of point in time i when one BP decoding operation is performed. That is to say, reliability from point in time i−2 to point in time i+2 is involved in propagation.

Boundary line 4405 is drawn vertically for the rightmost "1" (4404) of plot-graph 4403. Then boundary line 4407 is drawn for the leftmost "1" (4406) adjacent to boundary line 4405. Then "1" is added somewhere in area 4408 so that reliability from boundary line 4405 onward is propagated to data $X_i$ and parity $P_i$ of point in time i. By this means, a probability that could not be obtained before adding "1"—that is, reliability other than from point in time i−2 to point in time i+2—can be propagated. In order to propagate a new probability, it is necessary to add to area 4408 in FIG. 48. That is to say, reliability due to a "1" to the right of boundary line 4405 and lower than boundary line 4407 is propagated to data $X_i$ and parity $P_i$ of point in time i via a "1" added in area 4408.

Here, the width from the rightmost "1" to the leftmost "1" in each row of parity check matrix H in FIG. 48 is designated L. Thus far, a position at which "1" is added has been described in the column direction. Considering this in the row direction, in the parity check matrix in FIG. 47, "1" is added at a position L-2 or more to the left of the leftmost "1". Also, when described in terms of a parity check polynomial, α should be set to 5 or above and β to 5 or above in equation 13.

This will be considered represented by a general expression. A general expression for a convolutional code parity check polynomial is represented as shown in equation 15 below.

(Equation 15)

$$(D^K+\ldots+1)X(D)+(D^K+\ldots+1)P(D)=0 \quad [15]$$

When one "1" is added for data and parity respectively in an approximate lower triangular matrix of a parity check matrix, a parity check polynomial is represented as shown in equation 16 below.

(Equation 16)

$$(D^{\alpha}+D^K+\ldots+1)X(D)+(D^{\beta}+D^K+\ldots+1)P(D)=0 \quad [16]$$

In this case, α should be set to 2K+1 or above and β to 2K+1 or above, where $K \geq 2$.

Figure 49:
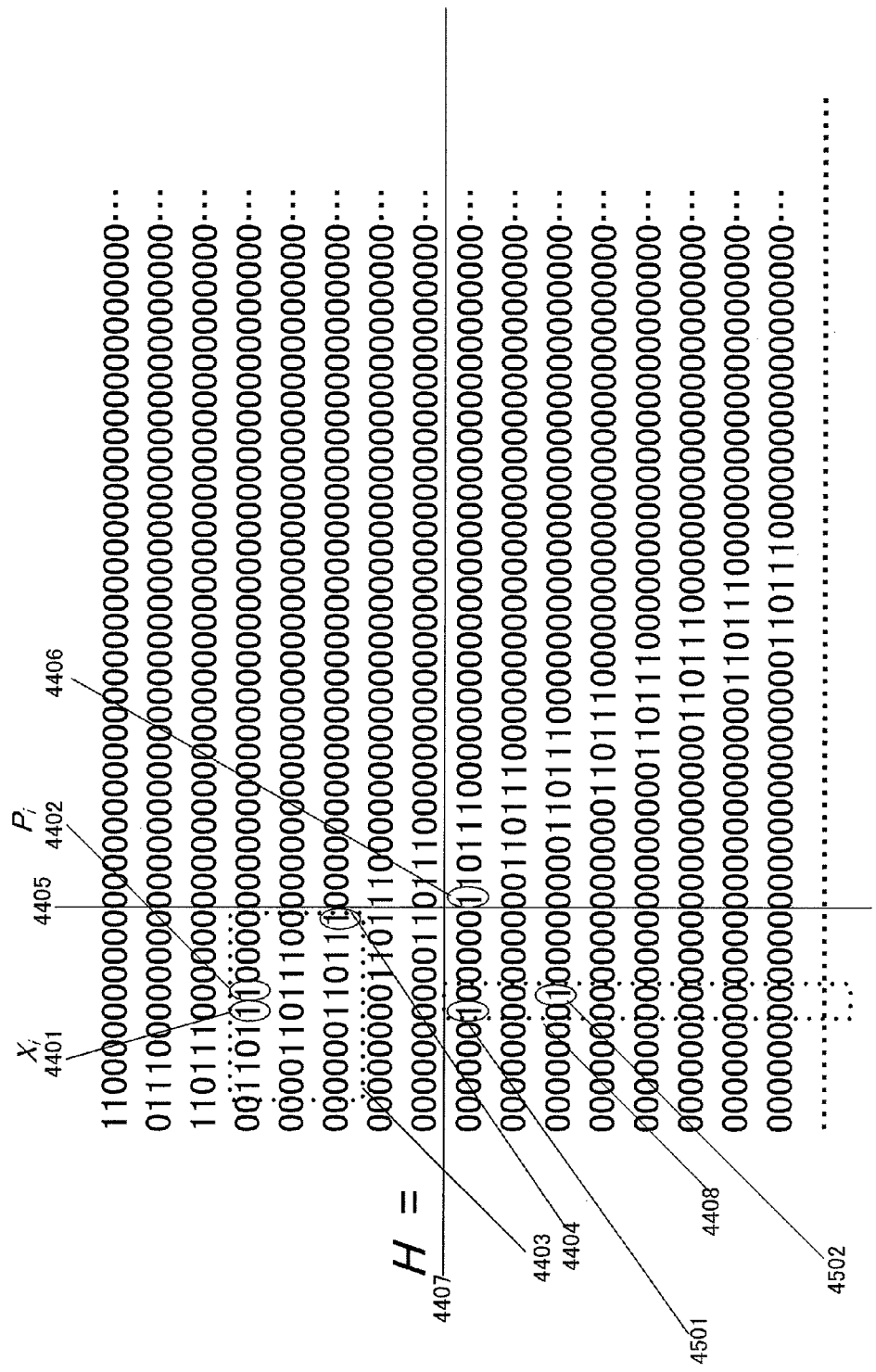
FIG. 49 is a drawing showing an example of a case in which "1" is added to an approximate lower triangular matrix of the parity check matrix in FIG. 48.
Figure 50:
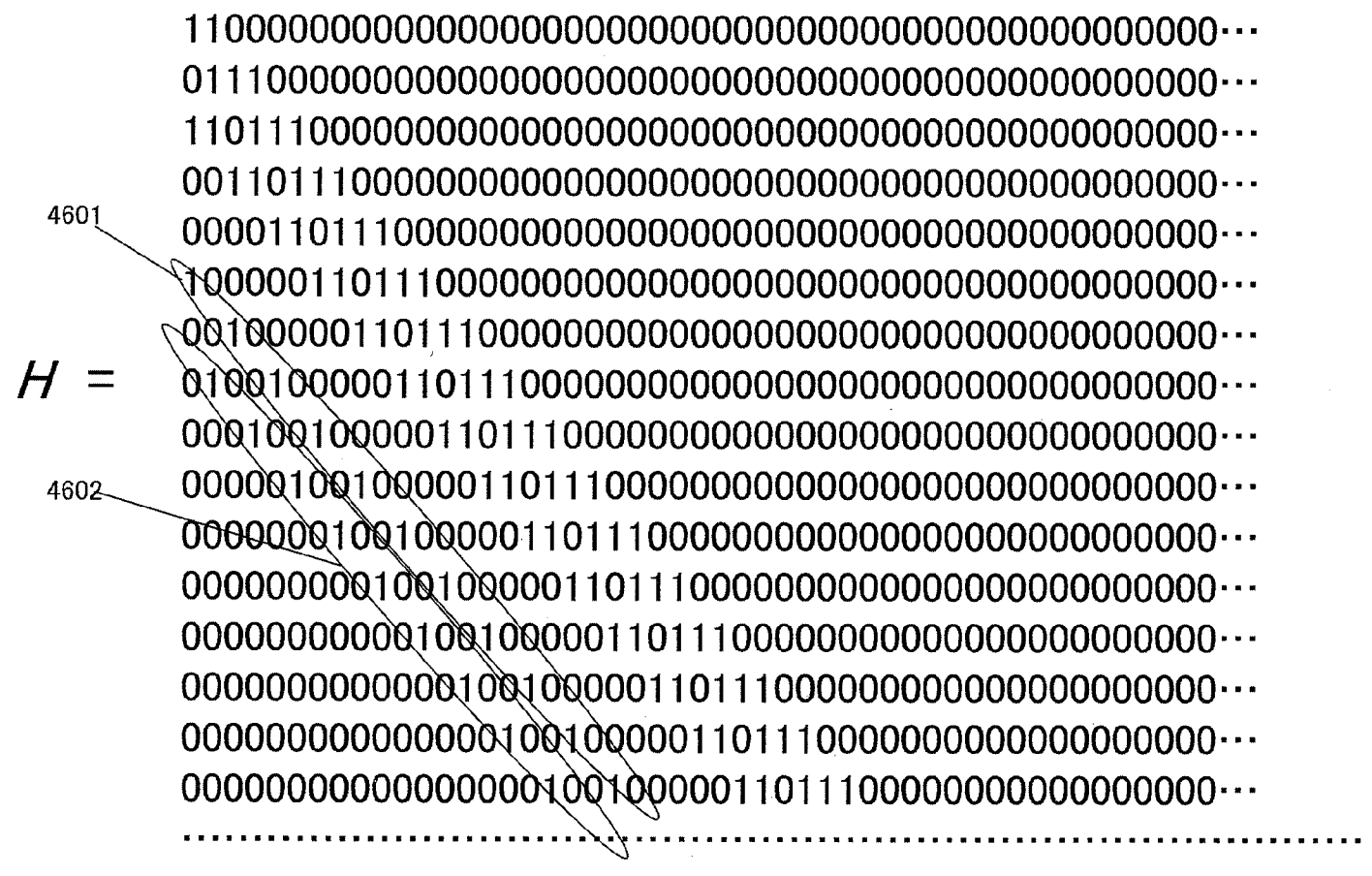

FIG. 49 is a drawing showing an example of a case in which "1" is added to the approximate lower triangular matrix of the parity check matrix in FIG. 48. When "1" is added for data and parity of all points in time, the parity check matrix is represented as shown in FIG. 50. FIG. 50 is a drawing showing an example of a configuration of a parity check matrix of an LDPC-CC according to this embodiment. In FIG. 50, "1"s inside areas 4601 and 4602 are added "1"s, and a code having parity check matrix H is an LDPC-CC according to this embodiment. At this time, a parity check polynomial is represented as shown in equation 17 below.

(Equation 17)

$$(D^5+D^2+1)X(D)+(D^7+D^2+D+1)P(D)=0 \quad [17]$$

Creating an LDPC-CC from a convolutional code by adding "1"s to an approximate lower triangular matrix of parity check matrix H in a transmitting apparatus as described above enables a receiving apparatus to obtain good reception quality by performing BP decoding or approximated BP decoding using a parity check matrix of the created LDPC-CC.

In this embodiment, a case has been described in which one "1" is added for data and for parity respectively, but the present invention is not limited to this, and a method may also be used, for example, whereby "1" is added for either data or parity. For example, provision may be made for "1" to be added for data and for "1" not to added for parity. As an example, consider a case in which there is no $D^{\beta}$ in equation 16 above. At this time, a receiving apparatus can obtain good reception quality if a is set to 2K+1 or above. Conversely, to consider a case in which there is no $D^{\alpha}$ in equation 16, at this time the receiving apparatus can obtain good reception quality if β is set to 2K+1 or above.

Reception quality is also greatly improved by a code in which a plurality of "1"s are added for both data and parity. For instance, as an example of a case in which a plurality of "1"s are inserted, a parity check polynomial of a certain convolutional code is assumed to be represented by equation 18. In equation 18, $K \geq 2$.

(Equation 18)

$$(D^K+\ldots+1)X(D)+(D^K+\ldots+1)P(D)=0 \quad [18]$$

When a plurality of "1"s are added to an approximate lower triangular matrix of parity check matrix H for data and parity, a parity check polynomial is represented as shown in equation 19 below.

(Equation 19)

$$(D^{\alpha 1}+\ldots+D^{\alpha n}+D^{K}+\ldots+1)X(D)+(D^{\beta 1}+\ldots+D^{\beta m}+D^{K}+\ldots+1)P(D)=0 \qquad [19]$$

In this case, good reception quality can be obtained by a receiving apparatus if $\alpha_1, \ldots, \alpha_n$ are set to 2K+1 or above and $\beta_1, \ldots, \beta_m$ are set to 2K+1 or above. This point is important in this embodiment.

However, good reception quality can still be obtained by the receiving apparatus if at least one of $\alpha_1, \ldots, \alpha_n$ is 2K+1 or above. Also, good reception quality can still be obtained by the receiving apparatus if at least one of $\beta_1, \ldots, \beta_m$ is 2K+1 or above.

Also, when an LDPC-CC parity check polynomial is represented as shown in equation 20 below, good reception quality can be obtained by a receiving apparatus if $\alpha_1, \ldots, \alpha_n$ are set to 2K+1 or above. This point is important in this embodiment.

(Equation 20)

$$(D^{\alpha 1}+\ldots+D^{\alpha n}+D^{K}+\ldots+1)X(D)+(D^{K}+\ldots+1)P(D)=0 \qquad [20]$$

However, good reception quality can still be obtained by the receiving apparatus if at least one of $\alpha_1, \ldots, \alpha_n$ is 2K+1 or above.

Similarly, when an LDPC-CC parity check polynomial is represented as shown in equation 21 below, good reception quality can be obtained by a receiving apparatus if $\beta_1, \ldots, \beta_m$ are set to 2K+1 or above. This point is important in this embodiment.

(Equation 21)

$$(D^{K}+\ldots+1)X(D)+(D^{\beta 1}+\ldots+D^{\beta m}+D^{K}+\ldots+1)P(D)=0 \qquad [21]$$

However, good reception quality can still be obtained by the receiving apparatus if at least one of $\beta_1, \ldots, \beta_m$ is 2K+1 or above.

Next, a method of designing an LDPC-CC from a parity check polynomial different from (7, 5) convolutional code equation 11 will be described in detail. Here, as an example, a case will be described in which two "1"s are added for data and two "1"s are added for parity.

Parity check polynomials different from (7, 5) convolutional code equation 11 are shown in Non-Patent Document 7. One example is represented as shown in equation 22 below.

(Equation 22)

$$(D^9+D^6+D^5+1)X(D)+(D^9+D^8+D^3+D+1)P(D)=0 \qquad [22]$$

Figure 51:
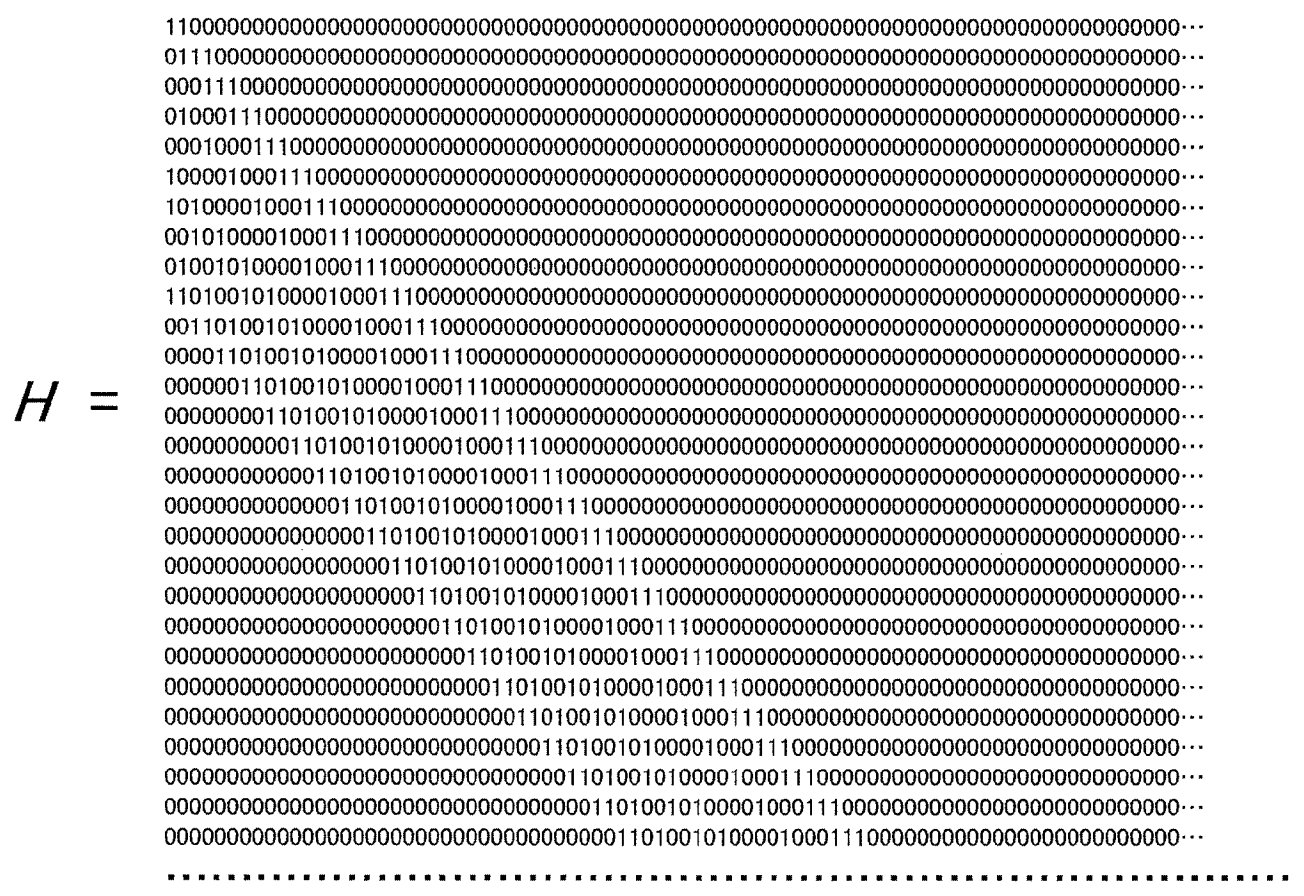

In this case, parity check matrix H can be represented as shown in FIG. 51.

<Encoding Method>

Here, a case will be described in which two "1"s are added to both data and parity for the parity check matrix in FIG. 51. When two "1"s are added to both data and parity in the approximate lower triangular matrix of parity check matrix H in FIG. 51, a parity check polynomial is represented as shown in equation 23 below.

(Equation 23)

$$(D^{\alpha 1}+D^{\alpha 2}+D^9+D^6+D^5+1)X(D)+(D^{\beta 1}+D^{\beta 2}+D^9+D^8+D^3+D+1)P(D)=0 \qquad [23]$$

Therefore, parity P(D) can be represented as shown in equation 24 below.

(Equation 24)

$$P(D)=(D^{\alpha 1}+D^{\alpha 2}+D^9+D^6+D^5+1)X(D)+(D^{\beta 1}+D^{\beta 2}+D^9+D^8+D^3+D)P(D) \qquad [23]$$

When "1" is added to an approximate lower triangular matrix of a parity check matrix, since $D^{\beta 1}P(D)$, $D^{\beta 2}P(D)$, $D^9P(D)$, $D^8P(D)$, $D^3P(D)$, and $DP(D)$ are past data and are known values, parity P(D) can easily be found.

<Positions at which "1" is Added>

Figure 52:
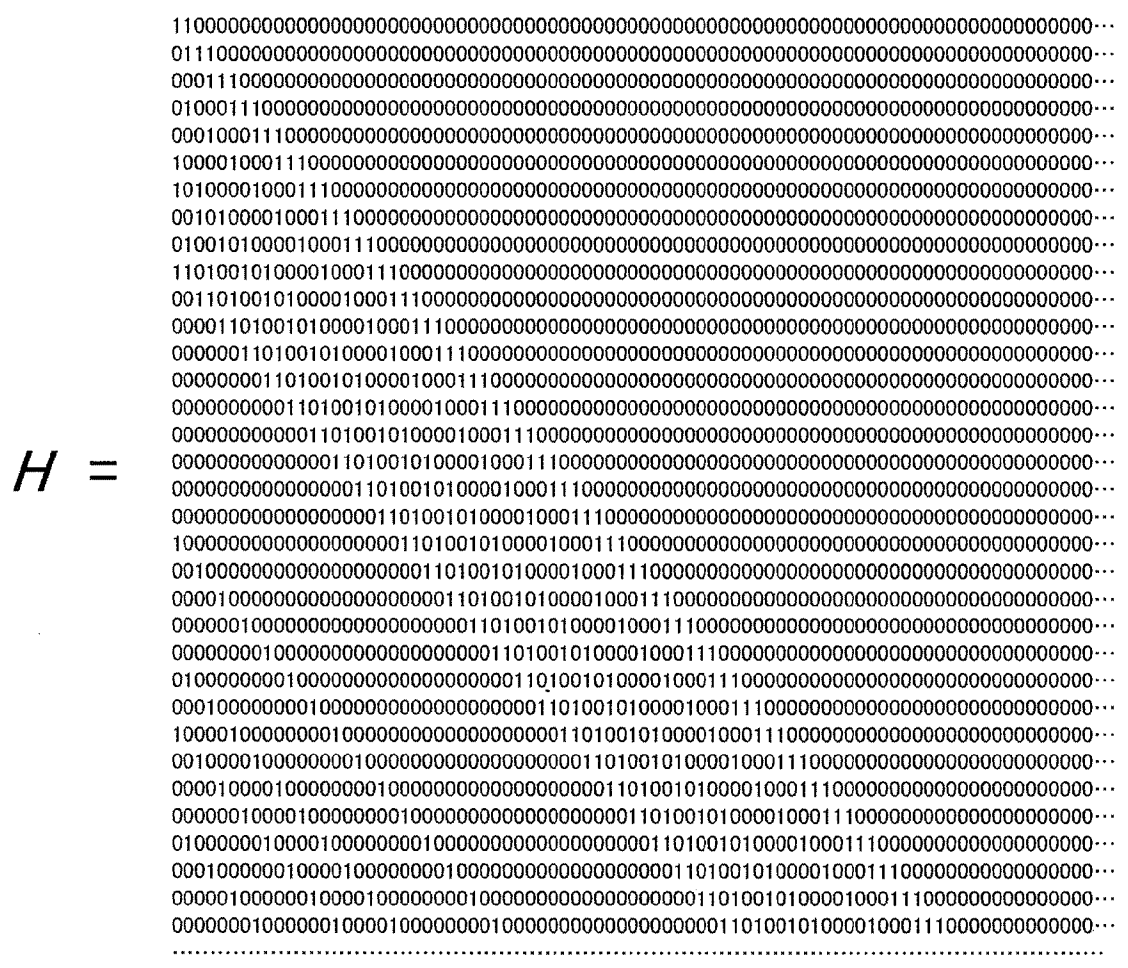

Good reception quality can be obtained by a receiving apparatus if $\alpha_1, \alpha_2$ are set to 19 or above and $\beta_1, \beta_2$ are set to 19 or above in order to obtain the same kind of effect as described above. As an example, it will be assumed that settings $\alpha_1=26$, $\alpha_2=19$, $\beta_1=30$, and $\beta_2=24$ are made for the parity check matrix in FIG. 52. By this means, for the same reason as given above, good reception quality can be obtained by the receiving apparatus.

From the above example, a method of creating an LDPC-CC from a convolutional code comprises the kind of procedure described below. The following procedure is an example of a case in which the convolutional code has a coding rate of ½.

<1> Select a convolutional code that gives good characteristics.

<2> Generate a parity check polynomial for the selected convolutional code (for example, equation 15). It is important to use the selected convolutional code as a systematic code. A parity check polynomial is not limited to one as described above. It is necessary to select a parity check polynomial that gives good reception quality. At this time, it is preferable to use an equivalent check polynomial of a higher order than a parity check polynomial generated from a generating polynomial (see Non-Patent Document 7).

<3> Create parity check matrix H for the selected convolutional code.

<4> Consider probability propagation for data or (and) parity, and add "1"s to the parity check matrix. Positions at which "1" is added are as explained above.

In this embodiment, a method of creating an LDPC-CC from a (7, 5) convolutional code has been described, but the present invention is not limited to a (7, 5) convolutional code, and can be similarly implemented using another convolutional code. Details of generating polynomial G of a convolutional code that gives good reception quality at this time are given in Non-Patent Document 8.

As described above, according to this embodiment, by having a transmitting apparatus set $\alpha_1, \ldots, \alpha_n$ to 2K+1 or above and set $\beta_1, \ldots, \beta_m$ to 2K+1 or above in equation 19 and create an LDPC-CC from a convolutional code, a receiving apparatus can obtain good reception quality by performing BP decoding or approximated BP decoding using a parity check matrix of the created LDPC-CC. Also, when an LDPC-CC is created from a convolutional code, the size of a plot-graph—that is, a parity check polynomial—is much smaller than that of a plot-graph shown in Non-Patent Document 9 or Non-Patent Document 10, and therefore the number of redundant bits generated when transmitting a packet for which the number of transmission data bits is small can be reduced, and the problem of a decrease in data transmission efficiency can be suppressed.

The above description will be related to LDPC-CC encoder configurations and LDPC-CC parity check matrices described in Embodiment 1 through Embodiment 5.

The maximum order related to data X(D) of an original convolutional code will be designated α. An LDPC-CC will be considered in which "1" is added for parity P(D) in an approximate lower triangular matrix of parity check matrix H and a $D^\beta$ term is added for parity P(D) of a parity check polynomial in this case. Here, β is the maximum order related to parity P(D) of an LDPC-CC created in accordance with the above description. At this time, good reception quality can be obtained by setting β to 2α+1 or above, as described in this embodiment.

Data X(D) is generated by a first encoder. That is to say, if the memory length of the first encoder is designated M1, since α is the maximum order related to data X(D), α corresponds to M1.

Also, parity P(D) is generated by a second encoder. That is to say, if the memory length of the second encoder is designated M2 since β is the maximum order related to parity P(D), β corresponds to M2.

At this time, equation 25 is obtained from relationship β≧2α+1 for obtaining good reception performance, α=M1, and β=M2.

(Equation 25)

$$\beta/\alpha = M2/M1 \geq 2 + 1/\alpha > 2 \quad [25]$$

That is to say, by employing a configuration such that first encoder memory length M1 and second encoder memory length M2 satisfy equation 25, an effect of enabling the termination sequence length and associated termination code sequence length described in Embodiment 1 through Embodiment 5 to be shortened can be obtained, together with an effect of enabling good reception performance to be obtained.

In other words, if second encoder memory length M2 is made at least twice as long as first encoder memory length M1, the termination sequence length can be shortened, and good reception performance can be obtained.

(M1×b) is the maximum value of the difference between the index of the leftmost column in which a 1 is present and the index of the rightmost column in which a 1 is present in each row of an partial parity check matrix for information bits obtained by extracting columns corresponding to information bits of a parity check matrix. Also, M2×(c−b) is the maximum value of the difference between the index of the leftmost column in which a 1 is present and the index of the rightmost column in which a 1 is present in each row of a partial parity check matrix for parity bits obtained by extracting columns corresponding to parity bits of a parity check matrix. Therefore, when coding rate R=b/c, generating an LDPC-CC codeword sequence using an partial parity check matrix for information bits and partial parity check matrix for parity bits such that M2 is at least twice as long as M1 enables the termination sequence length to be shortened and also enables good reception performance to be obtained.

Additional Embodiment 2

Below, a detailed description is given of an example of an LDPC-CC suitable for the configurations of Embodiment 1 through Embodiment 5.

In this embodiment, a description is given of a configuration of a time-variant LDPC-CC that allows puncturing to be performed easily and that has a simple encoder configuration. In particular, in this embodiment an LDPC-CC is described that enables data to be punctured periodically. With regard to LDPC codes, sufficient investigation has not so far been carried out into a puncturing method that punctures data periodically, and in particular, there has not been sufficient discussion of a method of performing puncturing easily. With an LDPC-CC according to this embodiment, data is not punctured randomly, but can be punctured periodically and in a regular manner, and degradation of reception quality can be suppressed. Below, a method is described for configuring a time-variant LDPC-CC for which coding rate R=½ that is capable of implementing the above.

With a coding rate of ½, if an information sequence (data) polynomial representation is X(D), and a parity sequence polynomial representation is P(D), a parity check polynomial is represented as shown below.

(Equation 26)

$$(D^{a1} + \ldots + D^{an} + 1)X(D) + (D^{b1} + \ldots + D^{bm} + 1)P(D) = 0 \quad [26]$$

In equation 26, it is assumed that a1, a2, ..., an are integers of 1 or above (where a1≠a2≠ ... ≠an), and b1, b2, ..., bm are integers of 1 or above (where b1≠b2≠ ... ≠bm). Here, in order to make it possible to perform encoding easily, it is assumed that terms $D^0X(D)$ and $D^0P(D)$ (where $D^0=1$) are present. Therefore, P(D) is represented as shown below.

(Equation 27)

$$P(D) = (D^{a1} + \ldots + D^{an} + 1)X(D) + (D^{b1} + \ldots + D^{bm})P(D) \quad [27]$$

As can be seen from equation 27, since $D^0=1$ is present and past parity terms—that is, b1, b2, ..., bm—are integers of 1 or above, parity P can be found sequentially.

Next, a coding-rate-½ parity check polynomial different from equation 26 is represented as shown below.

(Equation 28)

$$(D^{A1} + \ldots + D^{AN} + 1)X(D) + (D^{B1} + \ldots + D^{BM} + 1)P(D) = 0 \quad [28]$$

In equation 28, it is assumed that A1, A2, ..., AN are integers of 1 or above (where A1≠A2≠ ... ≠AN), and B1, B2, ..., BM are integers of 1 or above (where B1≠B2≠ ... ≠BM). Here, in order to make it possible to perform encoding easily, it is assumed that terms $D^0X(D)$ and $D^0P(D)$ (where $D^0=1$) are present. At this time, P(D) is represented as shown in equation 29.

(Equation 29)

$$P(D) = (D^{A1} + \ldots + D^{AN} + 1)X(D) + (D^{B1} + \ldots + D^{BM})P(D) \quad [29]$$

Below, data X and parity P of point in time 2i are represented by $X_{2i}$ and $P_{2i}$ respectively, and data X and parity P of point in time 2i+1 are represented by $X_{2i+1}$ and $P_{2i+1}$ respectively (where i is an integer).

In this embodiment, an LDPC-CC with a time-variant period of 2 is proposed whereby parity $P_{2i}$ of point in time 2i is calculated using equation 27 and parity $P_{2i+1}$ of point in time 2i+1 is calculated using equation 29. In the same way as in the above embodiments, an advantage is that parity can easily be found sequentially.

Below, a description will be given using equation 30 and equation 31 as examples of equation 26 and equation 28.

(Equation 30)

$$(D^{396} + D^{237} + D^{114} + D^{97} + 1)X(D) + (D^{390} + D^{383} + D^{334} + D^{276} + 1)P(D) = 0 \quad [30]$$

(Equation 31)

$$(D^{170} + D^{166} + D^{153} + D^{135} + 1)X(D) + (D^{363} + D^{279} + D^{273} + D^{63} + 1)P(D) = 0 \quad [31]$$

At this time, parity check matrix H can be represented as shown in FIG. 53. In FIG. 53, (Ha,11) is a part corresponding to equation 30, and (Hc,11) is a part corresponding to equation 30. When BP decoding was performed using the parity check matrix in FIG. 53—that is, a time-variant-period-2 parity check matrix—it was confirmed that data reception quality improved greatly as compared with LDPC-CCs described in Embodiment 1 through embodiment 5.

A case has been described above in which the time-variant period is 2, but the time-variant period is not limited to 2. However, if the time-variant period is too large, it is difficult to perform puncturing periodically, and it may be necessary to perform puncturing randomly, for example, with a resulting possibility of degradation of reception quality. Below, the advantage of reception quality being improved by decreasing the time-variant period is explained.

Figure 54:
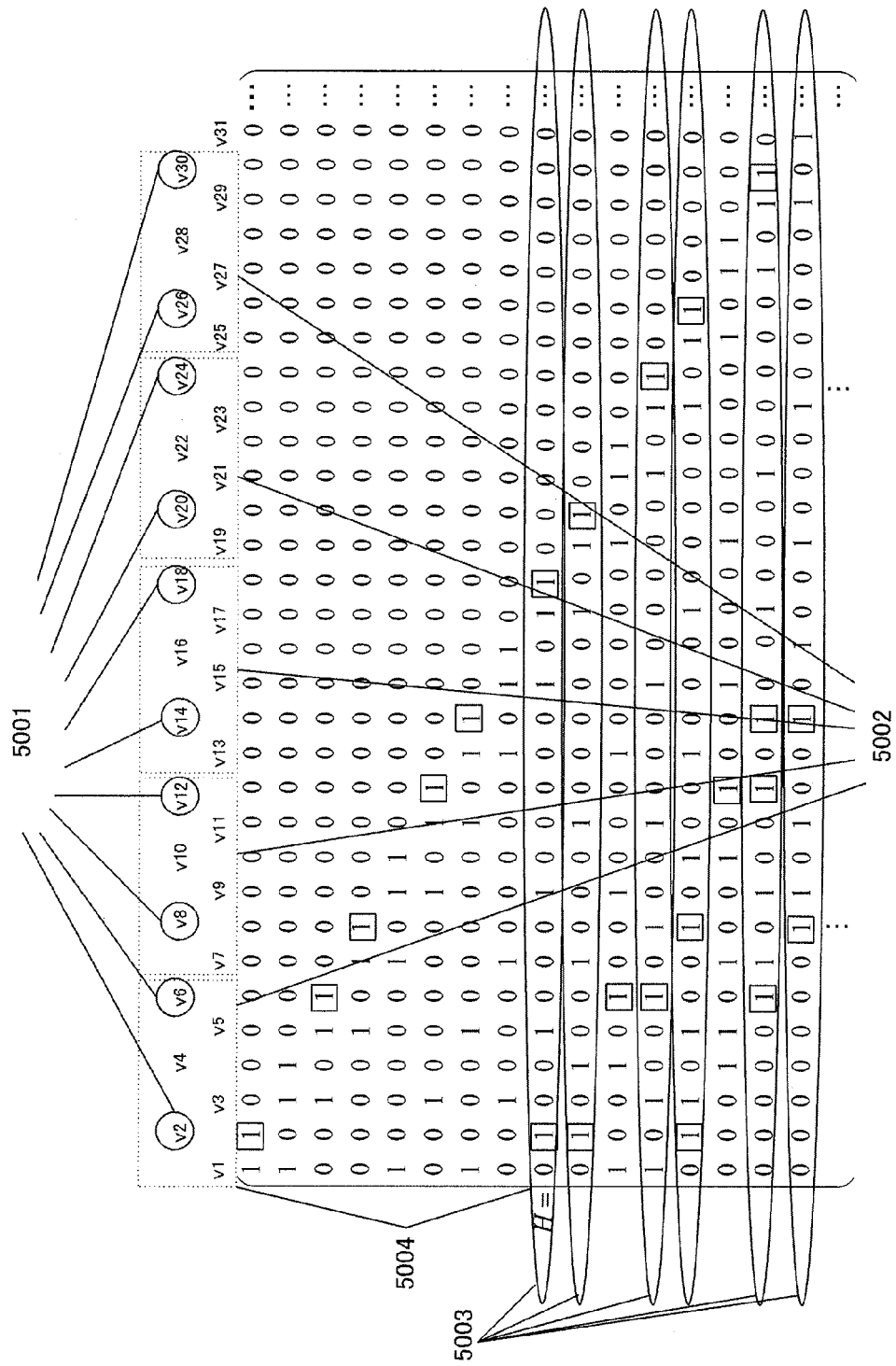
FIG. 54 is a drawing showing an example of a configuration of a parity check matrix of a time-variant-period-1 LDPC-CC according to Additional Embodiment 2.

FIG. 54 shows an example of a puncturing method in a time-variant-period-1 case. In FIG. 54, H is a parity check matrix of an LDPC-CC, and if a transmission sequence vector is designated v, the relationship in equation 32 holds true.

(Equation 32)

$$Hv = 0 \qquad [32]$$

Here, transmission sequence vector $v=(v1, v2, v3, v4, v5, v6, \ldots, v2i, v2i+1, \ldots)$.

FIG. 54 shows an example of a case in which a transmission sequence for which coding rate $R=\frac{1}{2}$ is punctured, giving coding rate $R=\frac{3}{4}$. When puncturing is performed periodically, a block period for selecting puncture bits is first set. FIG. 54 shows an example in which the block period is made 6, and blocks are set as shown by the dotted lines (5002). Then two bits of the six bits forming one block are selected as puncture bits, and the selected two bits are set as non-transmitted bits. In FIG. 54, circled bits 5001 are non-transmitted bits. In this way, a coding rate of ¾ can be implemented. Therefore, the transmission data sequence becomes v1, v3, v4, v5, v7, v9, v11, v13, v15, v16, v17, v19, v21, v22, v23, v25, . . . .

A "1" inside a square in FIG. 54 has no initial logarithmic likelihood ratio at the time of reception due to puncturing, and therefore its logarithmic likelihood ratio is set to 0.

In BP decoding, row computation and column computation are performed iteratively. Therefore, if two or more bits for which there is no initial logarithmic likelihood ratio (bits with a 0 logarithmic likelihood ratio) (eliminated bits) are included in the same row, logarithmic likelihood ratio updating is not performed by only row computation for that row until the logarithmic likelihood ratio of a bit for which there is no initial logarithmic likelihood ratio (a bit with a 0 logarithmic likelihood ratio) is updated by column computation. That is to say, reliability is not propagated by only row computation, and iteration of row computation and column computation is necessary in order to propagate reliability. Therefore, if there are many such rows, reliability is not propagated in a case such as when there is a limit on the number of iteration processes in BP decoding, causing degradation of reception quality. In the example shown in FIG. 54, a bit corresponding to a 1 inside a square indicates an eliminated bit, and rows 5003 are rows for which reliability is not propagated by only row computation—that is, rows that cause degradation of reception quality.

Therefore, as a puncture bit (non-transmitted bit) decision method—that is, a puncture pattern decision method—it is necessary to find a method whereby rows for which reliability is not propagated only due to puncturing are made as few as possible. Finding a puncture bit selection method is described below.

When two bits of the six bits forming one block are selected as puncture bits, there are ${}_{3\times 2}C_2$ 2-bit selection methods. Of these, selection methods whereby cyclic shifting is performed within six bits of a block period can be regarded as identical. A supplementary explanation is given below using FIG. 56A. As an example, FIG. 56A shows six puncture patterns when two of six bits are punctured consecutively. As shown in FIG. 56A, puncture patterns #1 through #3 become identical puncture patterns by changing the block delimiter. Similarly, puncture patterns #4 through #6 become identical puncture patterns by changing the block delimiter. Thus, selection methods whereby cyclic shifting is performed within six bits of a block period can be regarded as identical. Therefore, there are ${}_{3\times 2}C_2 \times 2/(3\times 2) = 5$ puncture bit selection methods.

When one block is composed of L×k bits, and k bits of the L×k bits are punctured, the number of puncture patterns found by means of equation 33 exist.

$$\frac{2}{L \times k} \times {}_{L \times k}C_k \qquad \text{(Equation 33)}$$

The relationship between an encoding sequence and a puncture pattern when focusing on one puncture pattern is shown in FIG. 56B. As can be seen from FIG. 56B, when two bits of six bits forming one block are punctured, existing parity check equation patterns for one puncture pattern are $(3\times 2) \times \frac{1}{2}$. Similarly, when one block is composed of L×k bits, and k bits of the L×k bits are punctured, the number of puncture patterns found by means of equation 34 exist for one puncture pattern.

$$L \times k \times \frac{1}{2} \qquad \text{(Equation 34)}$$

Therefore, in a puncture pattern selection method, it is necessary to check whether or not reliability is only propagated for the number of parity check equations (rows) found from equation 35.

$$\frac{2}{3\times 2} \times {}_{3\times 2}C_2 \times 3 \times 2 \times \frac{1}{2} = 15 \qquad \text{(Equation 35)}$$

From the above relationship, when making a coding rate of ¾ from a coding-rate-½ code, if k bits of an L×k-bit block are punctured it is necessary to check whether or not reliability is only propagated for the number of parity check equations (rows) found from equation 36.

$$\frac{2}{L \times k} \times {}_{L \times k}C_k \times L \times k \times \frac{1}{2} \qquad \text{(Equation 36)}$$

Then, if a good puncture pattern cannot be found, it is necessary to increment L and k.

Next, a case in which the time-variant period is m will be considered. In this case, also, in the same way as when the time-variant period is 1, m different parity check equations represented by equation 26 are provided. Below, m parity check equations are designated "parity check equation #1, parity check equation #2, . . . , parity check equation #m".

Consider an LDPC-CC for which parity $P_{m,i+1}$ of point in time mi+1 is found using "parity check equation #1", parity $P_{mi+2}$ of point in time mi+2 is found using "parity check equation #2", . . . , and parity $P_{mi+m}$ of point in time mi+m is found using "parity check equation #m". At this time, following the same line of thought as in the case of FIG. 53, a parity check matrix is as shown in FIG. 55. Thus, when making a coding rate of ¾ from a coding-rate-½ code, for a case in which two bits of a 6-bit block are punctured, for example, following the same line of thought as in the case of equation 35, it is necessary to check whether or not reliability is only propagated for the number of parity check equations (rows) found from equation 37.

$$\frac{2}{3 \times 2} \times {}_{3\times 2}C_2 \times LCM\{3, m\} = 5 \times LCM\{3, m\} \qquad \text{(Equation 37)}$$

In equation 37, LCM{α,β} represents the least common multiple of natural number α and natural number β.

As can be seen from equation 37, as m increases, parity check equations that must be checked increase. Consequently, a puncturing method whereby puncturing is performed periodically is not suitable, and, for example, a method whereby puncturing is performed randomly is used, with a resultant possibility of reception quality degrading.

FIG. 56C shows the number of parity check polynomials that must be checked when generating encoding sequences for which coding rate R=⅔, ¾, and ⅚ by puncturing k bits of the L×k bits by means of puncturing.

Realistically, a time-variant period enabling an optimal puncture pattern to be found is between 2 and 10 or so. In particular, taking a time-variant period enabling an optimal puncture pattern to be found and an improvement in reception quality into consideration, a time-variant period of 2 is suitable. There is also an advantage of being able to configure an encoder/decoder extremely simply if the kind of parity check equations shown in equation 26 and equation 28 are repeated periodically with a time-variant period of 2.

In the case of time-variant periods of 3, 4, 5, . . . , 10, although an encoder/decoder configuration is slightly larger than when the time-variant period is 2, as in the case of a time-variant period of 2 a simple configuration can be employed when periodically repeating a plurality of parity check equations based on equation 26 and equation 28.

When a time-variant period is semi-infinite (an extremely long period), or an LDPC-CC is created from an LDPC-BC, the time-variant period is generally extremely long, and therefore it is difficult to employ a method whereby puncture bits are selected periodically and to find an optimal puncture pattern. Employing a method whereby puncture bits are selected randomly could be considered, for example, but there is a possibility of reception quality degrading greatly when puncturing is performed.

In equations 26, 28, 30, and 31, a parity check polynomial can also be represented by multiplying both sides by $D^n$. In this embodiment, it has been assumed that terms $D^0X(D)$ and $D^0P(D)$ (where $D^0=1$) are present in equations 26, 28, 30, and 31.

In this way, parity can be computed sequentially, with the result that the encoder configuration is simple, and furthermore, in the case of a systematic code, if reliability propagation to data of point in time i is considered, reliability propagation to data can easily be understood if a $D^0$ term is present in both data and parity, enabling code design to be carried out easily. If simplicity of code design is not taken into consideration, it is not necessary for a $D^0X(D)$ term to be present in equations 26, 28, 30, and 31.

Figure 57A:
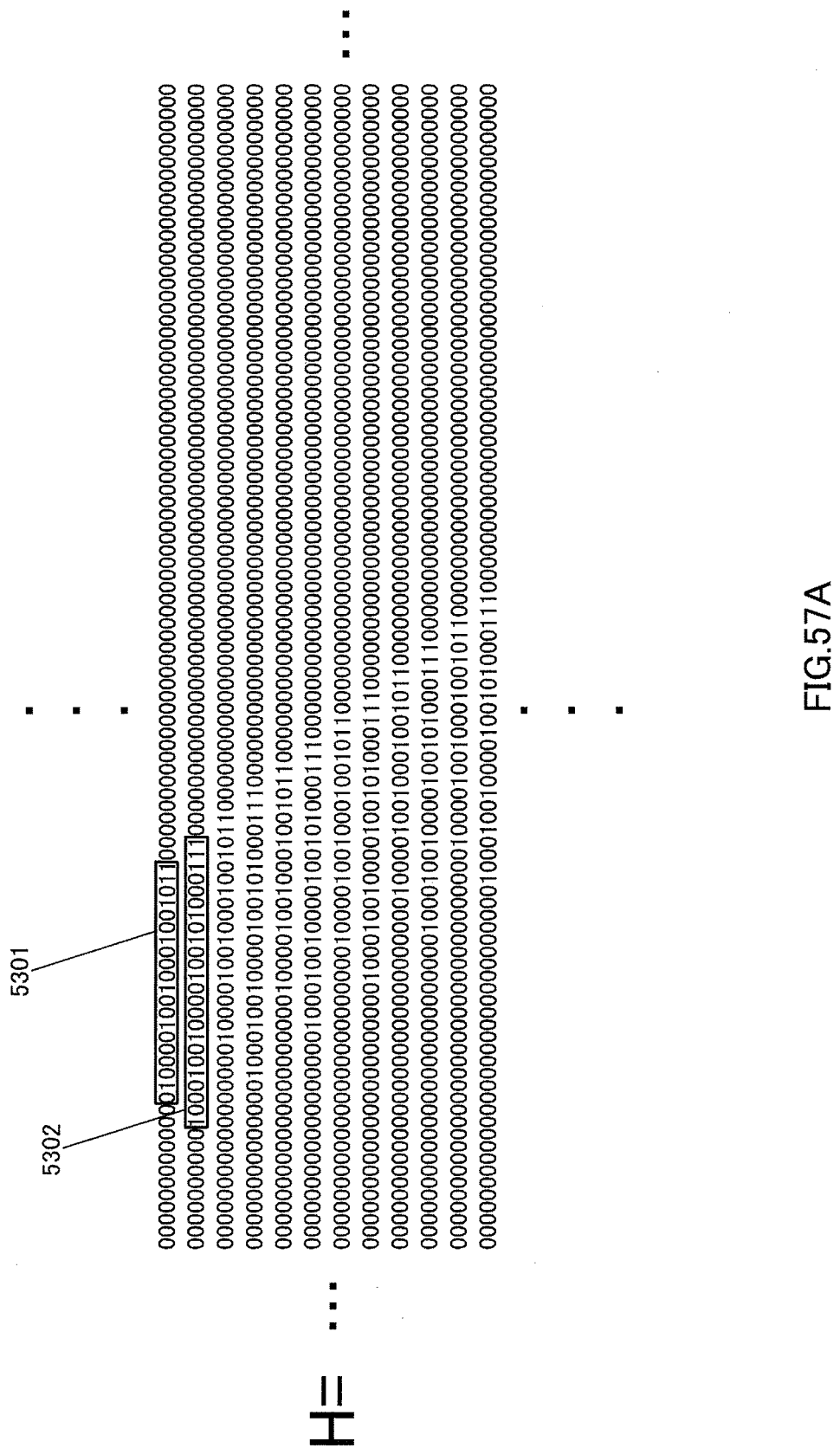
FIG. 57A is a drawing showing an example of a configuration of a parity check matrix of a time-variant-period-2 LDPC-CC.

FIG. 57A shows an example of a parity check matrix of a time-variant-period-2 LDPC-CC. As shown in FIG. 57A, in the case of a time-variant period of 2, two parity check equations—parity check equation 5301 and parity check equation 5302—are used alternately.

Figure 57B:
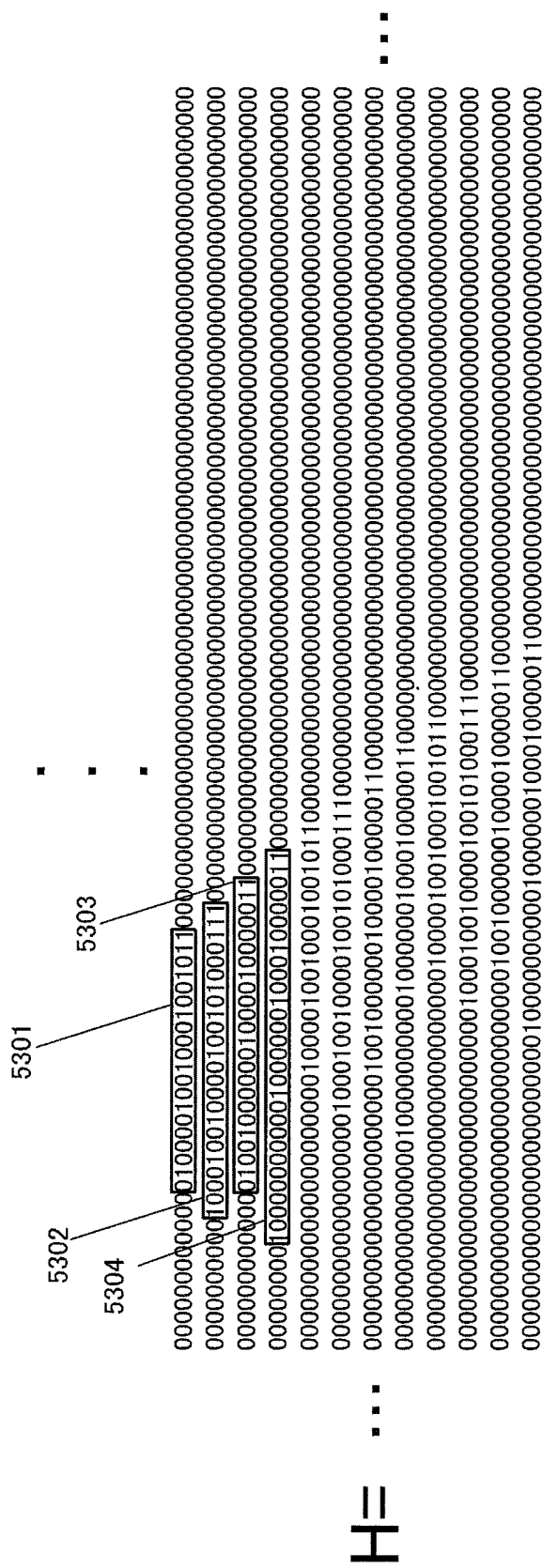
FIG. 57B is a drawing showing an example of a configuration of a parity check matrix of a time-variant-period-4 LDPC-CC.

FIG. 57B shows an example of a parity check matrix of a time-variant-period-4 LDPC-CC. As shown in FIG. 57B, in the case of a time-variant period of 4, four parity check equations—parity check equation 5301, parity check equation 5302, parity check equation 5303, and parity check equation 5304—are used alternately.

As described above, according to this embodiment, provision is made for a parity sequence to be found by means of a time-variant-period-2 parity check matrix comprising parity check polynomial 26 and parity check polynomial 28 different from equation 26. The time-variant period is not limited to 2, and, for example, provision may also be made for a parity sequence to be found using a time-variant-period-4 parity check matrix such as shown in FIG. 57B. However, if time-variant period m is too large, it is difficult to perform puncturing periodically, and it may be necessary to perform puncturing randomly, for example, resulting in degradation of reception quality. Realistically, a time-variant period enabling an optimal puncture pattern to be found is between 2 and 10 or so. In this case, reception quality can be improved and puncturing can be performed periodically, enabling an LDPC-CC encoder to be configured simply.

It has been confirmed that good reception quality is obtained if the row weight in parity check matrix H—that is, the number of 1 elements among row elements of the parity check matrix—is between 7 and 12. Considering a code for which the minimum distance is excellent in a convolutional code, as described in Non-Patent Document 8, if the fact that row weight increases as constraint length increases—with, for example, the row weight being 14 in the case of a feedback convolutional code with a constraint length of 11—is taken into consideration, making the row weight between 7 and 12 can be considered to be a unique feature of an LDPC-CC of this proposal. Also, if code design merit is taken into consideration, design is simplified if the same row weight is used for each row of a parity check matrix of an LDPC-CC.

In the above description, a case in which the coding rate is ½ has been described, but the present invention is not limited to this, and a parity sequence can also be found using a time-variant-period-m parity check matrix with a coding rate other than ½, and the same kind of effect can also be obtained with a time-variant period between 2 and 10 or so.

In particular, if coding rate R=⅚, ⅞, or above, a puncture pattern is selected so as to avoid a configuration comprising only rows including two or more eliminated bits in a time-variant-period-2 or time-variant-period-m LDPC-CC described in this embodiment. That is to say, selecting a puncture pattern such that there is a row for which the number of eliminated bits is zero or one is important in obtaining good reception quality when the coding rate is high, such as when coding rate R=⅚, ⅞, or above.

When an encoding method described in Embodiment 1 through Embodiment 5 or the encoding method described in Additional Embodiment 1 is used for an above-described LDPC-CC, puncturing can be performed periodically and in a regular manner, enabling an encoder to be configured simply, enabling good reception quality to be obtained, and also enabling an extremely excellent code to be generated that allows a termination sequence to be shortened.

Additional Embodiment 3

In this embodiment, a time-variant LDPC-CC is described that uses a parity check equation such that "1"s are present in an upper trapezoidal matrix of the parity check matrix, and that enables an encoder to be configured simply. A method is described below for configuring a time-variant LDPC-CC for which coding rate R=½ that is capable of implementing the above.

With a coding rate of ½, if an information sequence (data) polynomial representation is X(D), and a parity sequence polynomial representation is P(D), a parity check polynomial is represented as shown below.

(Equation 38)

$$(D^{a1}+\ldots+D^{an}+1+D^{c1}+\ldots+D^{cq})X(D)+(D^{b1}+\ldots+D^{bm}+1)P(D)=0 \quad [38]$$

In equation 38, it is assumed that a1, a2, ..., an are integers of 1 or above (where a1≠a2≠...≠an), b1, b2, bm are integers of 1 or above (where b1≠b2≠...≠bm), and c1, c2, cq are integers of −1 or below (where c1≠c2≠...≠cq). At this time, P(D) is represented as shown below.

(Equation 39)

$$P(D)=(D^{a1}+\ldots+D^{an}+1+D^{c1}+\ldots+D^{cq})X(D)+(D^{b1}+\ldots+D^{bm})P(D) \quad [39]$$

Parity P can be found sequentially in the same way as in Additional Embodiment 2.

Next, equation 40 and equation 41 will be considered as coding-rate-½ parity check polynomials different from equation 38.

(Equation 40)

$$(D^{A1}+\ldots+D^{AN}+1)X(D)+(D^{B1}+\ldots+D^{BM}+1)P(D)=0 \quad [40]$$

(Equation 41)

$$(D^{A1}+\ldots+D^{AN}+1+D^{C1}+\ldots+D^{CQ})X(D)+(D^{B1}+\ldots+D^{BM}+1)P(D)=0 \quad [41]$$

In equation 40 and equation 41, it is assumed that A1, A2, ..., AN are integers of 1 or above (where A1≠A2≠...≠AN), B1, B2, ..., BM are integers of 1 or above (where B1≠B2≠...≠BM), and C1, C2, ..., CQ are integers of −1 or below (where C1≠C2≠...≠CQ). At this time, P(D) is represented as shown below.

(Equation 42)

$$P(D)=(D^{A1}+\ldots+D^{AN}+1)X(D)+(D^{B1}+\ldots+D^{BM})P(D) \quad [42]$$

(Equation 43)

$$P(D)=(D^{A1}+\ldots+D^{AN}+1+D^{C1}+\ldots+D^{CQ})X(D)+(D^{B1}+\ldots+D^{BM})P(D) \quad [43]$$

Below, data X and parity P of point in time $2i$ are represented by $X_{2i}$ and $P_{2i}$ respectively, and data X and parity P of point in time $2i+1$ are represented by $X_{2i+1}$ and $P_{2i+1}$ respectively (where i is an integer).

At this time, an LDPC-CC with a time-variant period of 2 for which parity $P_{2i}$ of point in time $2i$ is found using equation 39 and parity $P_{2i+1}$ of point in time $2i+1$ is found using equation 42, or an LDPC-CC with a time-variant period of 2 for which parity $P_{2i}$ of point in time $2i$ is found using equation 39 and parity $P_{2i+1}$ of point in time $2i+1$ is found using equation 43, is considered.

An LDPC-CC of this kind provides the following advantages:
An encoder can be configured simply, and parity can be found sequentially.
Puncture bits can be set periodically.
Termination bit reduction and termination-time puncture-time reception quality improvement can be expected.

Next, an LDPC-CC for which the time-variant period is m is considered. In the same way as when the time-variant period is 2, "parity check equation #1" represented by equation 40 is provided, and "parity check equation #2" through "parity check equation #m" represented by either equation 40 or equation 41 are provided. Data X and parity P of point in time mi+1 are represented by $X_{mi+1}$ and $P_{mi+1}$ respectively, data X and parity P of point in time mi+2 are represented by $X_{mi+2}$ and $P_{mi+2}$ respectively, ..., and data X and parity P of point in time mi+m are represented by $X_{mi+m}$ and $P_{mi+m}$ respectively (where i is an integer).

Consider an LDPC-CC for which parity $P_{mi+1}$ of point in time mi+1 is found using "parity check equation #1", parity $P_{mi+2}$ of point in time mi+2 is found using "parity check equation #2", ..., and parity $P_{mi+m}$ of point in time mi+m is found using "parity check equation #m". An LDPC-CC of this kind provides the following advantages:
An encoder can be configured simply, and parity can be found sequentially.
Termination bit reduction and termination-time puncture-time reception quality improvement can be expected.

As described above, according to this embodiment, a parity sequence can be found by means of a time-variant-period-2 parity check matrix comprising parity check polynomial 38 and parity check polynomial 40 different from equation 38.

Thus, when a parity check equation is used for which "1"s are present in an upper trapezoidal matrix of a parity check matrix, a time-variant LDPC-CC encoder can be configured simply. The time variation period is not limited to 2. However, when a method is employed whereby puncturing is performed periodically, a time-variant period enabling an optimal puncture pattern to be found is realistically between 2 and 10 or so.

In the case of time-variant periods of 3, 4, 5, ..., 10, although an encoder/decoder configuration is slightly larger than when the time-variant period is 2, as in the case of a time-variant period of 2 a simple configuration can be employed when periodically repeating equation 40 and equation 41 parity check equations.

In equations 38, 40, and 41, a parity check polynomial can also be represented by multiplying both sides by $D^n$. In this embodiment, it has been assumed that terms $D^0 X(D)$ and $D^0 P(D)$ (where $D^0=1$) are present in equations 38, 40, and 41.

In this way, parity can be computed sequentially, with the result that the encoder configuration is simple, and furthermore, in the case of a systematic code, if reliability propagation to data of point in time i is considered, reliability propagation to data can easily be understood if a $D^0$ term is present in both data and parity, enabling code design to be carried out easily. If simplicity of code design is not taken into consideration, it is not necessary for a $D^0 X(D)$ term to be present in equations 38, 40, and 41.

It has been confirmed that good reception quality is obtained if the row weight in parity check matrix H—that is, the number of 1 elements among row elements of the parity check matrix—is between 7 and 12. Considering a code for which the minimum distance is excellent in a convolutional code, as described in Non-Patent Document 8, if the fact that row weight increases as constraint length increases—with, for example, the row weight being 14 in the case of a feedback convolutional code with a constraint length of 11—is taken into consideration, making the row weight between 7 and 12 can be considered to be a unique feature of an LDPC-CC of this proposal. Also, if code design merit is taken into consideration, design is simplified if the same row weight is used for each row of a parity check matrix of an LDPC-CC.

When an encoding method described in Embodiment 1 through Embodiment 5 or the encoding method described in Additional Embodiment 1 is used for an above-described LDPC-CC, puncturing can be performed periodically and in a regular manner, enabling an encoder to be configured simply, enabling good reception quality to be obtained, and also enabling an extremely excellent code to be generated that allows a termination sequence to be shortened.

The present invention is not limited to the above-described embodiments, and various variations and modifications may be possible without departing from the scope of the present invention. For example, in the above embodiments a case has been described in which the present invention is implemented as a wireless communication apparatus, but the present invention is not limited to this, and can also be applied in the case of implementation by means of a power line communication apparatus.

It is also possible for this communication method to be implemented as software. For example, provision may be made for a program that executes the above-described communication method to be stored in ROM (Read Only Memory) beforehand, and for this program to be run by a CPU (Central Processing Unit).

Provision may also be made for a program that executes the above-described communication method to be stored in a computer-readable storage medium, for the program stored in the storage medium to be recorded in RAM (Random Access Memory) of a computer, and for the computer to be operated in accordance with that program.

It goes without saying that the present invention is not limited to wireless communication, and is also useful in power line communication (PLC), visible light communication, and optical communication.

The disclosures of Japanese Patent Application No. 2007-327642, filed on Dec. 19, 2007, and Japanese Patent Application No. 2008-000843, filed on Jan. 7, 2008, including the specifications, drawings and abstracts, are incorporated herein by reference in their entirety.

INDUSTRIAL APPLICABILITY

An encoder, decoder, encoding method, and decoding method according to the present invention enable an LDPC-CC encoding termination sequence to be provided with a simple configuration, and an amount of a termination sequence transmitted in a transmission channel to be reduced, and are suitable for use as an encoder, decoder, encoding method, and decoding method that perform error correction encoding/decoding using an LDPC-CC.

The invention claimed is:

1. An encoder comprising:
an encoding section configured to perform, using one or more shift registers and multipliers, coding rate R=b/c, memory length M convolutional encoding of an information sequence and a termination sequence of not more than (M×b) bits, in accordance with a parity check matrix of a Low-Density Parity-Check Convolutional Code (LDPC-CC), and
a codeword connecting section configured to connect an information code sequence obtained by encoding said information sequence, and a termination code sequence obtained by encoding said termination sequence of not more than (M×b) bits.

2. The encoder according to claim 1, wherein:
the encoding section is further configured to generate the termination code sequence using the termination sequence of (M1×b) bits, a maximum of the (M1×b) bits from the rear of the information sequence, and a maximum of M2×(c−b) bits from the rear of the information code sequence;
the (M1×b) is a maximum value of a difference between an index of a leftmost column in which a 1 is present and an index of a rightmost column in which a 1 is present in each row of a partial matrix obtained by extracting a column corresponding to an information bit of the parity check matrix; and
the M2×(c−b) is a maximum value of a difference between an index of a leftmost column in which a 1 is present and an index of a rightmost column in which a 1 is present in each row of a partial matrix obtained by extracting a column corresponding to a parity bit of the parity check matrix.

3. The encoder according to claim 1, wherein:
the parity check matrix is a parity check matrix for a non-recursive convolutional code; and
the termination sequence is a zero sequence of not more than the (M×b) bits.

4. An encoder that performs coding rate R=b/c, memory length M convolutional encoding in accordance with a parity check matrix of a Low-Density Parity-Check Convolutional Code (LDPC-CC), the encoder comprising:
a first encoder that, using one or more shift registers and multipliers, generates a first codeword sequence by performing encoding on an input sequence based on a partial check matrix for information bits obtained by extracting a column corresponding to an information bit of the parity check matrix;
a second encoder that, using one or more shift register and multipliers, generates a second codeword sequence by performing encoding on the first codeword sequence based on a parity partial matrix obtained by extracting a column corresponding to a parity bit of the parity check matrix; and
a termination sequence supplying section that supplies a termination sequence of a number of bits equal to a number obtained by multiplying a memory length of the first encoder by b as the input sequence.

5. The encoder according to claim 4, wherein:
the first encoder is a non-recursive convolutional encoder; and
the termination sequence is a zero sequence composed of a number of zeros equivalent to a memory length of the first encoder.

6. The encoder according to claim 4, wherein:
the first encoder is a recursive convolutional encoder; and
the termination sequence is the first codeword sequence, and is a sequence composed of a number of bits equivalent to a memory length of the first encoder.

7. The encoder according to claim 4, wherein:
the parity check matrix is a matrix that defines a systematic code; and
a sequence obtained by connecting an information sequence and the second codeword sequence is output as a codeword sequence.

8. The encoder according to claim 4, wherein the second encoder is a coding-rate-1 recursive convolutional encoder.

9. The encoder according to claim 4, further comprising:
a switch that switches between output or non-output of a first codeword sequence output from the first encoder to the second encoder according to whether the input sequence is an information sequence or the termination sequence; and a codeword selection section that outputs either the first codeword sequence or the second codeword sequence as a codeword sequence according to whether the input sequence is the information sequence or the termination sequence.

10. A decoder that performs coding rate $R=b/c$, memory length M convolutional decoding in accordance with a parity check matrix of a Low-Density Parity-Check Convolutional Code (LDPC-CC), wherein the decoder takes estimates of an information sequence, a termination sequence, an information code sequence obtained by encoding the information sequence, and a termination code sequence obtained by encoding the termination sequence, obtained from a communication channel, as an input sequence, performs BP (Belief Propagation) decoding on the input sequence, the decoder comprising:

a matrix information retaining section configured to retain matrix information regarding said parity check matrix, a termination matrix information retaining section configured to retain matrix information regarding a termination parity check matrix in which one supplementary column respectively is inserted on the right of a column corresponding to up to an $M2\times(c-b)$'th bit from a last bit of a received code sequence composed of estimates of both the information code sequence and the termination code sequence, a matrix information switching section configured to switch between matrix information received from the matrix information retaining section and matrix information received from the termination matrix information retaining section, a zero sequence adding section configured to generate a BP (Believe Propagation) decoder input sequence, by adding length-M zero sequences respectively after said termination sequence and said termination code sequence, and a BP decoder configured to perform BP decoding of said BP decoder input sequence based on matrix information output from the matrix information switching section.

11. The decoder according to claim 10, wherein:
the inserted supplementary column has a 1 in the same row as a 1 located lowest in a column on the left of the inserted column, and is all-zeros in other rows: and a communication channel value of a column on the left of the inserted supplementary column is used as a communication channel value of the inserted supplementary column.

12. An encoding method that performs coding rate $R=b/c$, memory length M convolutional encoding in accordance with a parity check matrix of a Low-Density Parity-Check Convolutional Code (LDPC-CC), the encoding method comprising:

a step of taking an information sequence and a termination code sequence of not more than $(M\times b)$ bits as an input sequence, and performing encoding on the input sequence based on the parity check matrix; and a step of outputting an information code sequence obtained by encoding the information sequence, and a termination code sequence obtained by encoding the termination sequence.

13. The encoding method according to claim 12, wherein:
the parity check matrix is a parity check matrix for a non-recursive convolutional code; and
the termination sequence is a zero sequence of not more than $(M\times b)$ bits.

14. The encoding method according to claim 12, wherein:
the termination code sequence is generated using the termination sequence of $(M1\times b)$ bits, a maximum of the $(M1\times b)$ bits from the rear of the information sequence, and a maximum of $M2\times(c-b)$ bits from the rear of the information code sequence;

the $(M1\times b)$ is a maximum value of a difference between an index of a leftmost column in which a 1 is present and an index of a rightmost column in which a 1 is present in each row of a partial matrix obtained by extracting a column corresponding to an information bit of the parity check matrix; and the $M2\times(c-b)$ is a maximum value of a difference between an index of a leftmost column in which a 1 is present and an index of a rightmost column in which a 1 is present in each row of a partial matrix obtained by extracting a column corresponding to a parity bit of the parity check matrix.

15. The encoding method according to claim 12, wherein:
the step of performing encoding on the input sequence based on the parity check matrix comprises:
a first encoding step of generating a first codeword sequence by performing encoding on the input sequence based on a partial check matrix for information bits obtained by extracting a column corresponding to an information bit of the parity check matrix; and
a second encoding step of generating a second codeword sequence by performing encoding on the first codeword sequence based on a parity partial matrix obtained by extracting a column corresponding to a parity bit of the parity check matrix; and
the termination sequence is composed of a number of bits equal to a number obtained by multiplying a memory length in encoding of the first encoding step by b.

* * * * *